United States Patent
Cui et al.

(10) Patent No.: US 10,381,362 B1
(45) Date of Patent: Aug. 13, 2019

(54) THREE-DIMENSIONAL MEMORY DEVICE INCLUDING INVERTED MEMORY STACK STRUCTURES AND METHODS OF MAKING THE SAME

(71) Applicant: SANDISK TECHNOLOGIES LLC, Plano, TX (US)

(72) Inventors: Zhixin Cui, Yokkaichi (JP); Keisuke Izumi, Yokkaichi (JP); Tomohiro Kubo, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/979,885

(22) Filed: May 15, 2018

(51) Int. Cl.
*H01L 27/115* (2017.01)
*H01L 27/11548* (2017.01)
*H01L 23/00* (2006.01)
*H01L 27/11556* (2017.01)
*H01L 27/11582* (2017.01)
(Continued)

(52) U.S. Cl.
CPC .. *H01L 27/11548* (2013.01); *H01L 21/76898* (2013.01); *H01L 24/83* (2013.01); *H01L 27/11556* (2013.01); *H01L 27/11575* (2013.01); *H01L 27/11582* (2013.01); *H01L 2224/83005* (2013.01); *H01L 2224/8389* (2013.01); *H01L 2224/83931* (2013.01); *H01L 2924/1431* (2013.01); *H01L 2924/14511* (2013.01)

(58) Field of Classification Search
CPC ......... H01L 27/11548; H01L 27/11556; H01L 27/11575; H01L 27/11582
See application file for complete search history.

(56) References Cited

U.S. PATENT DOCUMENTS 5,374,564 A 12/1994 Bruel
5,915,167 A 6/1999 Leedy
(Continued)

FOREIGN PATENT DOCUMENTS

KR 10-2009-0047614 A 5/2009
KR 10-2016-0124294 A 10/2016

OTHER PUBLICATIONS

U.S. Appl. No. 15/638,672, filed Jun. 30, 2017, SanDisk Technologies LLC.

(Continued)

*Primary Examiner* — Matthew L Reames
(74) *Attorney, Agent, or Firm* — The Marbury Law Group PLLC

(57) ABSTRACT

A three-dimensional memory device includes field effect transistors located on a substrate, lower metal interconnect structures embedded in first dielectric layers and located over the substrate, a source line located over the first dielectric layers, a stepped dielectric material portion located over the first dielectric layers and including stepped surfaces, an alternating stack of insulating layers and electrically conductive layers located over the source line and contacting the stepped surfaces of the stepped dielectric material portion, and memory stack structures extending through the alternating stack and including a memory film and a vertical semiconductor channel. A lateral extent of the stepped dielectric material portion decreases stepwise with a vertical distance from the substrate, and lateral extents of the electrically conductive layers increase with a vertical distance from the source line.

18 Claims, 54 Drawing Sheets

(51) Int. Cl.
*H01L 27/11575* (2017.01)
*H01L 21/768* (2006.01)

(56) References Cited

U.S. PATENT DOCUMENTS

| | | | |
|---|---|---|---|
| 7,602,028 | B2 | 10/2009 | Son et al. |
| 8,247,260 | B2 | 8/2012 | Sivaram et al. |
| 8,765,598 | B2 * | 7/2014 | Smith ............... H01L 27/11548 |
| | | | 438/637 |
| 9,305,934 | B1 | 4/2016 | Ding et al. |
| 9,449,987 | B1 | 9/2016 | Miyata et al. |
| 9,502,471 | B1 | 11/2016 | Lu et al. |
| 9,530,790 | B1 | 12/2016 | Lu et al. |
| 9,543,318 | B1 | 1/2017 | Lu et al. |
| 9,960,181 | B1 | 5/2018 | Cui et al. |
| 2016/0079164 | A1 * | 3/2016 | Fukuzumi ......... H01L 27/11582 |
| | | | 257/324 |
| 2017/0179153 | A1 | 6/2017 | Ogawa et al. |

OTHER PUBLICATIONS

U.S. Appl. No. 15/873,101, filed Jan. 17, 2018, SanDisk Technologies LLC.
U.S. Appl. No. 15/950,505, filed Apr. 11, 2018, SanDisk Technologies LLC.
U.S. Appl. No. 15/950,616, filed Apr. 11, 2018, SanDisk Technologies LLC.
U.S. Appl. No. 15/960,267, filed Apr. 23, 2018, SanDisk Technologies LLC.
Notification of Transmittal of the International Search Report and Written Opinion of the International Searching Authority for International Patent Application No. PCTU/US2019/017095, dated May 22, 2019, 11 pages.

* cited by examiner

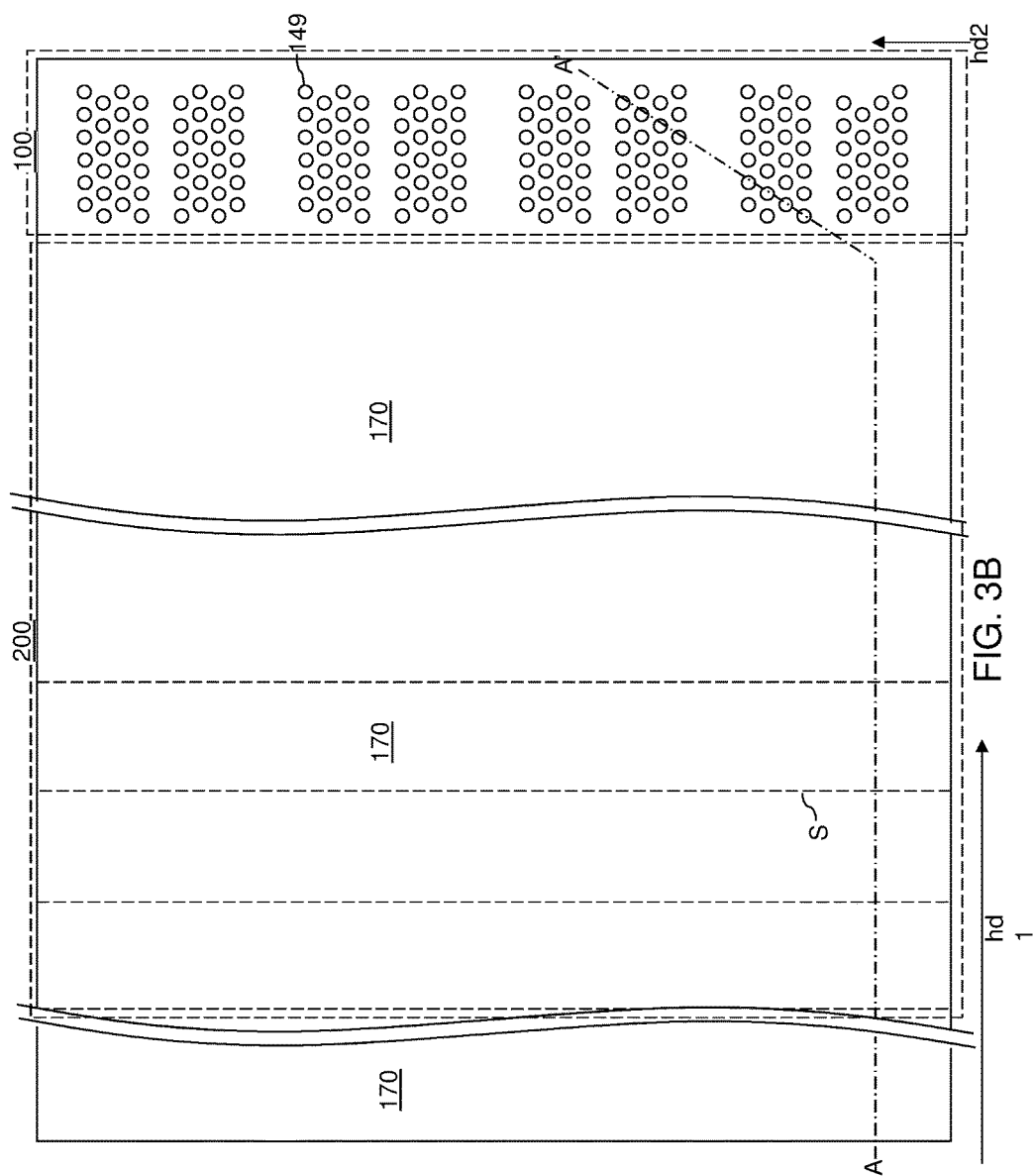

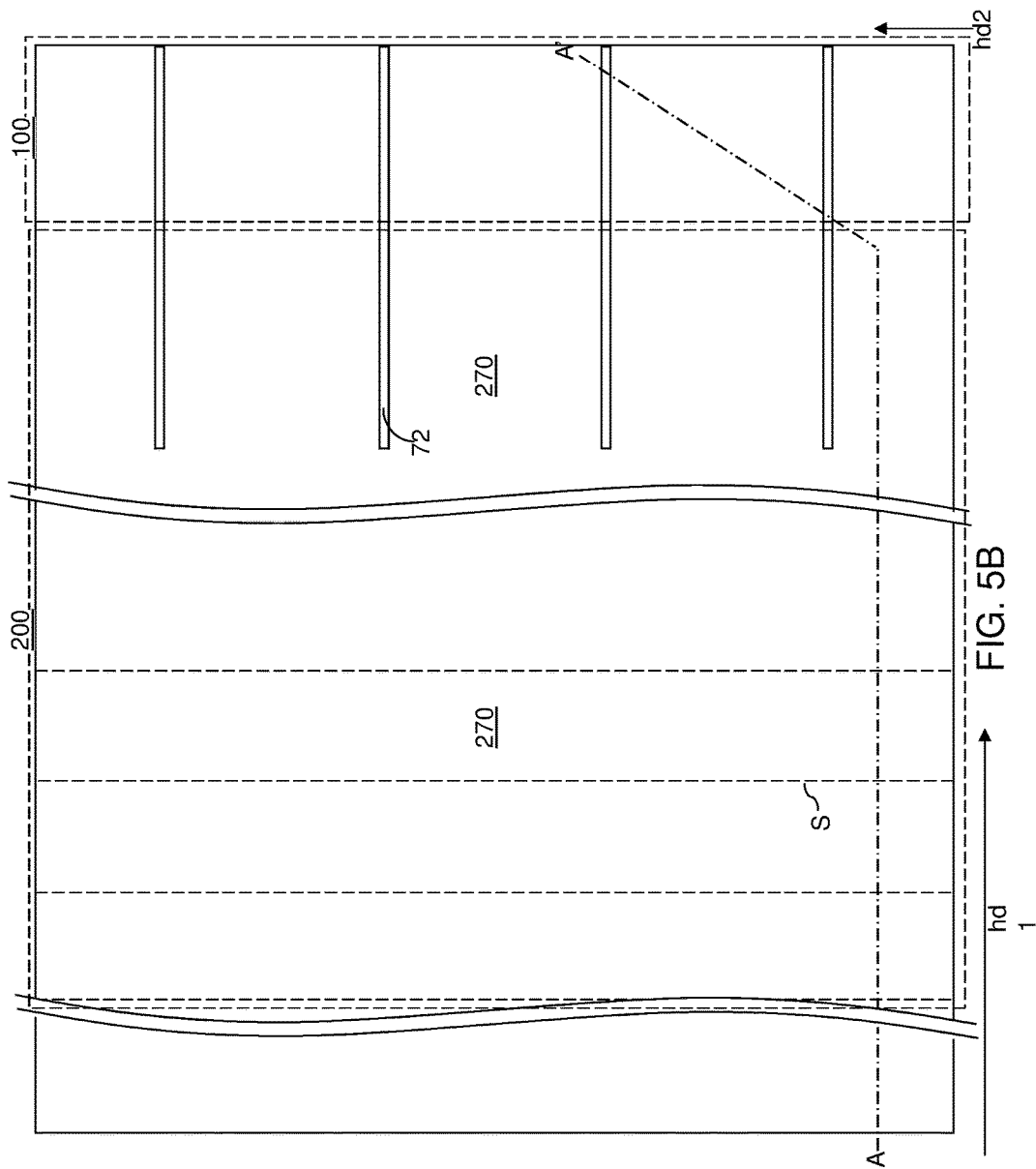

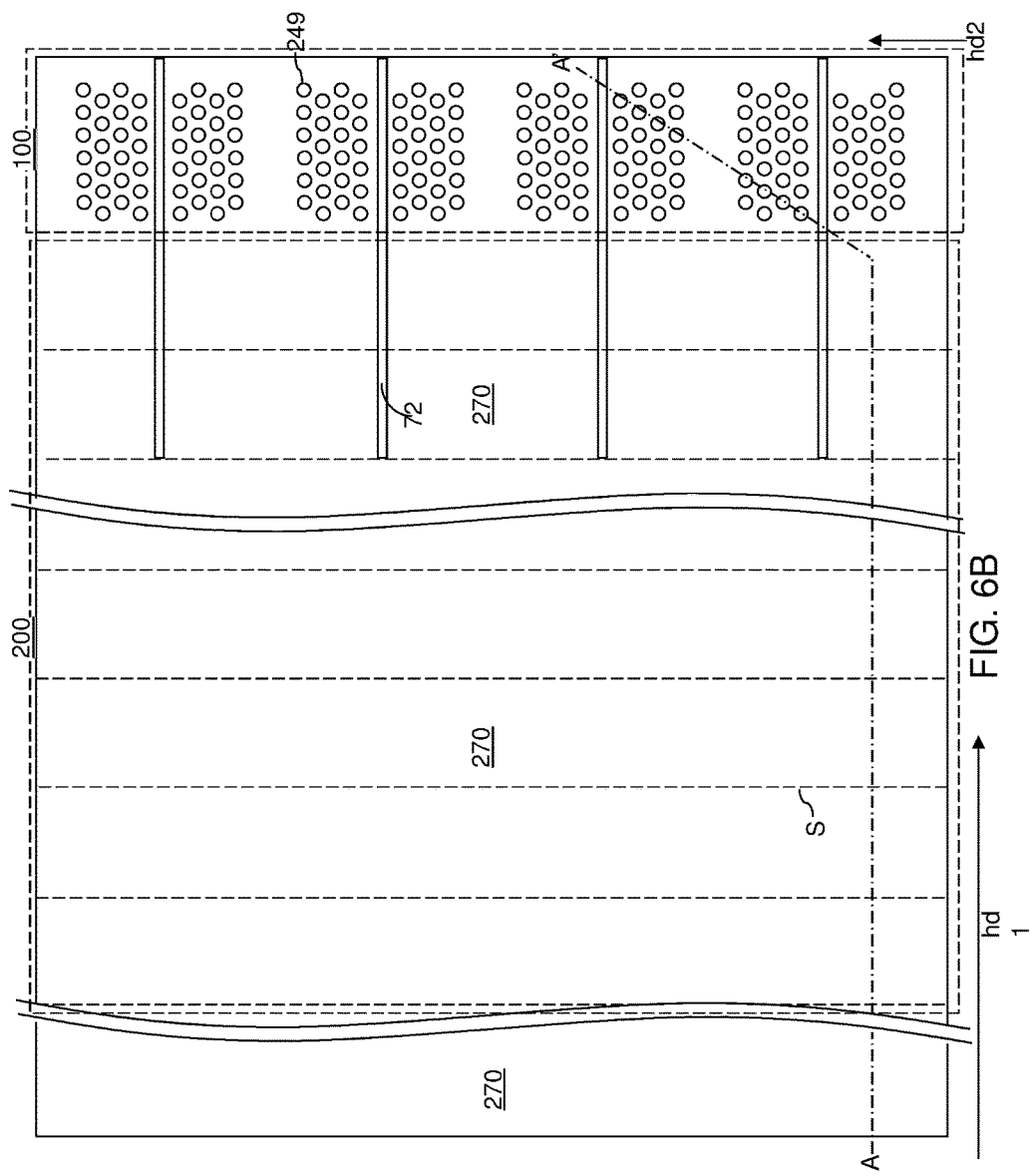

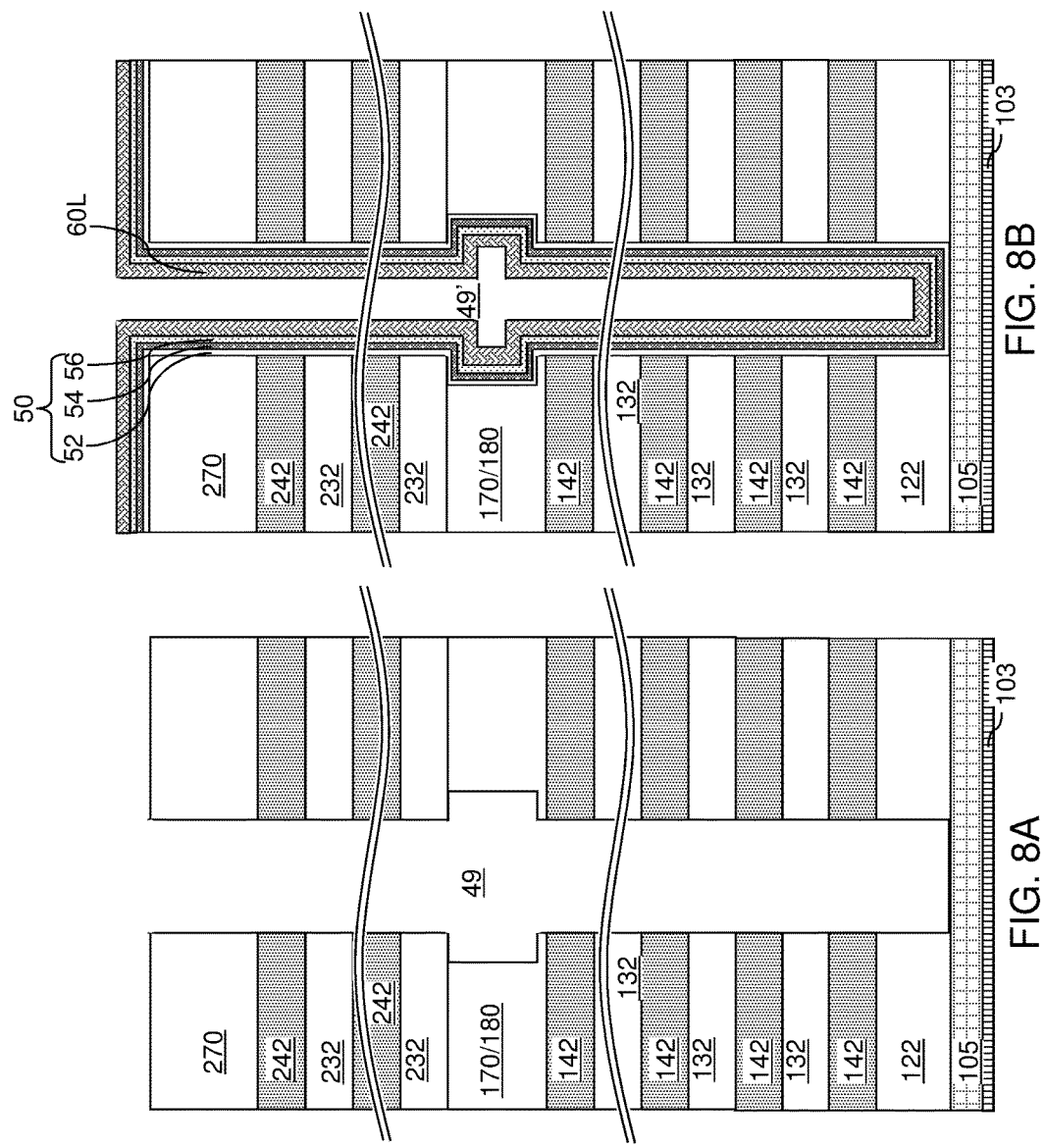

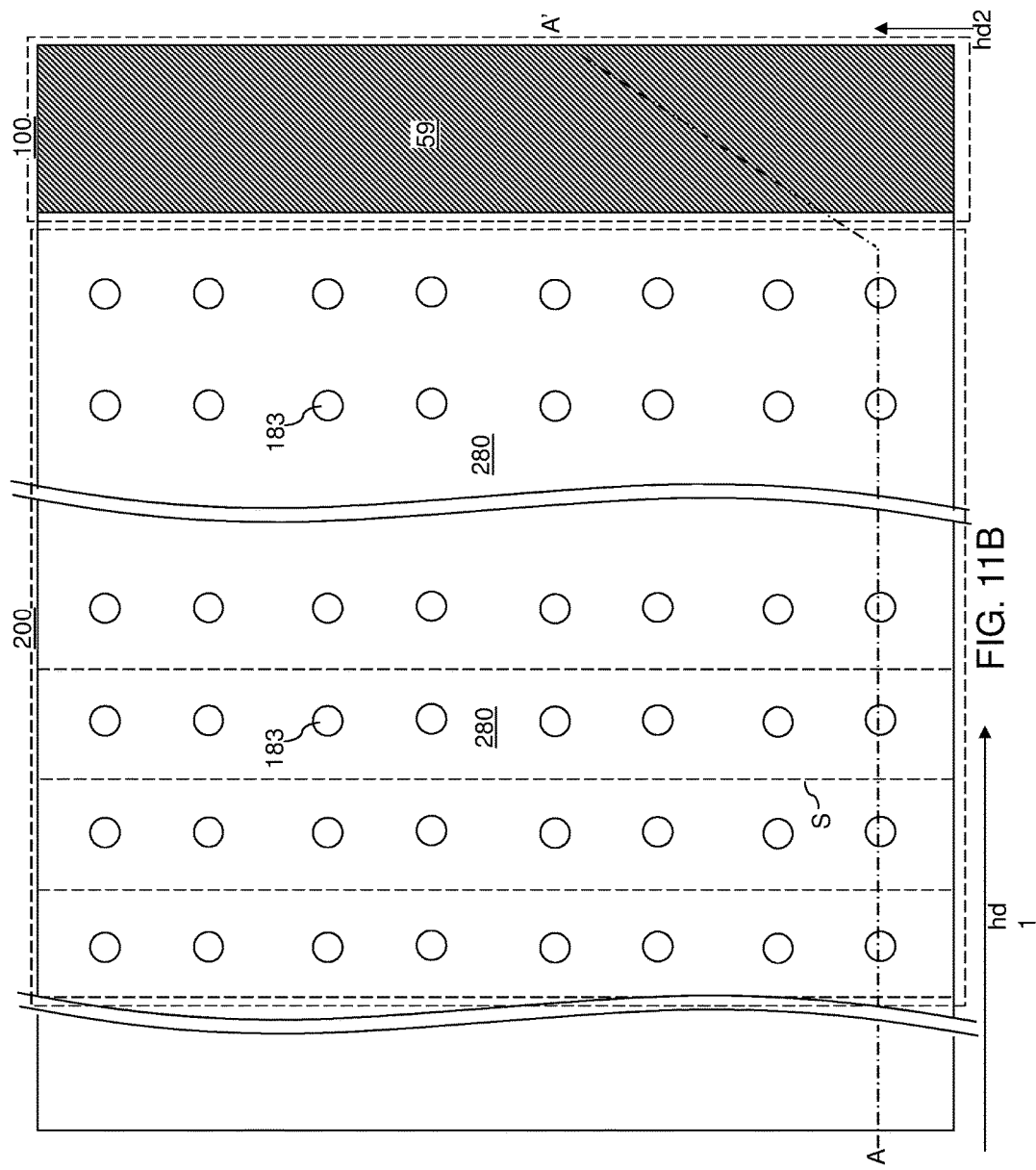

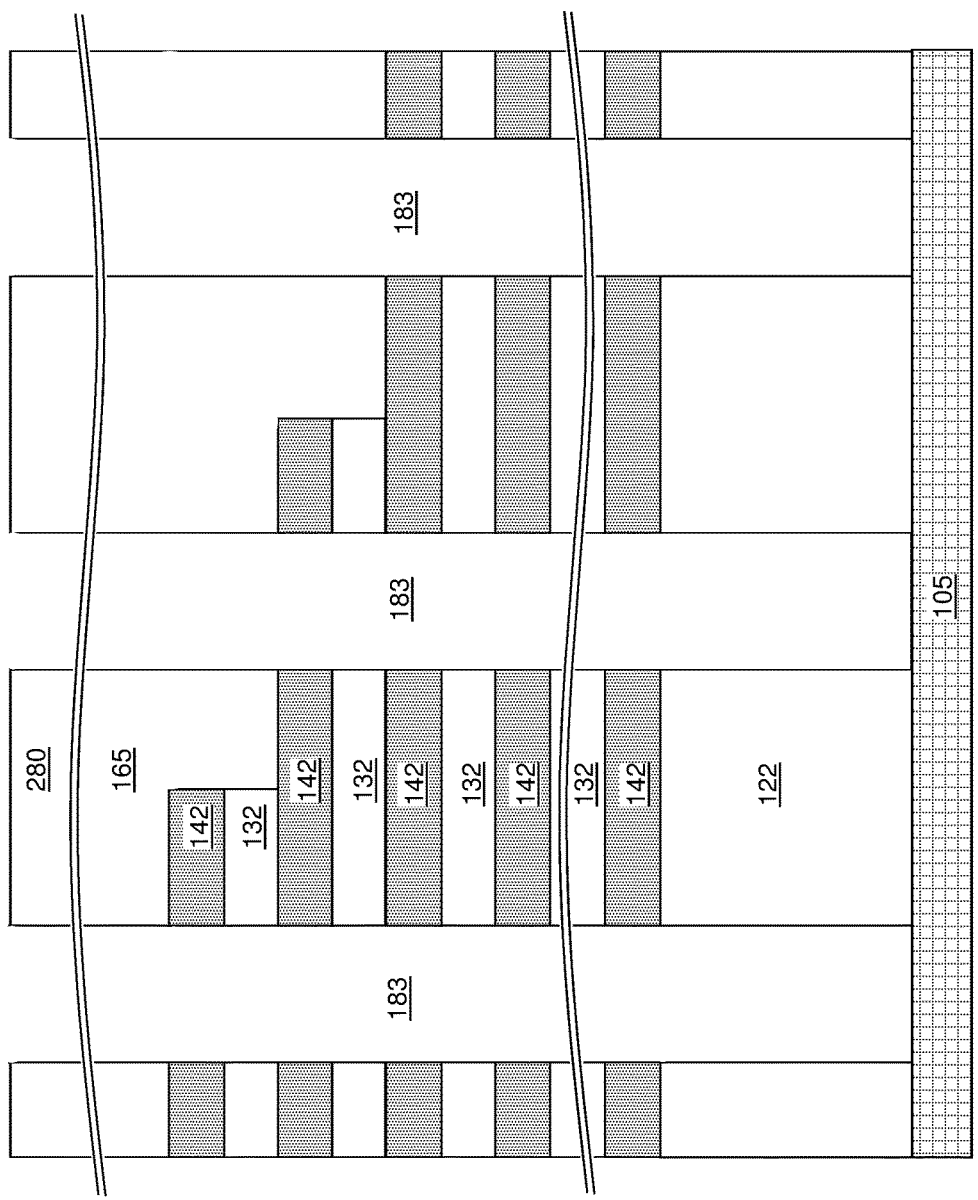

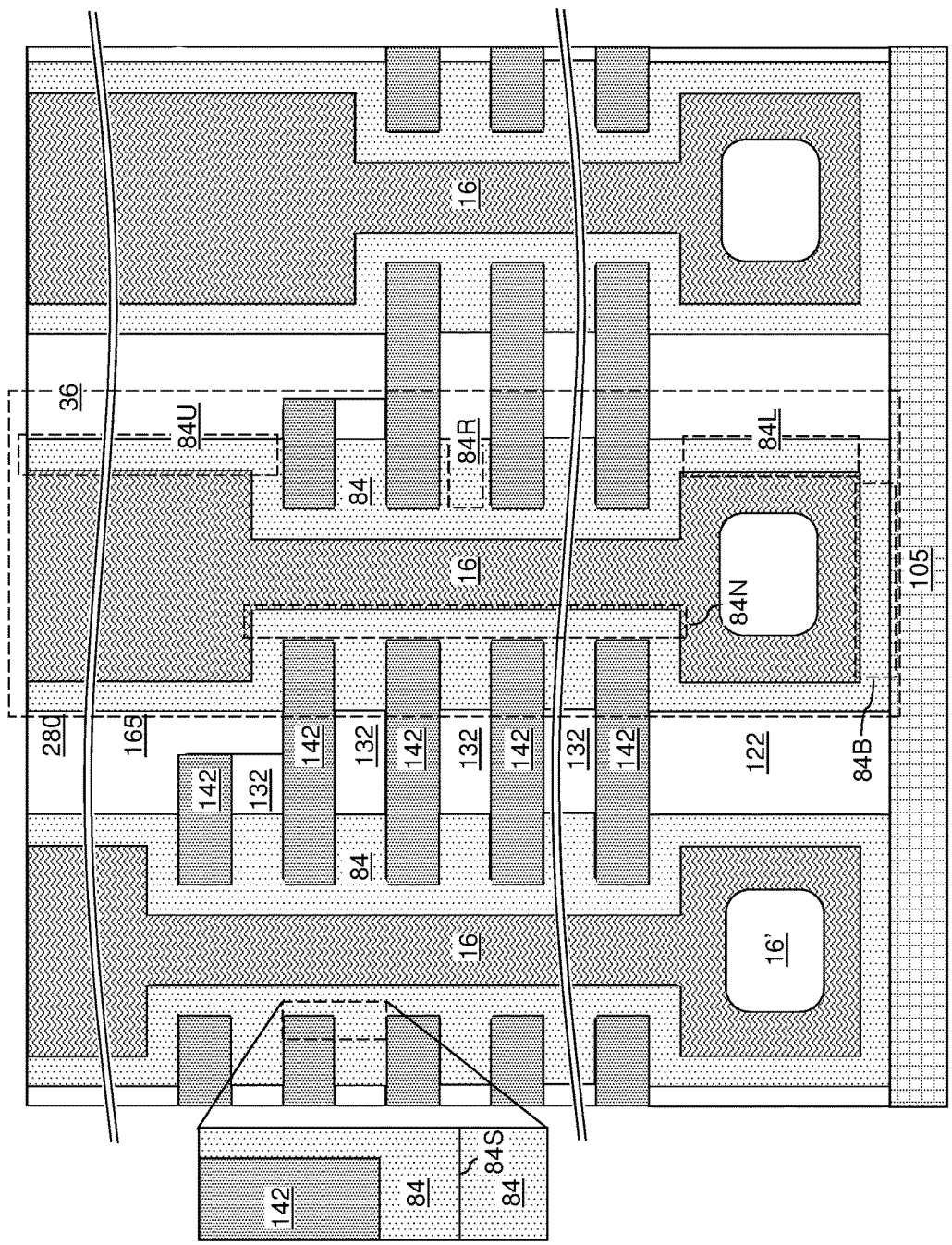

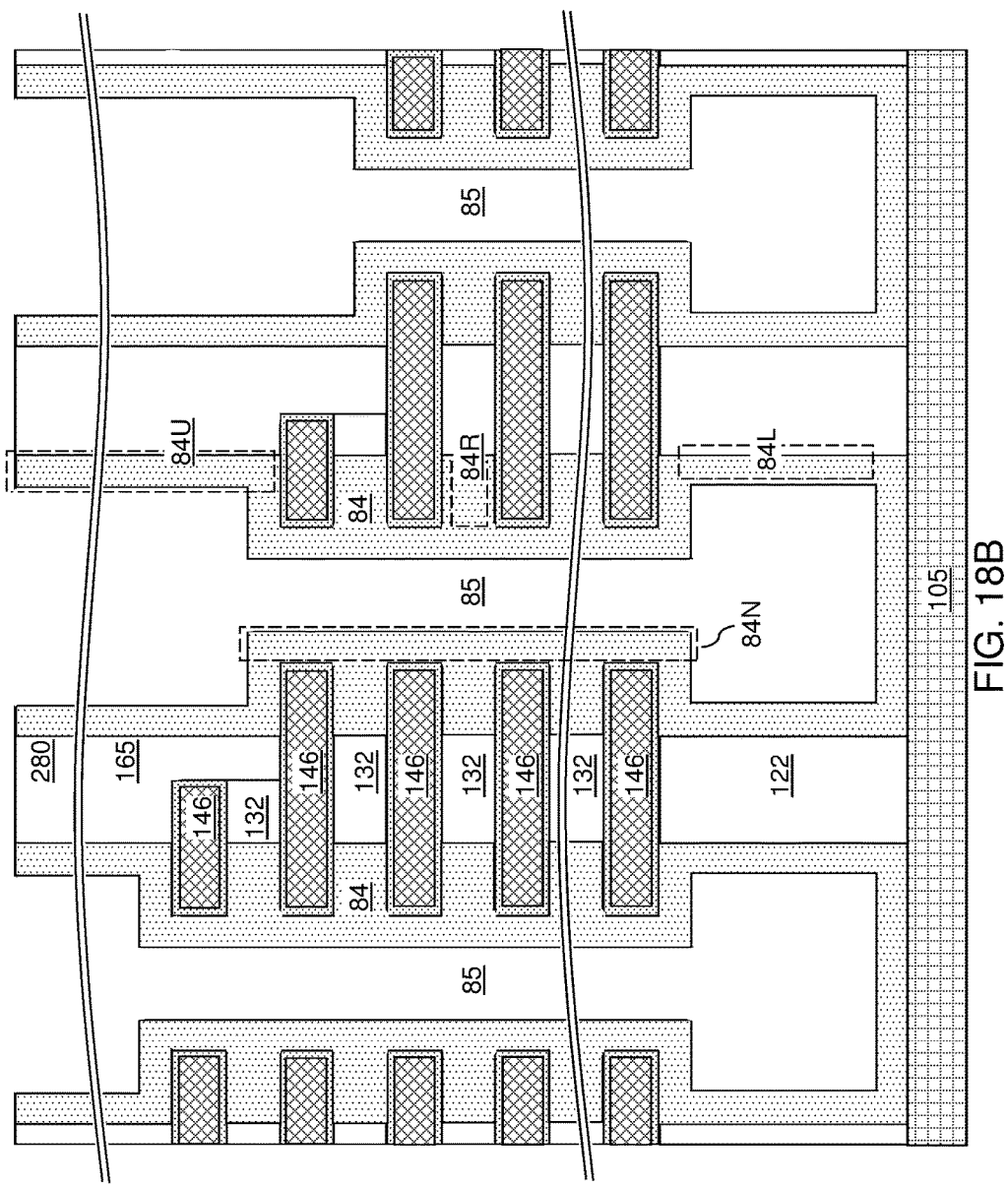

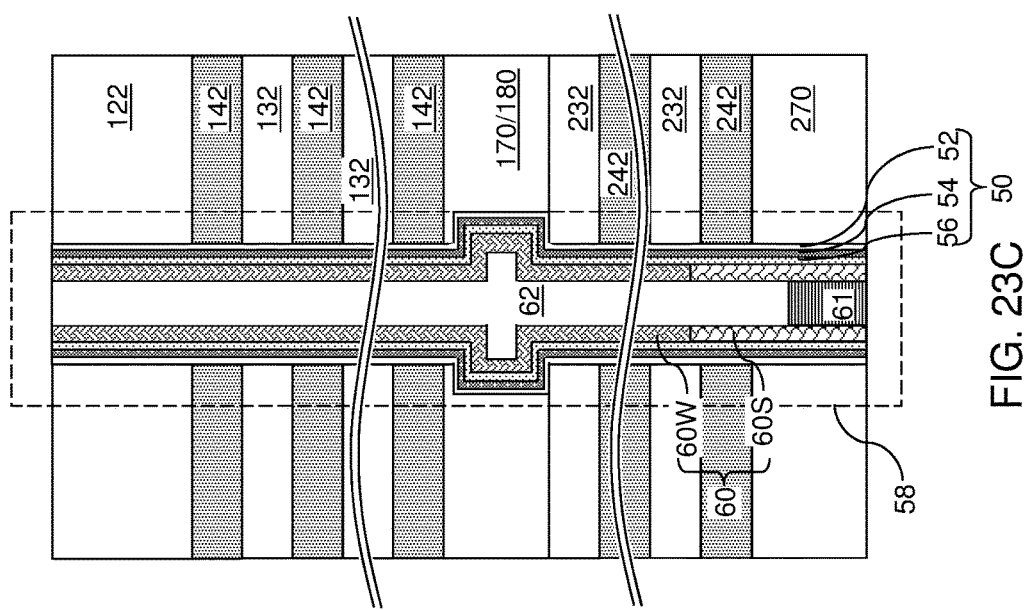

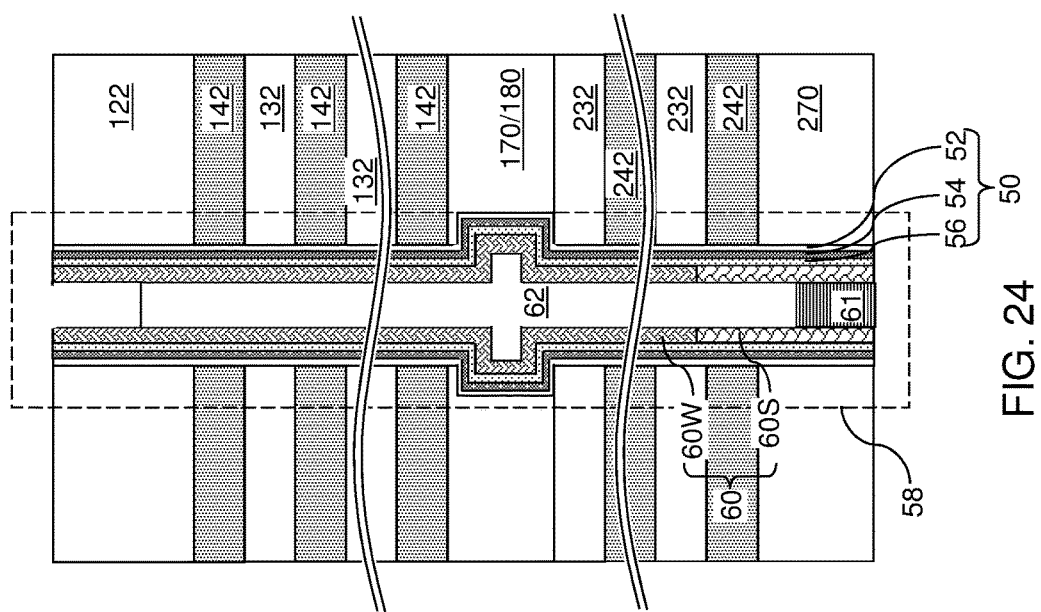

THREE-DIMENSIONAL MEMORY DEVICE INCLUDING INVERTED MEMORY STACK STRUCTURES AND METHODS OF MAKING THE SAME

FIELD

The present disclosure relates generally to the field of semiconductor devices and specifically to a three-dimensional memory device including inverted memory stack structures and methods of making the same.

BACKGROUND

Recently, ultra-high-density storage devices employing three-dimensional (3D) memory stack structures have been proposed. For example, a 3D NAND stacked memory device can be formed from an array of an alternating stack of insulating materials and spacer material layers that are formed as electrically conductive layers or replaced with electrically conductive layers over a substrate containing peripheral devices (e.g., driver/logic circuits). Memory openings are formed through the alternating stack, and are filled with memory stack structures, each of which includes a vertical stack of memory elements and a vertical semiconductor channel.

SUMMARY

According to an aspect of the present disclosure, a three-dimensional memory device is provided, which comprises: field effect transistors located on a substrate; lower metal interconnect structures embedded in first dielectric layers and located over the substrate; a source line located over the first dielectric layers; a stepped dielectric material portion located over the first dielectric layers and including stepped surfaces, wherein a lateral extent of the stepped dielectric material portion decreases stepwise with a vertical distance from the substrate; an alternating stack of insulating layers and electrically conductive layers located over the source line and contacting the stepped surfaces of the stepped dielectric material portion, wherein lateral extents of the electrically conductive layers increase with a vertical distance from the source line; and memory stack structures extending through the alternating stack and including a memory film and a vertical semiconductor channel.

According to another aspect of the present disclosure, a method of forming a three-dimensional memory device includes providing a first assembly containing memory stack structures vertically extending through an alternating stack of insulating layers and electrically conductive layers over a carrier substrate, such that each of the memory stack structures comprises a memory film and a vertical semiconductor channel, bonding the first assembly to a second assembly including a semiconductor substrate, field effect transistors located on the semiconductor substrate, and first metal interconnect structures embedded in first dielectric material layers, separating the carrier substrate from the alternating stack, forming an interconnection via cavity through the alternating stack, and forming a contact via structure in the interconnection via cavity.

BRIEF DESCRIPTION OF THE DRAWINGS

FIG. 3B is a horizontal cross-sectional view of the exemplary structure along the horizontal plane B-B' in FIG. 3A. The hinged vertical plane A-A' corresponds to the plane of the vertical cross-sectional view of FIG. 3A.

FIG. 5B is a top-down view of the exemplary structure along the horizontal plane B-B' in FIG. 5A. The hinged vertical plane A-A' corresponds to the plane of the vertical cross-sectional view of FIG. 5A.

FIG. 6B is a top-down of the exemplary structure along the horizontal plane B-B' in FIG. 6A. The hinged vertical plane A-A' corresponds to the plane of the vertical cross-sectional view of FIG. 6A.

FIGS. 8A-8E are sequential vertical cross-sectional views of an inter-tier memory opening during formation of a memory opening fill structure according to an embodiment of the present disclosure.

FIG. 11B is a top-down view of the exemplary structure of FIG. 11A. The hinged vertical plane A-A' corresponds to the plane of the vertical cross-sectional view of FIG. 11A.

FIGS. 12A-12D illustrate sequential vertical cross-sectional views of via cavities during formation of temporary fill material portions therein according to an embodiment of the present disclosure.

FIGS. 18A-18D illustrate sequential vertical cross-sectional views of via cavities during replacement of temporary fill material portions with sacrificial column-shaped structures according to an embodiment of the present disclosure.

FIG. 23C is a vertical cross-sectional view of a region including a memory opening fill structure at the processing steps of FIGS. 23A and 23B.

FIG. 24 is a vertical cross-sectional view of a region including a memory opening fill structure after vertically recessing a dielectric core according to an embodiment of the present disclosure.

DETAILED DESCRIPTION

Figure 1:
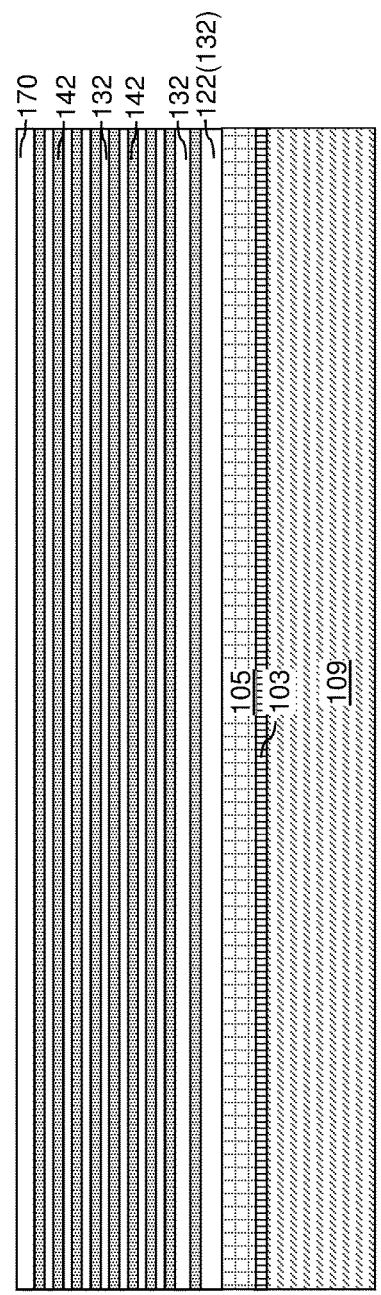
FIG. 1 is a vertical cross-sectional view of an exemplary structure after formation of a sacrificial separation layer, an etch stop layer, a first alternating stack of first insulating layers and first spacer layers, and a first insulating cap layer according to a first embodiment of the present disclosure.

As three-dimensional memory devices scale to smaller device dimensions, the device area for peripheral devices (which can be referred to interchangeably as driver devices, driver circuits, logic circuitry, logic devices, peripheral circuits, etc.) can take up a significant portion of the total chip area. The peripheral logic circuitry provides control of the various nodes of the memory devices. Manufacture of a three-dimensional memory array typically involves many high temperature processing steps, such as activation anneals and high temperature layer deposition steps. Such high temperature processing steps have an adverse impact on logic devices formed on a same substrate as the three-dimensional memory array. The embodiments of the present disclosure provide a peripheral circuit die containing logic devices, such as CMOS devices, which is bonded to the memory die containing a three-dimensional memory device. This configuration avoids or reduces the negative effect of the high temperature processing steps on the logic devices.

The embodiments of the present disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and can be fabricated employing the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Referring to FIG. 1, an exemplary structure according to a first embodiment of the present disclosure includes a first assembly 1000. The first assembly includes a carrier substrate 109, a sacrificial separation layer 103, an etch stop layer 105, a first alternating stack of first insulating layers 132 and first spacer layers (which can be first sacrificial material layers 142), and a first insulating cap layer 170.

The carrier substrate 109 is a substrate that is employed to hold elements formed thereupon until transfer of the elements to another structure. The carrier substrate 109 can comprise a semiconductor substrate, an insulating substrate, a dielectric substrate, or a combination thereof. In one embodiment, the carrier substrate 109 can include a commercially available silicon substrate.

The sacrificial separation layer 103 can include a sacrificial material that can be employed to hold the etch stop layer 105 and structures thereabove until separation of the carrier substrate. The sacrificial separation layer 103 can include an adhesion material that provides adhesion strength that is sufficient to hold the etch stop layer 105 under normal handling conditions, but enables separation of the carrier substrate 109 from the etch stop layer 105 upon application of sufficient mechanical stress at the processing step of separation. Alternatively, the sacrificial separation layer 103 can include a material that can be laterally removed by etching selective to the materials of the carrier substrate 109 and the etch stop layer 105. For example, the sacrificial separation layer 103 can include amorphous carbon or diamond-like carbon (DLC), borosilicate glass, or porous or non-porous organosilicate glass. The thickness of the sacrificial separation layer 103 can be in a range from 3 nm to 300 nm, although lesser and greater thicknesses can also be employed.

The etch stop layer 105 includes an etch stop material that is different from the materials of the first alternating stack (132, 142). For example, the etch stop layer 105 can include amorphous silicon or polysilicon. The thickness of the etch stop layer 105 can be in a range from 50 nm to 1,000 nm, although lesser and greater thicknesses can also be employed.

Alternatively, the combination of the carrier substrate 109, the sacrificial separation layer 103, and the etch stop layer 105 may be provided by implanting hydrogen into a commercially available silicon substrate. In this case, the sacrificial separation layer 103 can a hydrogen implanted layer, the carrier substrate 109 can be a portion of the silicon substrate underlying the hydrogen implanted layer, and the etch stop layer 105 can be a portion of the silicon substrate that overlies the hydrogen implanted layer. Separation of a silicon substrate at a hydrogen implanted silicon layer is described in U.S. Pat. No. 5,374,564 to Michel Bruel, in which an anneal is conducted to cause the hydrogen implanted layer to form bubbles or weak regions, followed by applying a mechanical stress to the substrate to separate the substrate at the hydrogen implanted layer.

The first-tier alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. A bottommost layer among the first insulating layers 132 may have a greater thickness than overlying first insulating layers 132, and is herein referred to as a drain-level insulating layer 122 because drain regions are subsequently formed at the level of the drain-level insulating layer 122. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The thickness of the drain-level insulating layer 122 may be in a range from 40 nm to 500 nm, such as from 80 nm to 250 nm, although lesser and greater thicknesses can also be employed. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 2:
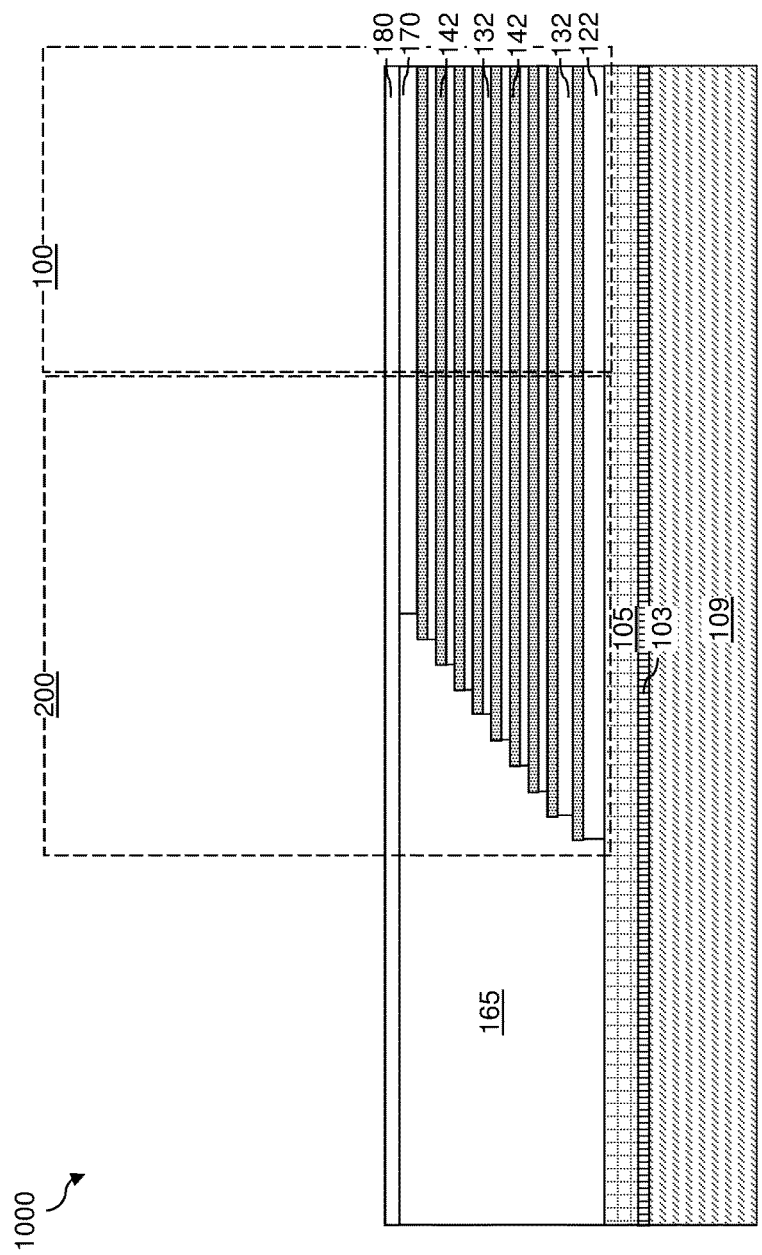
FIG. 2 is a vertical cross-sectional view of the exemplary structure after patterning first-tier staircase regions on the first-tier alternating stack and forming a first retro-stepped dielectric material portion and an inter-tier dielectric layer according to an embodiment of the present disclosure.

Referring to FIG. 2, the first insulating cap layer 170 and the first-tier alternating stack (132, 142) can be patterned to form first stepped surfaces in a staircase region 200. The staircase region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area.

A dielectric material can be deposited to fill the first stepped cavity to form a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified. A memory array region 100 can be provided adjacent to the staircase region 200. The memory array region 100 is a region in which memory stack structures are subsequently formed.

An inter-tier dielectric layer 180 may be optionally deposited over the first-tier structure (132, 142, 170, 165). The inter-tier dielectric layer 180 includes a dielectric material such as silicon oxide. The thickness of the inter-tier dielectric layer 180 can be in a range from 30 nm to 300 nm, although lesser and greater thicknesses can also be employed.

Figure 3A:
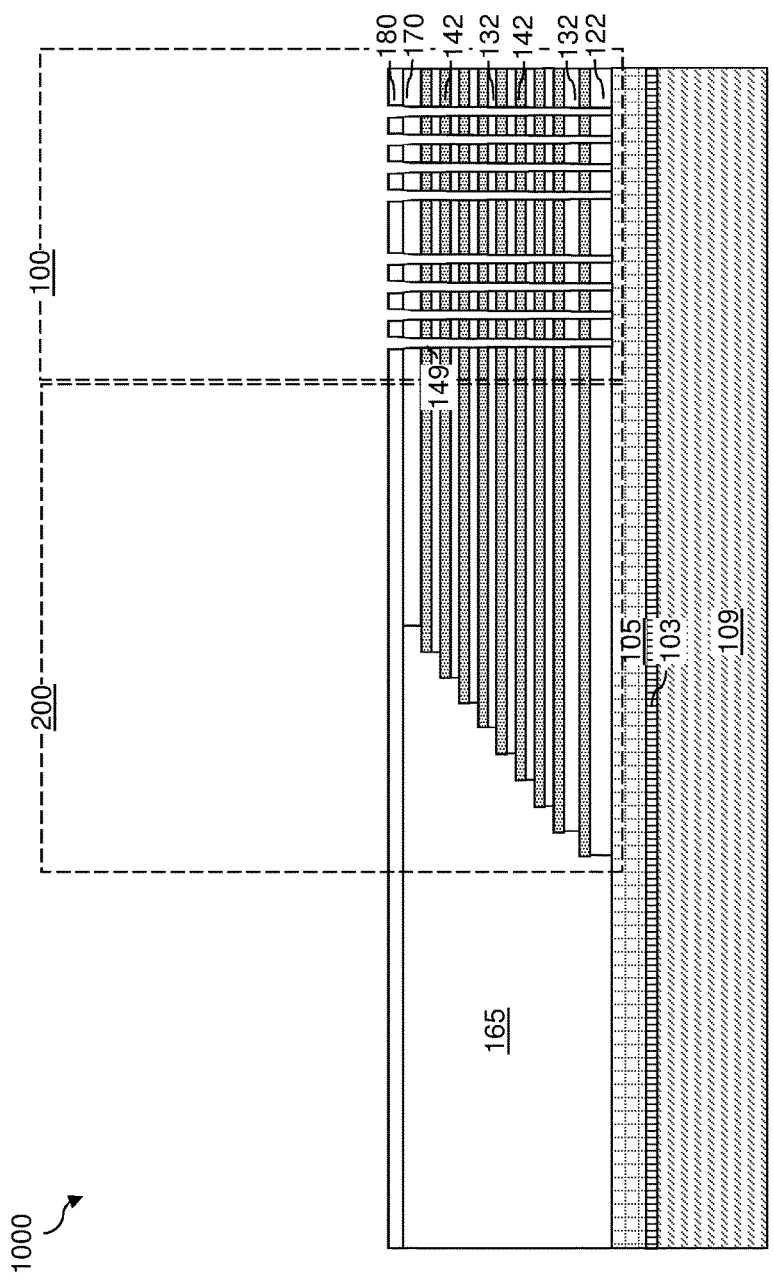
FIG. 3A is a vertical cross-sectional view of the exemplary structure after formation of first-tier memory openings according to an embodiment of the present disclosure.

Referring to FIGS. 3A and 3B, first-tier memory openings 149 can be formed through the inter-tier dielectric layer 180, the first insulating cap layer 170, and the first-tier alternating stack (132, 142) and into the etch stop layer 105. The first-tier memory openings 149 can be formed in the memory array region 100 at locations at which memory stack structures including vertical stacks of memory elements are to be subsequently formed. Locations of steps S in the first-tier alternating stack (132, 142) are illustrated as dotted lines in FIG. 3B.

For example, a lithographic material stack (not shown) including at least a photoresist layer can be formed over the inter-tier dielectric layer 180, and can be lithographically patterned to form openings within the lithographic material stack. The pattern in the lithographic material stack can be transferred through the inter-tier dielectric layer 180, the first insulating cap layer 170, and each layer within the first-tier alternating stack (132, 142) by at least one anisotropic etch that employs the patterned lithographic material stack as an etch mask. Portions of the inter-tier dielectric layer 180, the first insulating cap layer 170, and the first-tier alternating stack (132, 142) underlying the openings in the patterned lithographic material stack are etched to form the first-tier memory openings 149. In other words, the transfer of the pattern in the patterned lithographic material stack through the inter-tier dielectric layer 180, the first insulating cap layer 170, and the first-tier alternating stack (132, 142) forms the first-tier memory openings 149.

In one embodiment, the chemistry of the anisotropic etch process employed to etch through the materials of the first-tier alternating stack (132, 142) can alternate to optimize etching of the first and second materials in the first-tier alternating stack (132, 142). The anisotropic etch can be, for example, a series of reactive ion etches or a single etch (e.g., $CF_4/O_2/Ar$ etch). The sidewalls of the first-tier memory openings 149 can be substantially vertical, or can be tapered. Subsequently, the patterned lithographic material stack can be subsequently removed, for example, by ashing.

Optionally, the portions of the first-tier memory openings 149 at the level of the inter-tier dielectric layer 180 can be laterally expanded by an isotropic etch. In this case, the inter-tier dielectric layer 180 can comprise a dielectric material (such as borosilicate glass) having a greater etch rate than the first insulating layers 132 (that can include undoped silicate glass). An isotropic etch (such as a wet etch employing HF) can be employed to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 4:
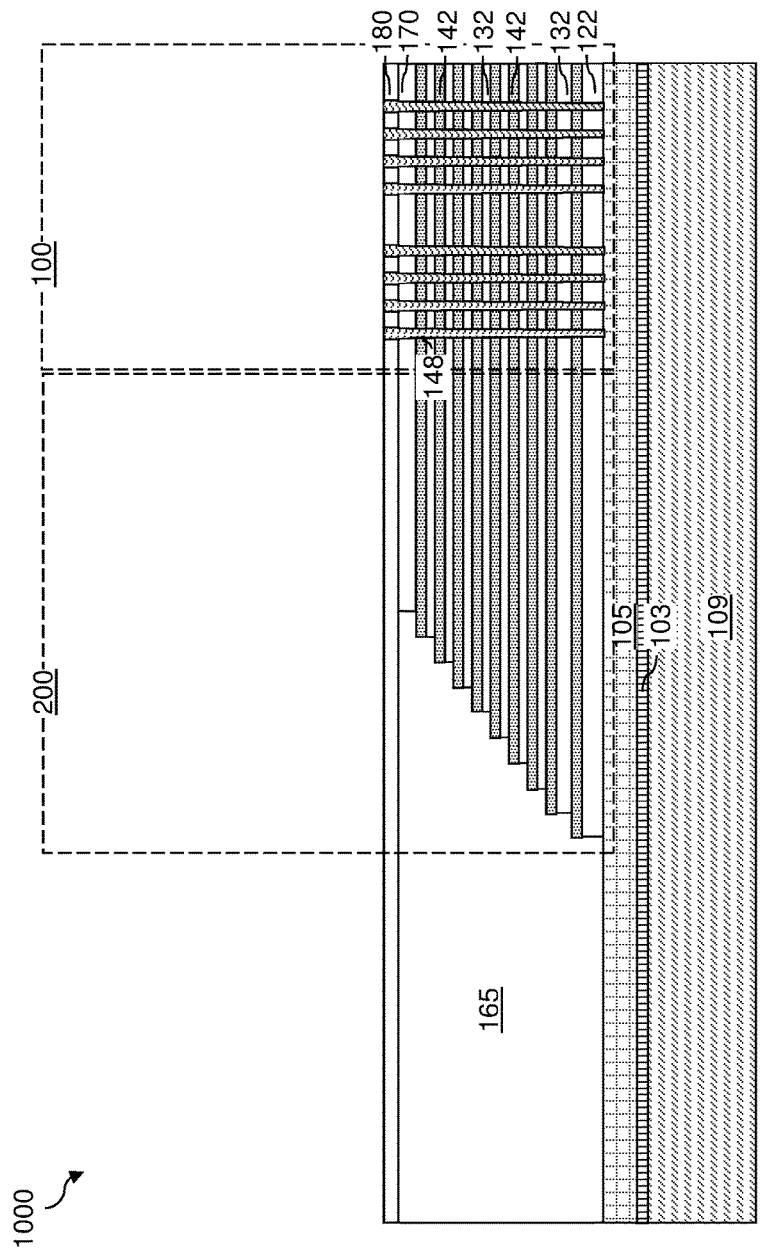
FIG. 4 is a vertical cross-sectional view of the exemplary structure after formation of sacrificial memory opening fill portions according to an embodiment of the present disclosure.

Referring to FIG. 4, sacrificial memory opening fill portions 148 can be formed in the first-tier memory openings 149. For example, a sacrificial fill material layer is deposited in the first-tier memory openings 149. The sacrificial fill material layer includes a sacrificial material which can be subsequently removed selective to the materials of the first insulating layers 132 and the first sacrificial material layers 142. In one embodiment, the sacrificial fill material layer can include a semiconductor material such as silicon (e.g., a-Si or polysilicon), a silicon-germanium alloy, germanium, a III-V compound semiconductor material, or a combination thereof. The sacrificial fill material layer may be formed by a non-conformal deposition or a conformal deposition method. In another embodiment, the sacrificial fill material layer can include a carbon-containing material (such as amorphous carbon or diamond-like carbon) that can be subsequently removed by ashing. Optionally, a thin sacrificial liner (not illustrated) having a thickness in a range from 1 nm to 3 nm may be formed within each first-tier memory opening 149 prior to deposition of the sacrificial material. For example, a conformal dielectric material layer including a dielectric material such as silicon oxide or silicon nitride may be employed as the thin sacrificial liner.

Excess portions of the deposited sacrificial material can be removed from above the inter-tier dielectric layer 180. For example, the sacrificial fill material layer can be recessed to a top surface of the inter-tier dielectric layer 180 employing a planarization process. The planarization process can include a recess etch, chemical mechanical planarization (CMP), or a combination thereof. The top surface of the first insulating layer 170 (and optionally layer 180 if present) the inter-tier dielectric layer 180 can be employed as an etch stop layer or a planarization stop layer. Each remaining portion of the sacrificial material in a first-tier memory opening 149 constitutes a sacrificial memory opening fill portion 148. The top surfaces of the sacrificial memory opening fill portions 148 can be coplanar with the top surface of the inter-tier dielectric layer 180. The sacrificial memory opening fill portion 148 may, or may not, include cavities therein.

Figure 5A:
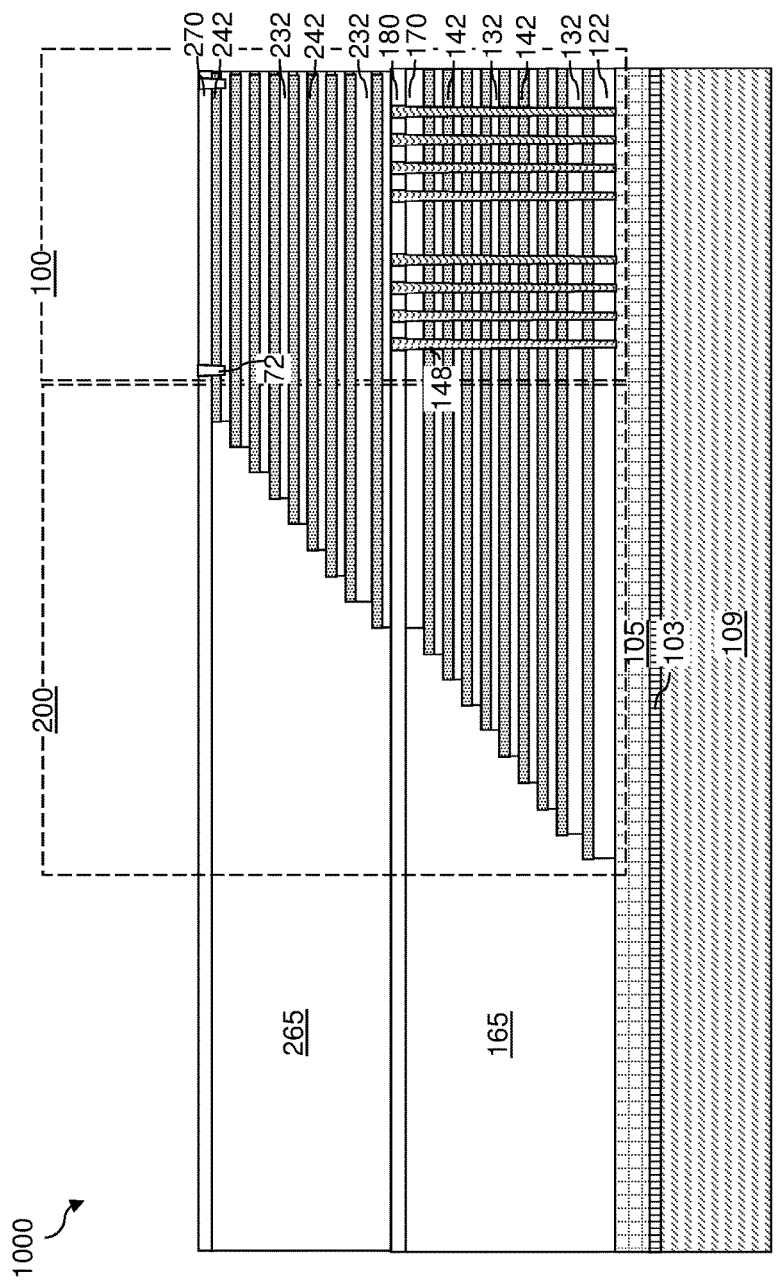
FIG. 5A is a vertical cross-sectional view of the exemplary structure after formation of a second-tier alternating stack of second insulating layers and second spacer material layers, a second retro-stepped dielectric material portion, a second insulating cap layer, and dielectric isolation structures according to an embodiment of the present disclosure.

Referring to FIGS. 5A and 5B, a second-tier structure can be formed over the first-tier structure (132, 142, 170, 165, 148) and the inter-tier dielectric layer 180. The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces in the second stepped area can be formed in the staircase region 200 employing a same set of processing steps as the processing steps employed to form the first stepped surfaces in the first stepped area with suitable adjustment to the pattern of at least one masking layer. The second stepped surfaces can be laterally offset from the first stepped surfaces to avoid an overlap in a see-through top-down view. The cavity overlying the second stepped surfaces is herein referred to as a second stepped cavity.

A dielectric fill material (such as undoped silicate glass or doped silicate glass) can be deposited to fill the second stepped cavity. Excess portions of the dielectric fill material can be removed from above the horizontal plane including the topmost layer of the second alternating stack (232, 242). A remaining portion of the dielectric fill material that fills the region overlying the second stepped surfaces constitutes a second retro-stepped dielectric material portion 265. The second-tier alternating stack (232, 242) and the second retro-stepped dielectric material portion 265 collectively constitute a second-tier structure, which is an in-process structure that is subsequently modified.

Generally speaking, at least one in-process alternating stack of insulating layers (132, 232) and spacer material layers (such as sacrificial material layers (142, 242)) can be formed over the carrier substrate 109, and at least one retro-stepped dielectric material portion (165, 265) can be formed in the staircase regions on the at least one alternating stack (132, 142, 232, 242).

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Source-select-level isolation structures 72 can be formed through the second insulating cap layer 270 and a subset of layers in an upper portion of the second-tier alternating stack (232, 242). The second sacrificial material layers 242 that are cut by the source-select-level isolation structures 72 correspond to the levels in which source-select-level electrically conductive layers are subsequently formed. The source-select-level isolation structures 72 include a dielectric material such as silicon oxide. The source-select-level isolation structures 72 can laterally extend along a first horizontal direction hd1, and can be laterally spaced apart along a second horizontal direction hd2 that is perpendicular to the first horizontal direction hd1.

Figure 6A:
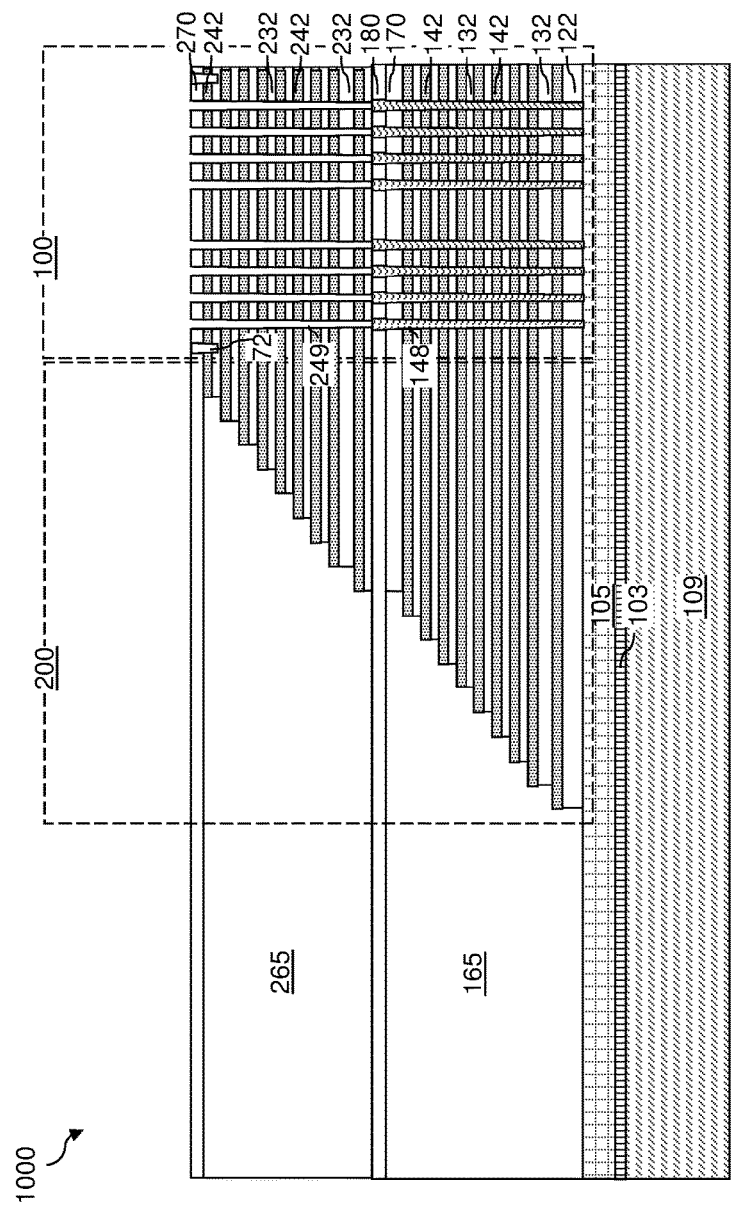
FIG. 6A is a vertical cross-sectional view of the exemplary structure after formation of second-tier memory openings according to an embodiment of the present disclosure.

Referring to FIGS. 6A and 6B, second-tier memory openings 249 are formed through the second-tier structure (232, 242, 270, 265) in areas overlying the sacrificial memory opening fill portions 148. A photoresist layer can be applied over the second-tier structure (232, 242, 270, 265), and can be lithographically patterned to form a same pattern as the pattern of the sacrificial memory opening fill portions 148, i.e., the pattern of the first-tier memory openings 149. Thus, the lithographic mask employed to pattern the first-tier memory openings 149 can be employed to pattern the second-tier memory openings 249. An anisotropic etch can be performed to transfer the pattern of the lithographically patterned photoresist layer through the second-tier structure (232, 242, 270, 265). In one embodiment, the chemistry of the anisotropic etch process employed to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process. A top surface of an underlying sacrificial memory opening fill portion 148 can be physically exposed at the bottom of each second-tier memory opening 249.

Figure 7:
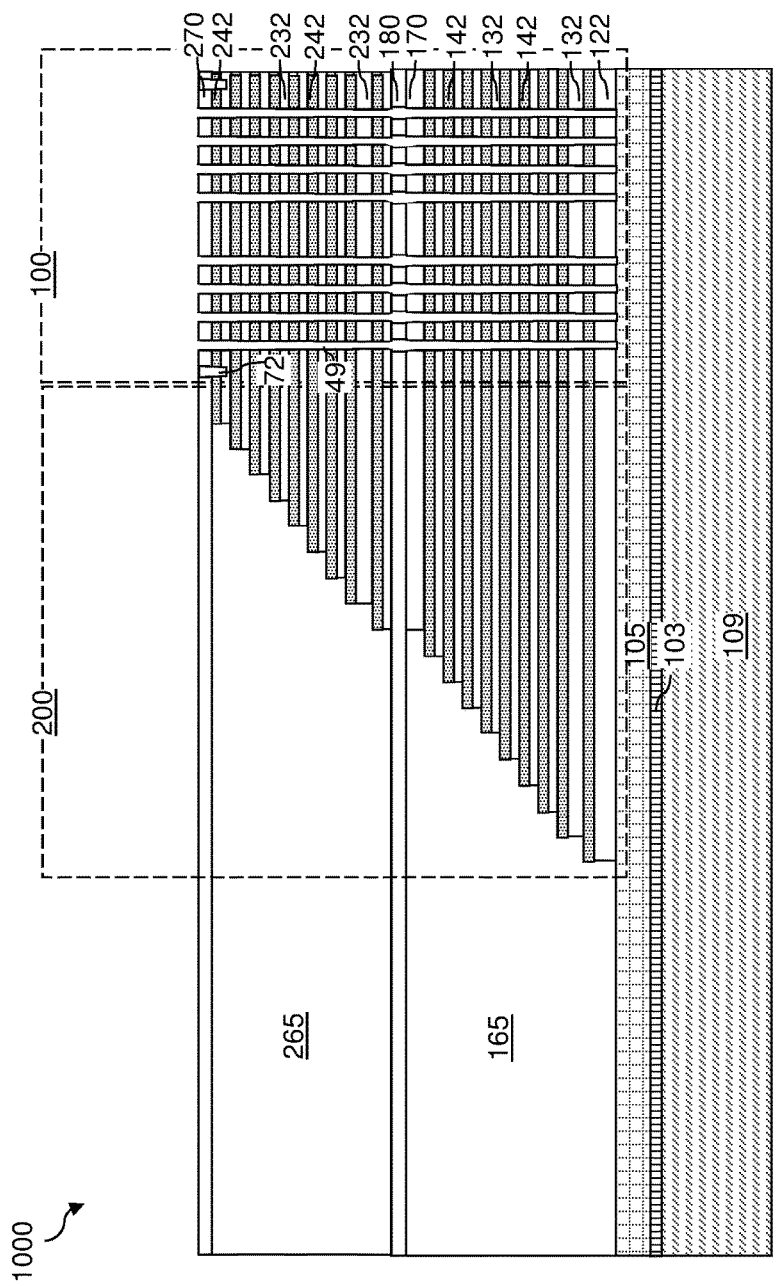
FIG. 7 is a vertical cross-sectional view of the exemplary structure after formation of inter-tier memory openings according to an embodiment of the present disclosure.

Referring to FIG. 7, an etch process can be performed to remove the sacrificial material of the sacrificial memory opening fill portions 148 selective to the materials of the second-tier alternating stack (232, 242) and the first-tier alternating stack (132, 142) (e.g., $C_4F_8/O_2/Ar$ etch). Upon removal of the sacrificial memory opening fill portions 148, each vertically adjoining pair of a second-tier memory opening 249 and a first-tier memory opening 149 forms a continuous cavity that extends through the first-tier alternating stack (132, 142) and the second-tier alternating stack (232, 242). The continuous cavities are herein referred to as memory openings 49 (or inter-tier memory openings). A top surface of the etch stop layer 105 can be physically exposed at the bottom of each memory opening 49.

FIGS. 8A-8E provide sequential cross-sectional views of a memory opening 49 during formation of a memory opening fill structure 58.

Referring to FIG. 8A, a memory opening 49 in the exemplary device structure of FIG. 7 is illustrated. The memory opening 49 extends through the first-tier structure and the second-tier structure. A top surface of the etch stop layer 105 can be physically exposed at the bottom of each memory opening 49.

Referring to FIG. 8B, a stack of layers including a blocking dielectric layer 52, a charge storage layer 54, a tunneling dielectric layer 56, and a semiconductor channel material layer 60L can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. The stack of the blocking dielectric layer 52, the charge storage layer 54, and the tunneling dielectric layer 56 constitutes a memory film 50 that stores memory bits.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The semiconductor channel material layer 60L can have a doping of a first conductivity type, which may be p-type or n-type. The atomic concentration of electrical dopants of the first conductivity type in the semiconductor channel material layer 60L can be in a range from $1.0 \times 10^{14}/cm^3$ to $1.0 \times 10^{17}/cm^3$, such as from $3.0 \times 10^{14}/cm^3$ to $3.0 \times 10^{16}/cm^3$, although lesser and greater atomic concentrations can also be employed. The thickness of the semiconductor channel material layer 60L can be in a range from 2 nm to 20 nm, although lesser and greater thicknesses can also be employed. A cavity 49' is formed in the volume of each memory opening 49 that is not filled with the deposited material layers (52, 54, 56, 60L).

Figure 8D:
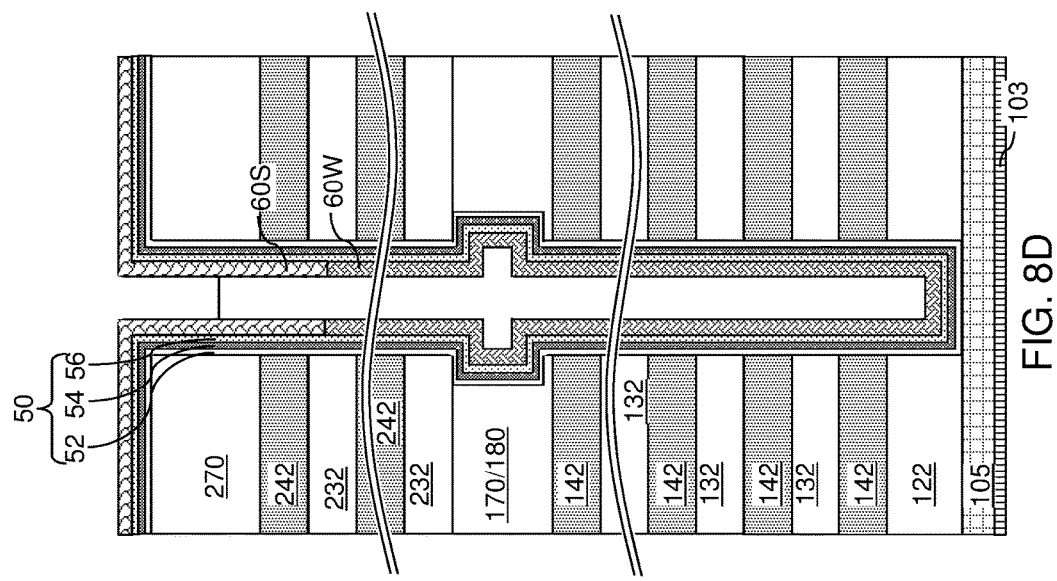
Figure 8C:
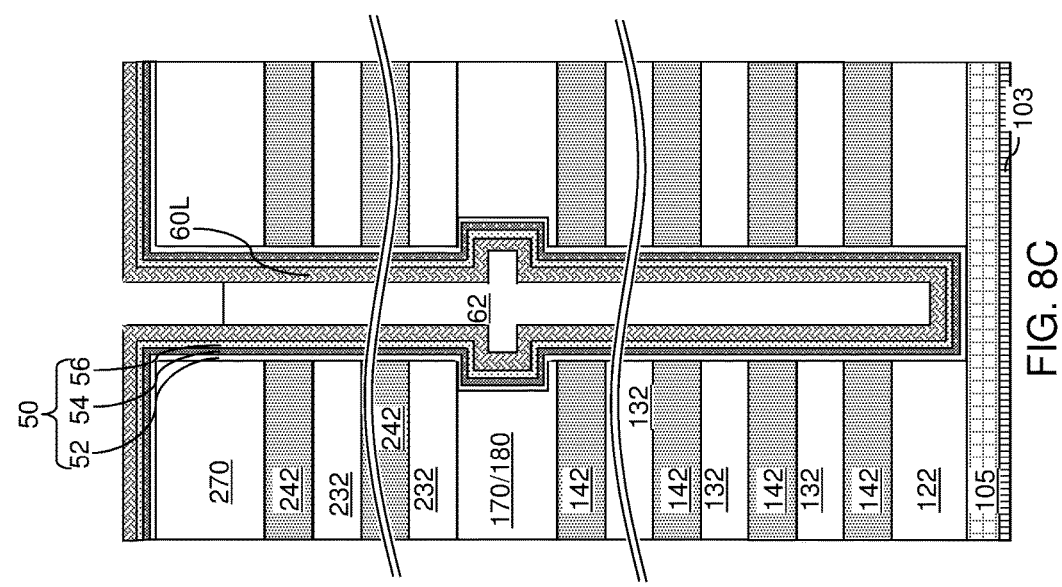

Referring to FIG. 8C, in case the cavity 49' in each memory opening is not completely filled by the semiconductor channel material layer 60L, a dielectric core layer can be deposited in the cavity 49' to fill any remaining portion of the cavity 49' within each memory opening. The dielectric core layer can be deposited by a conformal deposition method such as low pressure chemical vapor deposition (LPCVD), or by a self-planarizing deposition process such as spin coating. The dielectric core layer includes a dielectric material such as a low density silicon oxide material having a higher etch rate in hydrofluoric acid than thermal silicon oxide. For example, the dielectric core layer can include low temperature TEOS oxide, a doped silicate glass, or organosilicate glass. The horizontal portion of the dielectric core layer overlying the second insulating cap layer 270 can be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 8D, electrical dopants of the first conductivity type or a second conductivity type (which is the opposite of the first conductivity type) can be optionally implanted into upper portions of the semiconductor channel material layer 60L by a first ion implantation process. The implanted regions of the semiconductor channel material layer 60L have a different net doping than the unimplanted regions of the semiconductor channel material layer 60L. The energy of the ion implantation process can be selected such that the implanted electrical dopants are implanted down to the bottommost source select level, which is the level of the bottommost second sacrificial material layer 242 that is laterally divided by the source-select-level isolation structures 72.

The implanted regions of the semiconductor channel material layer 60L are herein referred to as source-select-level channel portions 60S. The doping of the source-select-level channel portions 60S determine the threshold voltage for turning on vertical field effect transistors at the source select levels. The source-select-level channel portions 60S can have a net doping of the first conductivity type at a net dopant concentration in a range from $1.0 \times 10^{14}/cm^3$ to $1.0 \times 10^{18}/cm^3$, such as from $1.0 \times 10^{15}/cm^3$ to $3.0 \times 10^{17}/cm^3$, although lesser and greater atomic concentrations can also be employed. The unimplanted regions of the semiconductor channel material layer 60L have a doping of the first conductivity type at a dopant concentration as provided at the processing steps of FIG. 8C, and are herein referred to as word-line-level channel portions 60W.

Figure 8E:
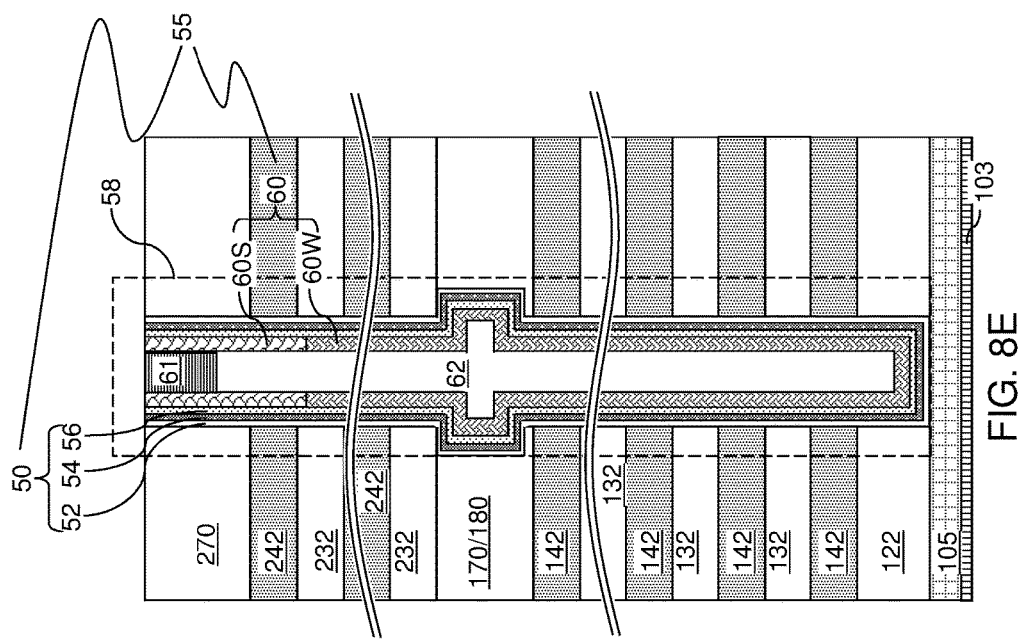
Figure 9:
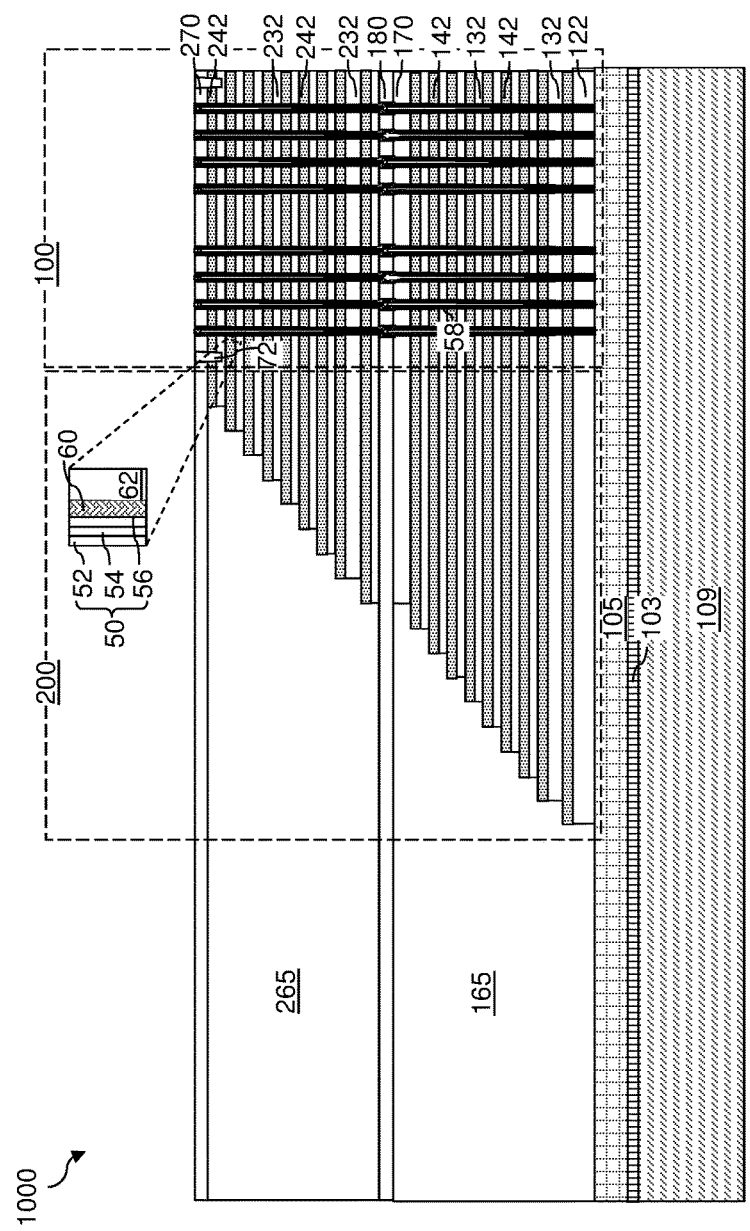
FIG. 9 is a vertical cross-sectional view of the exemplary structure after formation of memory opening fill structures according to an embodiment of the present disclosure.

Referring to FIGS. 8E and 9, a doped semiconductor material having a doping of the second conductivity type can be deposited into cavities overlying the dielectric cores 62. Portions of the deposited doped semiconductor material of the second conductivity type, the source-select-level channel portions 60S (which are implanted portions of the semiconductor channel material layer 60L), the tunneling dielectric layer 56, the charge storage layer 54, and the blocking dielectric layer 52 that overlie the horizontal plane including the top surface of the second insulating cap layer 270 can be removed by a planarization process such as a chemical mechanical planarization (CMP) process.

Each remaining portion of the doped semiconductor material having a doping of the second conductivity type constitutes a source region 61. The source regions 61 can have a doping of the second conductivity type that is the opposite of the first conductivity type. For example, if the first conductivity type is p-type, the second conductivity type is n-type, and vice versa. The dopant concentration in the source regions 61 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon.

Each adjoining set of a word-line-level channel portion 60W and a source-select-level channel portion 60S constitutes a vertical semiconductor channel 60, through which electrical current can flow when a vertical NAND device including the vertical semiconductor channel 60 is turned on. Thus, each source-select-level channel portion 60S is formed at upper end regions of a respective vertical semiconductor channel 60. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements as embodied as portions of the charge storage layer 54, and an optional blocking dielectric layer 52. Each combination of a memory stack structure 55, a dielectric core 62, and a drain region 63 within a memory opening 49 constitutes a memory opening fill structure 58. Each memory opening is filled with a respective memory opening fill structure 58. Each of the memory stack structures 55 comprises a memory film 50 and a vertical semiconductor channel 60 laterally surrounded by the memory film 50. Each memory stack structure 55 can vertically extend through each layer within the first alternating stack (132, 142) and within the second alternating stack (232, 242), and can be formed within a two-dimensional array of memory stack structures 55 in the memory array region 100. The source regions 61 are formed at top ends of the memory stack structures 55.

Figure 10:
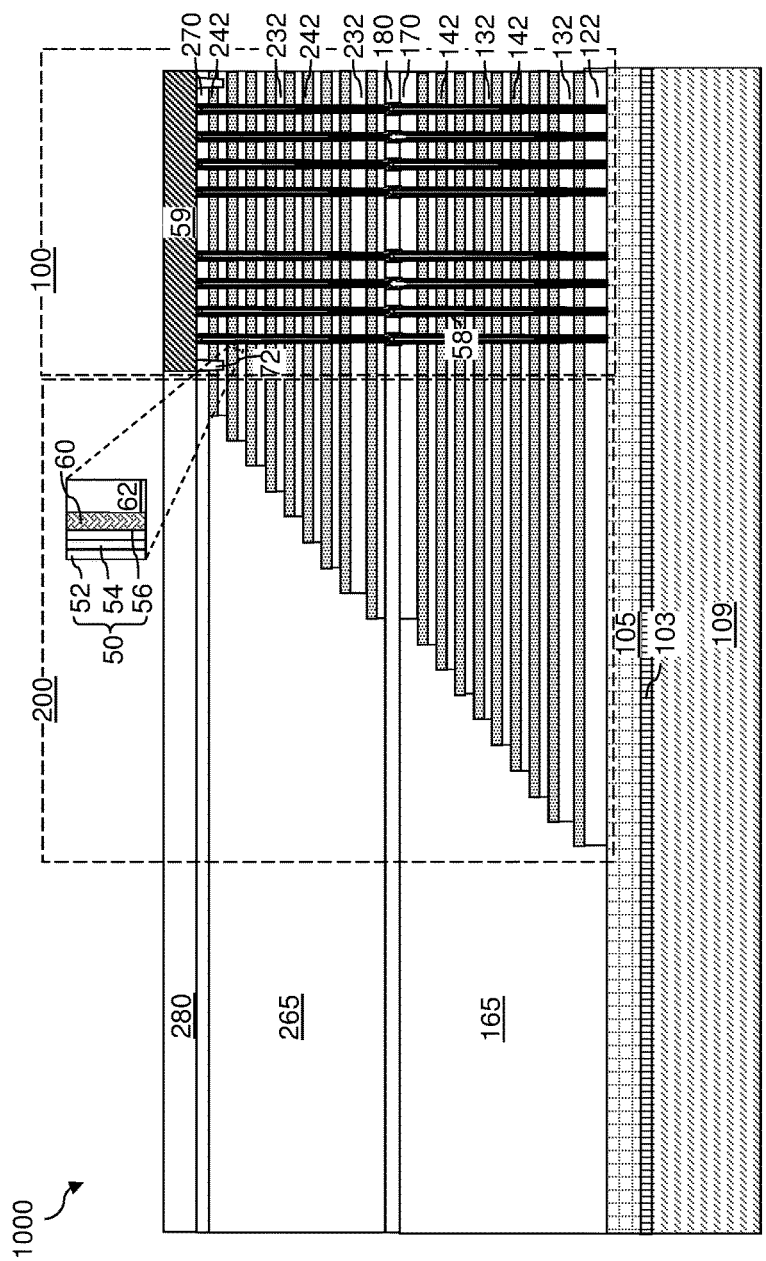
FIG. 10 is a vertical cross-sectional view of the exemplary structure after formation of a source line and a source-level dielectric layer according to an embodiment of the present disclosure.

Referring to FIG. 10, a combination of a source line 59 and a source-level dielectric layer 280 is formed above the second insulating cap layer 270. The source line 59 overlies, and contacts, each source region 61, and is located within the memory array region 100. The source-level dielectric layer 280 includes a dielectric material such as silicon oxide, and fills the area that is not covered by the source line 59. The source line 59 may comprise one or more layers of any suitable electrically conductive material, such as a metal, metal alloy (including a metal silicide and/or conductive metal nitride) or heavily doped semiconductor. For example, the source line 59 may comprise a combination of a heavily doped source semiconductor layer (e.g., heavily doped polysilicon layer) and an overlying silicide (e.g., tungsten silicide, titanium silicide, etc.) layer. The source semiconductor layer has a doping of the second conductivity type. The dopant concentration in the source semiconductor layer can be in a range from $5.0 \times 10^{19}/cm^3$ to $2.0 \times 10^{21}/cm^3$, although lesser and greater dopant concentrations can also be employed. The source line 59 and the source-level dielectric layer 280 can complimentarily cover the entire area of the exemplary structure. In one embodiment, the source line 59 can be formed by depositing and patterning a doped semiconductor material having a doping of the second conductivity type and an optional metal silicide layer, and the source-level dielectric layer 280 can be subsequently deposited in areas that are not covered by the source line 59. Alternatively, the source-level dielectric layer 280 can be deposited and patterned, and the source line 59 can be deposited within an opening in the source-level dielectric layer 280. In one embodiment, the top surfaces of the source line 59 and the source-level dielectric layer 280 can be formed within a same horizontal plane.

Figure 11A:
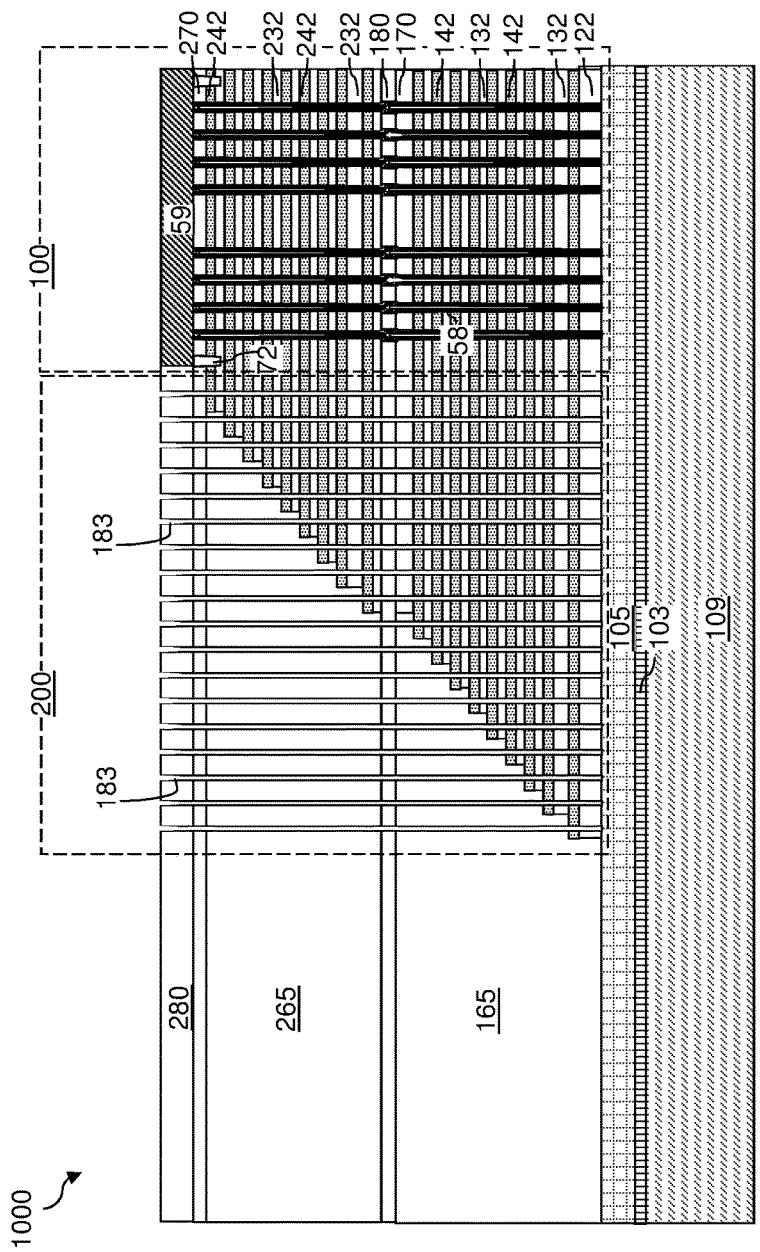
FIG. 11A is a vertical cross-sectional view of the exemplary structure after formation of via cavities according to an embodiment of the present disclosure.

Referring to FIGS. 11A, 11B, and 12A, a photoresist layer (not shown) can be applied over the source-level dielectric layer 280, and can be lithographically patterned to form various openings in areas in which via cavities are to be subsequently formed. The opening can be formed over the horizontal surfaces of the stepped surfaces in the staircase region 200. An anisotropic etch process can be performed to transfer the pattern of the openings in the photoresist layer through the various material portions overlying the etch stop layer 105. Staircase region via cavities 183 are formed through a respective one of the horizontal surfaces of the stepped surfaces in the staircase region 200. Each staircase region via cavity 183 can vertically extend from the top surface of the source-level dielectric layer 280 to the etch stop layer 105.

In one embodiment, each of the staircase region via cavity 183 can be a cylindrical via cavity. As used herein, a "cylindrical via cavity" refers to a via cavity having only a straight sidewall or straight sidewalls such that each straight sidewall is vertical or substantially vertical. As used herein, a surface is "substantially vertical" if the taper angle of the surface with respect to a vertical direction is less than 5 degrees. A first subset of the staircase region via cavities 183 can be cylindrical via cavities extending through the second retro-stepped dielectric material portion 265 and a subset of layers within the second alternating stack (232, 242) and the first alternating stack (132, 142). A second subset of the staircase region via cavities 183 can be cylindrical via cavities extending through the second retro-stepped dielectric material portion 265 and the first retro-stepped dielectric material portion 165 and a subset of layers within the first alternating stack (132, 142). A top surface of the etch stop layer 105 can be physically exposed at the bottom of each of the staircase region via cavities 183.

Figure 12B:
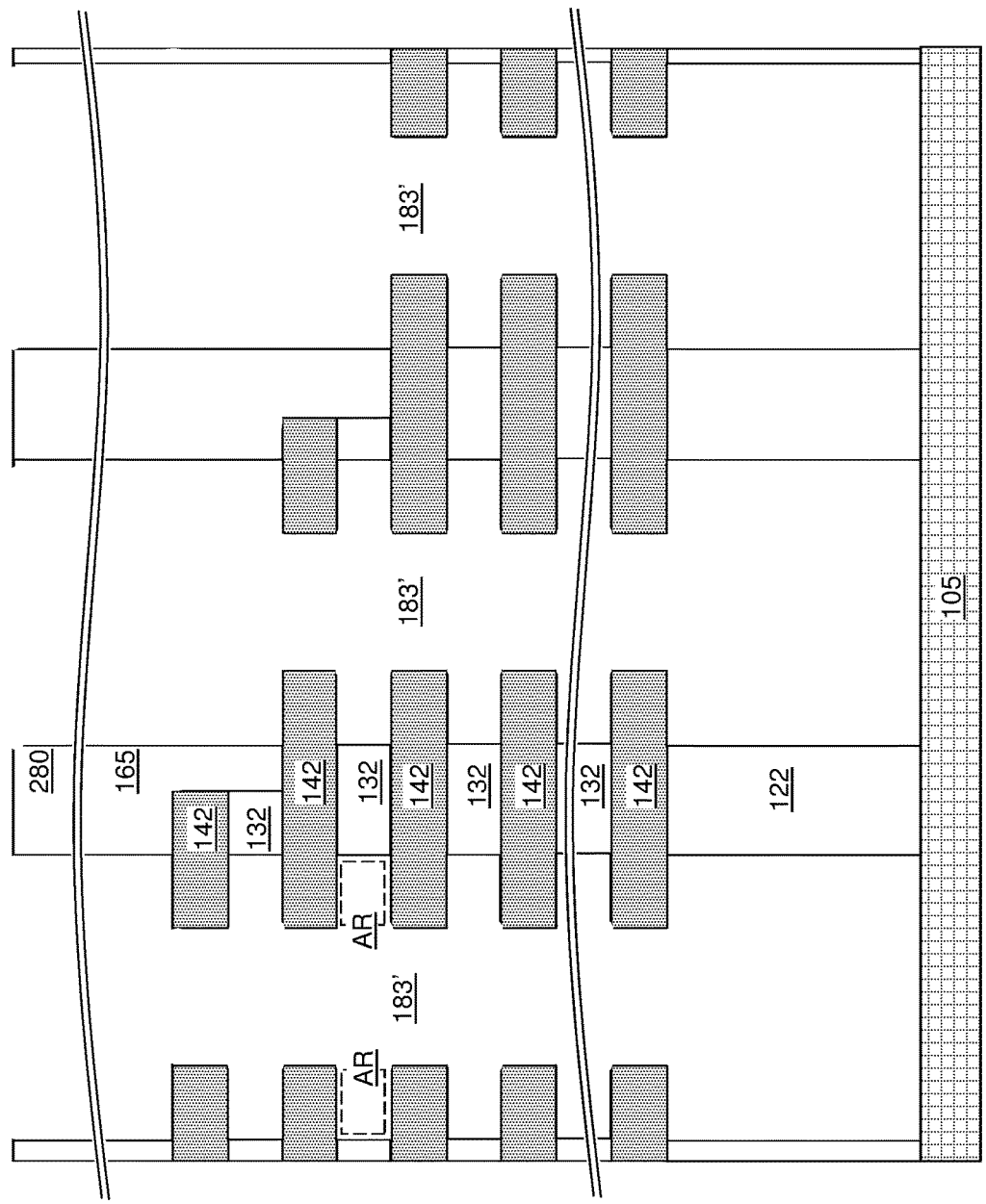

Referring to FIG. 12B, an isotropic etch process can be performed to laterally recess the insulating layers (132, 232) with respect to the spacer material layers such as the first and second sacrificial material layers (142, 242). Each staircase region via cavity 183 can be converted from a cylindrical via cavity to a ribbed via cavity 183'. As used herein, a "ribbed via cavity" refers to a via cavity including at least one annular laterally protruding volume. Each annular laterally protruding volume of a ribbed via cavity is herein referred to as a "rib region."

In one embodiment, the retro-stepped dielectric material portions (165, 265) can include a same dielectric material or a similar dielectric material as the insulating layers (132, 232). For example, the first and second insulating layers (132, 232) can include undoped silicate glass, and the retro-stepped dielectric material portions (165, 265) can include undoped silicate glass or doped silicate glass. In this case, the ribbed via cavities 183' can be formed from the cylindrical staircase region via cavities 183 by etching materials of the retro-stepped dielectric material portions (165, 265) and the insulating layers (132, 232) selective to the spacer material layers (i.e., the first and second sacrificial material layers (142, 242)).

In one embodiment, the dielectric materials of the source-level dielectric layer 280, the first and second insulating cap layers (170, 270), the first and second retro-stepped dielectric material portions (165, 265), and the insulating layers (132, 232) can comprise silicon oxide materials (such as undoped silicate glass and various doped silicate glasses), and the first and second sacrificial material layers (142, 242) can include a sacrificial material that is not a silicate glass material (such as silicon nitride or a semiconductor material). In this case, the isotropic etch process can etch the dielectric materials of the source-level dielectric layer 280, the first and second insulating cap layers (170, 270), the first and second retro-stepped dielectric material portions (165, 265), and the insulating layers (132, 232) can be etched selective to the materials of the first and second sacrificial material layers (142, 242) to form the ribbed via cavities 183'.

In one embodiment, the spacer material layers of the alternating stacks (132, 142, 232, 242) can include sacrificial material layers (142, 242) that are composed of silicon nitride, and the insulating layers (132, 232) and the retro-stepped dielectric material portions (265, 165) can include silicon oxide materials. In this case, the retro-stepped dielectric material portions (165, 265) and each insulating layer (132, 232) physically exposed to the staircase region via cavities 183 can be isotropically recessed by a wet etch process employing hydrofluoric acid. Each ribbed via cavity 183' can include a ribbed cavity region extending through the alternating stacks (132, 142, 232, 242), an overlying cavity laterally surrounded by the second retro-stepped dielectric material portion 265 and optionally by the first retro-stepped dielectric material portion 165 (in case the ribbed via cavity 183' extends only through the first-tier alternating stack (132, 142) and does not extend through the second-tier alternating stack (232, 242)), and an underlying cavity that underlies the alternating stacks (132, 142, 232, 242). Each ribbed via cavity 183' can include annular recesses AR, or rib regions, formed at levels of insulating layers (132, 232) in the subset of layers within the alternating stacks (132, 142, 232, 242) through which the ribbed via cavity 183' vertically extends.

Figure 12C:
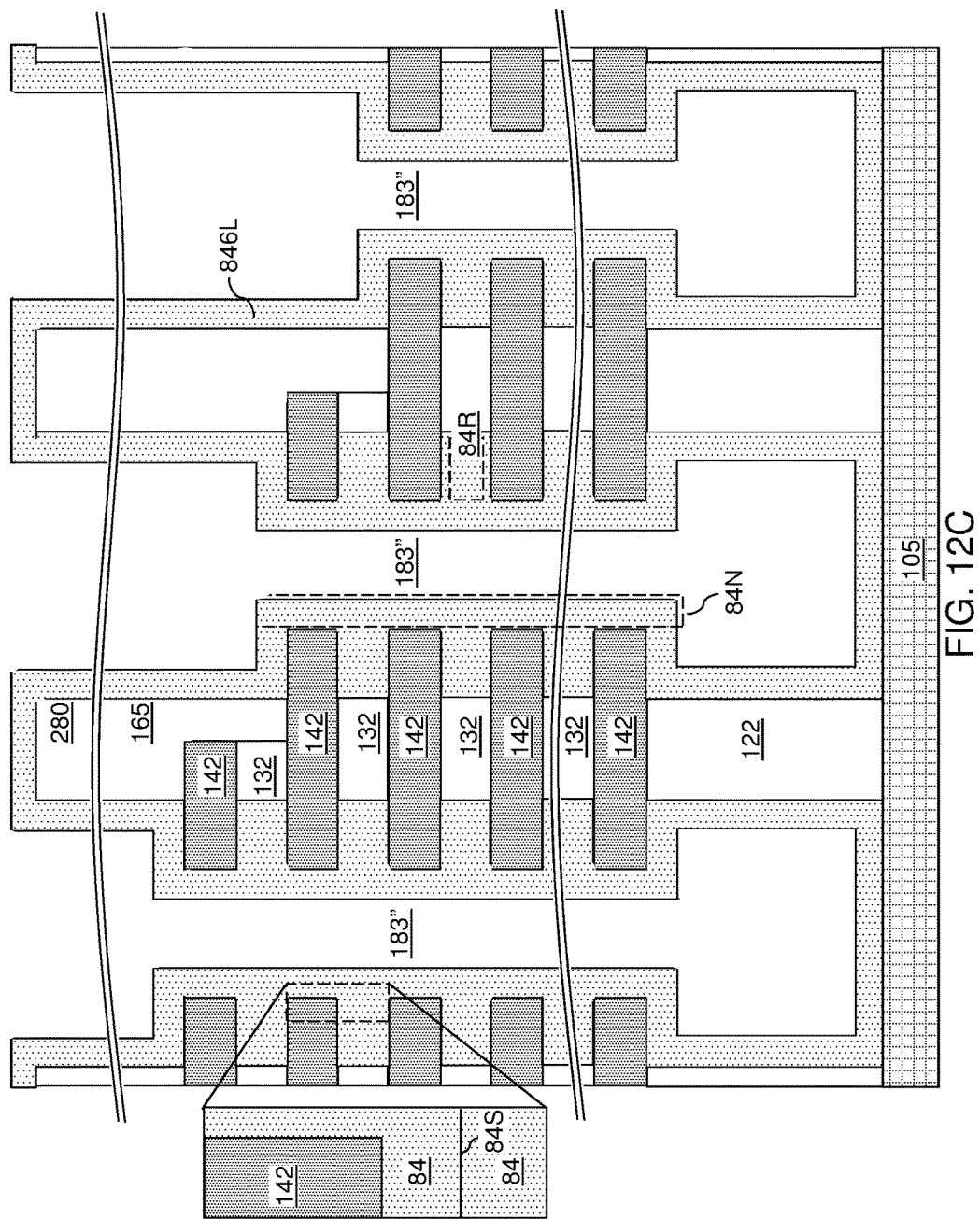

Referring to FIG. 12C, a conformal dielectric via liner 846L can be deposited at the periphery of the ribbed via cavities 183' by a conformal deposition process. The conformal dielectric via liner 846L includes a dielectric material that is different from the material of the sacrificial material layers (142, 242). For example, the conformal dielectric via liner 846L can include silicon oxide or a dielectric metal oxide (such as aluminum oxide). In one embodiment, the conformal dielectric via liner 846L can include undoped silicate glass formed by thermal decomposition of tetraethylorthosilicate (TEOS). The thickness of the conformal dielectric via liner 846L can be greater than one half of the maximum thickness of the sacrificial material layers (142, 242). Portions of the conformal dielectric via liner 846L deposited at peripheries of the ribbed via cavities 183' fill the annular recesses AR (i.e., the rib regions). Thus, volumes formed by isotropic etching of the insulating layers (132, 232) are filled with rib portions of the conformal dielectric via liner 846L. A neck portion 84N of the conformal dielectric via liner 846L can be formed around each set of at least one annular portions of the conformal dielectric via liner 846L that fill the annular recess(es) of each ribbed via cavity 183'. An annular seam 84S can be present within each portion of the conformal dielectric via liner 846L that fills the annular recesses AR, which is herein referred to as a dielectric liner rib portion 84R. The conformal dielectric via liner 846L can be formed directly on each physically exposed top surface of the etch stop layer 105. An unfilled void 183" can be present within each ribbed via cavity 183' after deposition of the conformal dielectric via liner 846L.

Figure 13:
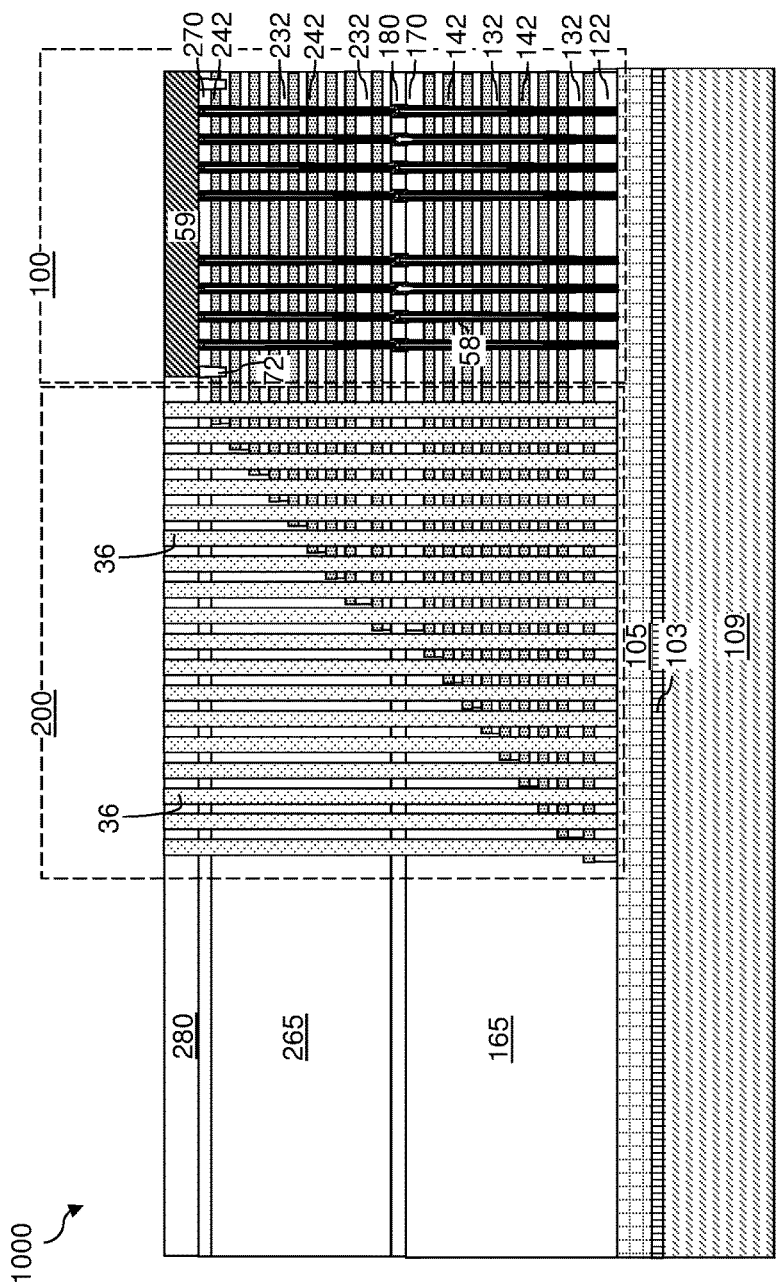
FIG. 13 is a vertical cross-sectional view of the exemplary structure after formation of temporary fill material portions in the via cavities according to an embodiment of the present disclosure.

Referring to FIGS. 12D and 13, a temporary fill material can be deposited in each of the unfilled voids 183" in the staircase region via cavities by a conformal deposition process. Temporary fill material portions 16 can be formed in the unfilled voids 183" by deposition of the temporary fill material and planarization of the temporary fill material from above the top surface of the source-level dielectric layer 280. The temporary fill material is a material that can be removed selective to the material of the conformal dielectric via liner 846L. For example, the temporary fill material can comprise a semiconductor material such as amorphous silicon or a dielectric material such as organosilicate glass. The temporary fill material can be deposited by a non-conformal deposition process or a conformal deposition process. A cavity 16' may be present at a lower portion of each staircase region via cavity. Planarization of the temporary fill material can be performed by a chemical mechanical planarization (CMP) process or by a recess etch process. Horizontal portions of the conformal dielectric via liner 846L can be removed from above the top surface of the source-level dielectric layer 280 by the planarization process.

Each remaining portion of the temporary fill material filling the unfilled voids 183" constitutes a temporary fill material portion 16. Remaining portions of the conformal dielectric via liner 846L constitute insulating spacers. Each insulating spacer that includes at least one dielectric liner rib portion 84R is herein referred to as an in-process ribbed insulating spacer 84. Each in-process ribbed insulating spacer 84 can include a neck portion 84N that vertically extends through a respective subset of the layers in the alternating stacks (132, 142, 232, 242), one or more dielectric liner rib portions 84R attached to an outer periphery of the neck portion 84N, an upper cylindrical portion 84U extending through the source-level dielectric layer 280 and the second retro-stepped dielectric material portion 265 and optionally through the first retro-stepped dielectric material portion 165, a lower cylindrical portion 84L that extends through the drain-level insulating layer 122, and a bottom portion 84B. Each adjoining set of an in-process ribbed insulating spacer 84 and a temporary fill material portion 16 constitutes a temporary via fill structure 36. Each temporary via fill structure 36 can be formed between a neighboring pair of vertical steps S and through a respective one of the horizontal surfaces within the first and second stepped surfaces. In one embodiment, the temporary via fill structures 36 can be formed in rows that extend along the first horizontal direction hd1 (e.g., word line direction).

Figure 14A:
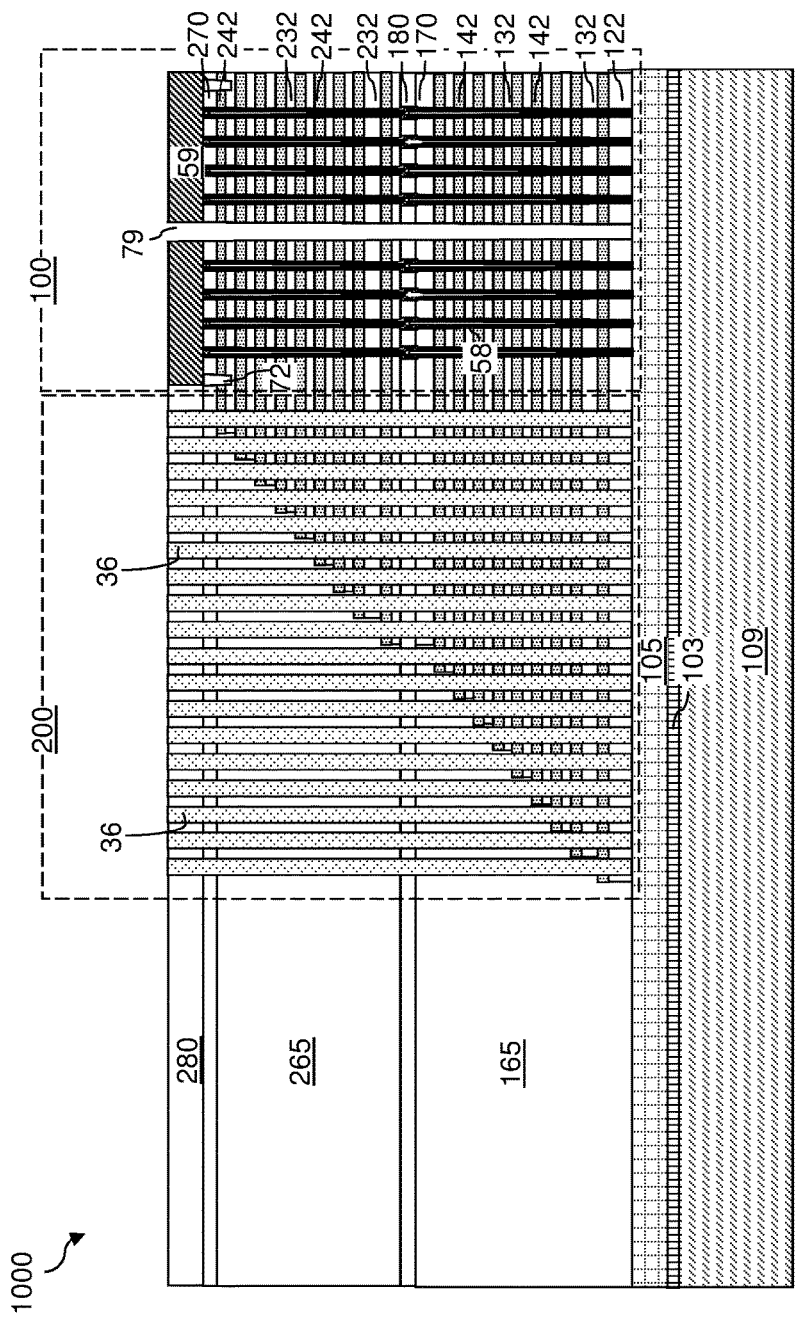
FIG. 14A is a vertical cross-sectional view of the exemplary structure after formation of backside trenches according to an embodiment of the present disclosure.
Figure 14B:
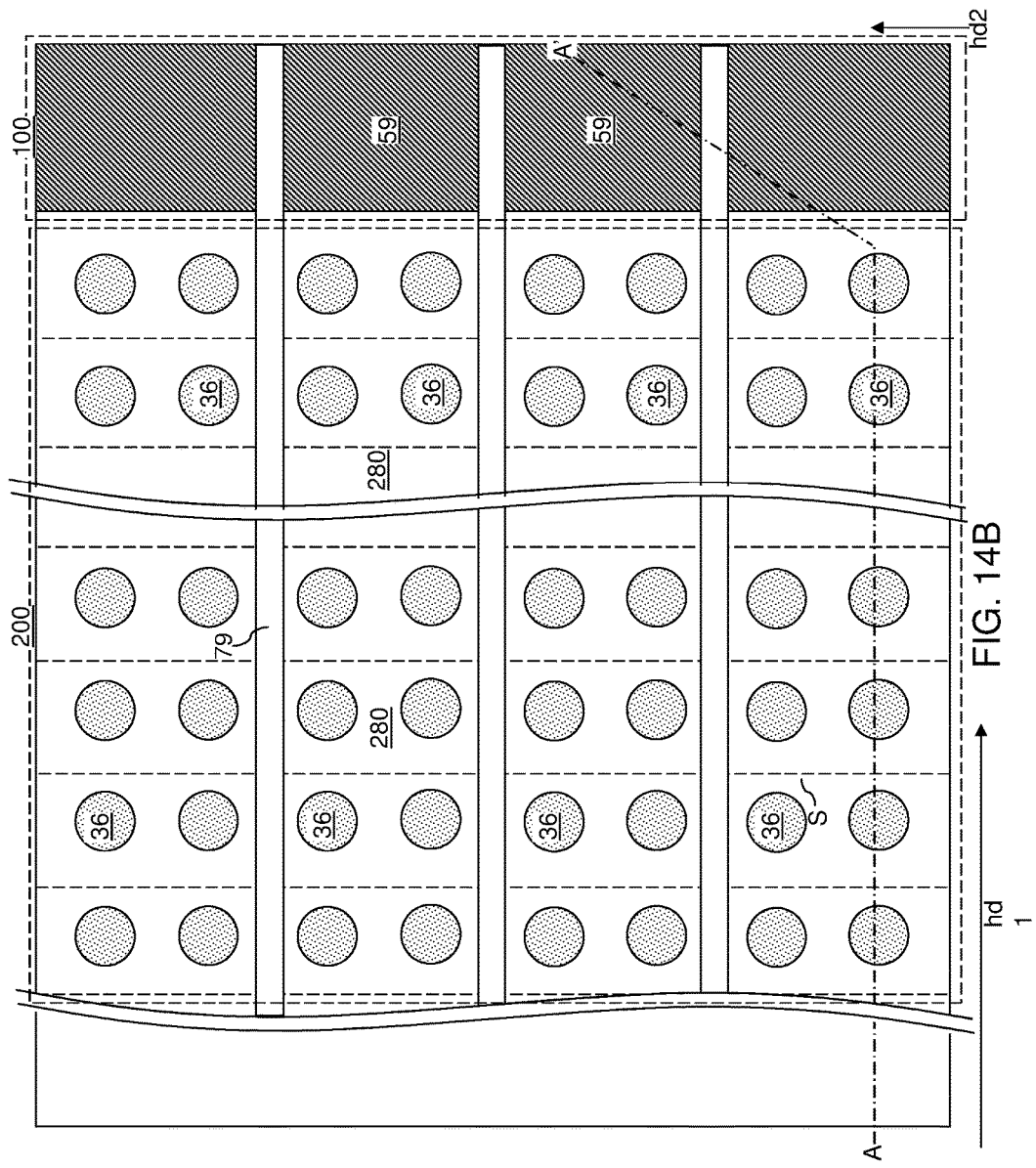
FIG. 14B is a top-down view of the exemplary structure of FIG. 14A. The hinged vertical plane A-A' corresponds to the plane of the vertical cross-sectional view of FIG. 14A.

Referring to FIGS. 14A and 14B, backside trenches 79 are subsequently formed through the source-level dielectric layer 280, the source line 59, and the alternating stacks (132, 142, 232, 242). For example, a photoresist layer can be applied and lithographically patterned over the source-level dielectric layer 280 to form elongated openings that extend along the first horizontal direction hd1. An anisotropic etch is performed to transfer the pattern in the patterned photoresist layer through the source-level dielectric layer 280, the source line 59, and the alternating stacks (132, 142, 232, 242) down to the etch stop layer 105. The cavities formed by the anisotropic etch constitute the backside trenches 79. The photoresist layer can be subsequently removed, for example, by ashing. The backside trenches 79 extend along the first horizontal direction hd1, and thus, are elongated along the first horizontal direction hd1. The backside trenches 79 can be laterally spaced among one another along a second horizontal direction hd2, which can be perpendicular to the first horizontal direction hd1. The backside trenches 79 extend through the memory array region 100 (which may extend over a memory plane) and the staircase region 200. The backside trenches 79 can laterally divide the alternating stacks (132, 142, 232, 242) into memory blocks.

Figure 15:
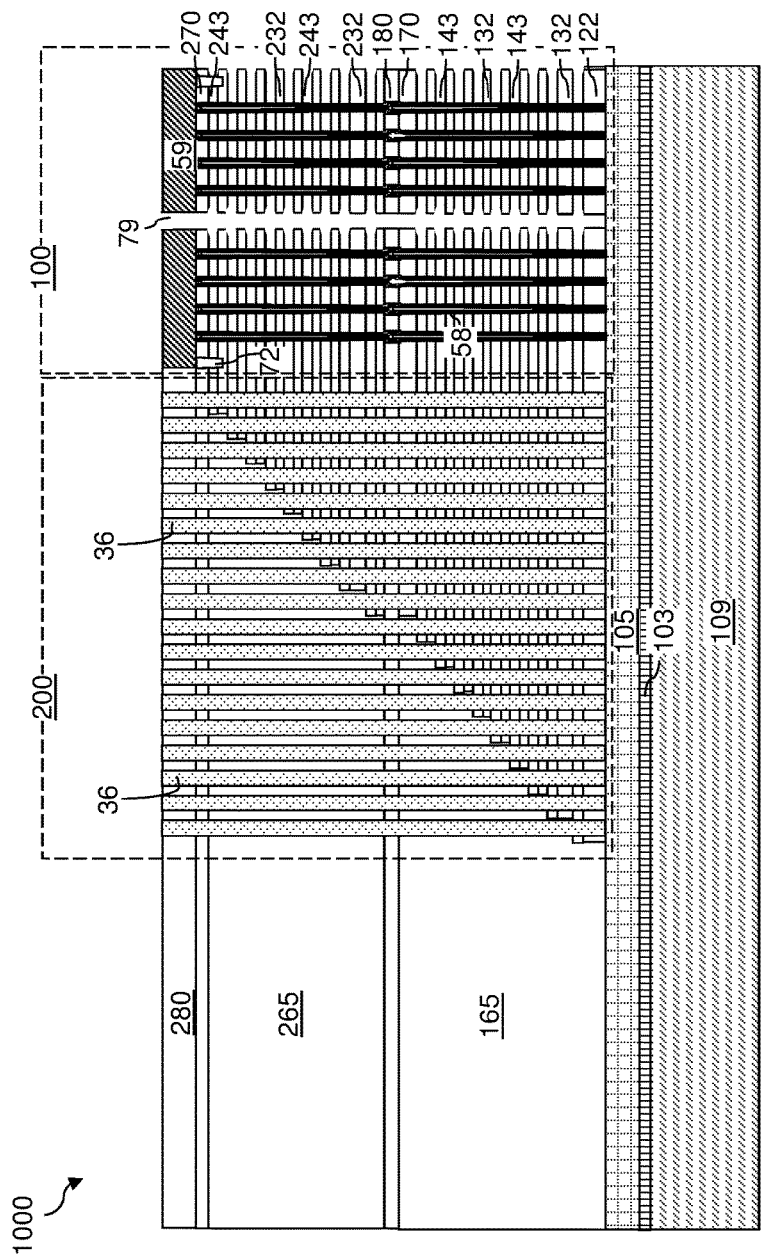
FIG. 15 is a vertical cross-sectional view of the exemplary structure after formation of backside recesses according to an embodiment of the present disclosure.

Referring to FIG. 15, an etchant that selectively etches the materials of the first and second sacrificial material layers (142, 242) with respect to the materials of the first and second insulating layers (132, 232), the first and second insulating cap layers (170, 270), the material of the in-process ribbed insulating spacer 84, and the material of the outermost layer of the memory films 50 can be introduced into the backside trenches 79, for example, employing an isotropic etch process. For example, the first and second sacrificial material layers (142, 242) can include silicon nitride, the materials of the first and second insulating layers (132, 232), the first and second insulating cap layers (170, 270), the material of the in-process ribbed insulating spacer 84, and the material of the outermost layer of the memory films 50 can include silicon oxide materials. First backside recesses 143 are formed in volumes from which the first sacrificial material layers 142 are removed. Second backside recesses 243 are formed in volumes from which the second sacrificial material layers 242 are removed.

The isotropic etch process can be a wet etch process employing a wet etch solution, or can be a gas phase (dry) etch process in which the etchant is introduced in a vapor phase into the backside trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 109. A backside recess (143, 243) can be vertically bounded by a top surface of an underlying insulating layer (132 or 232) and a bottom surface of an overlying insulating layer (132 or 232). In one embodiment, each of the first and second backside recesses (243, 243) can have a uniform height throughout.

Figure 16:
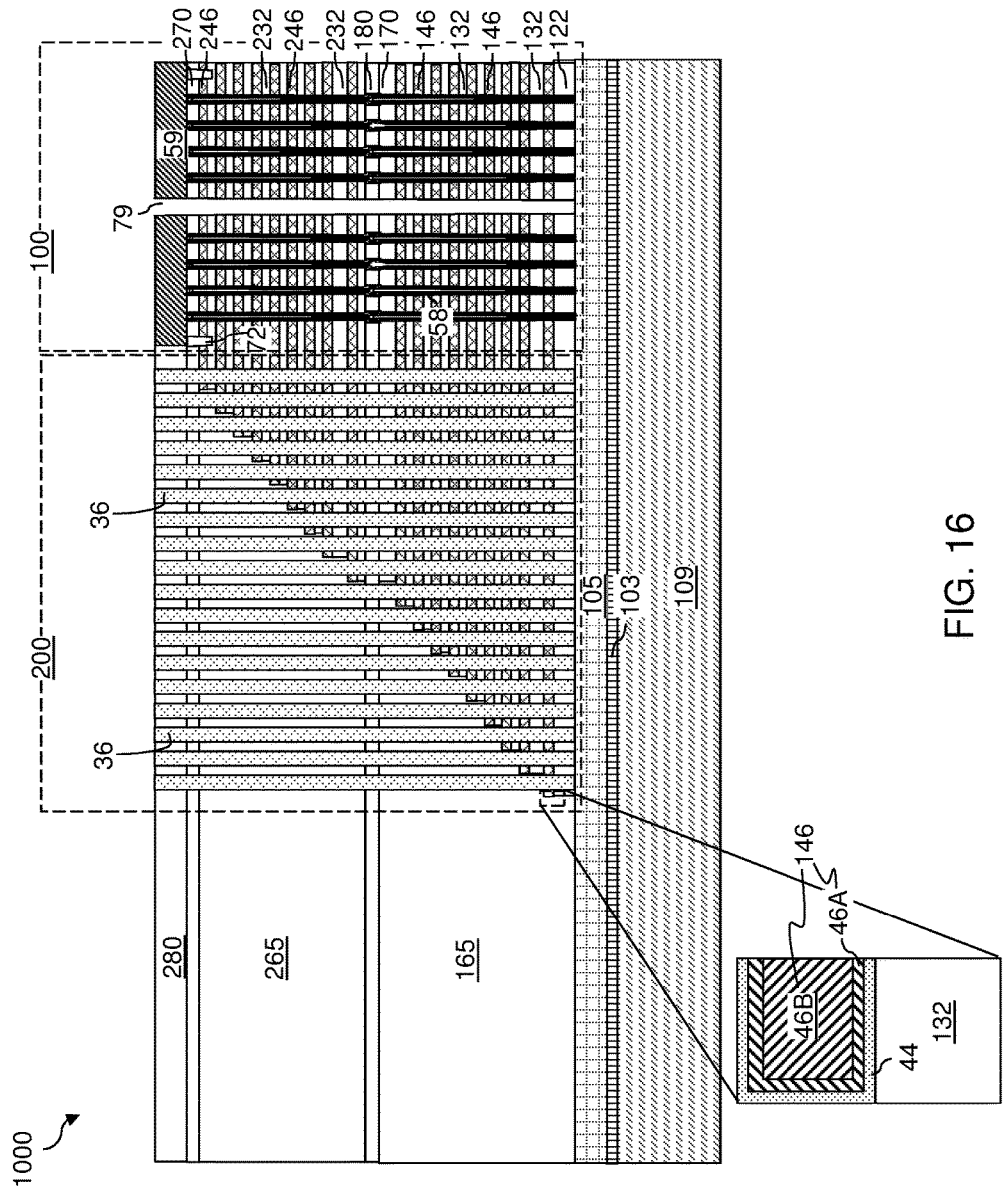
FIG. 16 is a vertical cross-sectional view of the exemplary structure after formation of backside blocking dielectric layers and electrically conductive layers according to an embodiment of the present disclosure.

Referring to FIG. 16, a backside blocking dielectric layer 44 can be optionally deposited in the backside recesses (143, 243) and the backside trenches 79 and over the source-level dielectric layer 280. The backside blocking dielectric layer 44 can be deposited on the physically exposed portions of the outer surfaces of the memory stack structures 55, which are portions of the memory opening fill structures 58. The backside blocking dielectric layer 44 includes a dielectric material such as a dielectric metal oxide, silicon oxide, or a combination thereof. For example, the backside blocking dielectric layer 44 can include aluminum oxide. The backside blocking dielectric layer 44 can be formed by a conformal deposition process such as atomic layer deposition or chemical vapor deposition. The thickness of the backside blocking dielectric layer 44 can be in a range from 1 nm to 20 nm, such as from 2 nm to 10 nm, although lesser and greater thicknesses can also be employed.

At least one conductive material (46A, 46B) can be deposited in the plurality of backside recesses (243, 243), on the sidewalls of the backside trench 79, and over the source-level dielectric layer 280. The at least one conductive material (46A, 46B) can be deposited by a conformal deposition method, which can be, for example, chemical vapor deposition (CVD), atomic layer deposition (ALD), electroless plating, electroplating, or a combination thereof. The at least one conductive material (46A, 46B) can include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material (46A, 46B) can include at least one metallic material, i.e., an electrically conductive material that includes at least one metallic element. Non-limiting exemplary metallic materials that can be deposited in the backside recesses (143, 243) include tungsten, tungsten nitride, titanium, titanium nitride, tantalum, tantalum nitride, cobalt, and ruthenium. For example, the at least one conductive material (46A, 46B) can include a conductive metallic nitride liner 46A that includes a conductive metallic nitride material such as TiN, TaN, WN, or a combination thereof, and a conductive fill material 46B such as W, Co, Ru, Mo, Cu, or combinations thereof. In one embodiment, the at least one conductive material (46A, 46B) for filling the backside recesses (143, 243) can be a combination of titanium nitride layer and a tungsten fill material.

Electrically conductive layers (146, 246) can be formed in the backside recesses (143, 243) by deposition of the at least one conductive material (46A, 46B). A plurality of first electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside trench 79 and over the source-level dielectric layer 280. Each of the first electrically conductive layers 146 and the second electrically conductive layers 246 can include a respective conductive metallic nitride liner 46A and a respective conductive fill material 46B. Thus, the first and second sacrificial material layers (142, 242) can be replaced with the first and second electrically conductive layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

Residual conductive material can be removed from inside the backside trenches 79. Specifically, the deposited metallic material of the continuous metallic material layer can be etched back from the sidewalls of each backside trench 79 and from above the source-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246.

A subset of the second electrically conductive layers 246 located at the levels of the source-select-level isolation structures 72 constitutes source select gate electrodes. A subset of the electrically conductive layer (146, 246) located underneath the source select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The memory stack structures 55 vertically extend through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246). The first sacrificial material layers 142 are replaced with material portions including the first electrically conductive layers 146 and a subset of the backside blocking dielectric layers 44. The second sacrificial material layers 142 are replaced with material portions including the second electrically conductive layers 246 and another subset of the backside blocking dielectric layers 44.

Memory stack structures 55 vertically extending through an alternating stack (132, 146, 232, 246) of insulating layers (132, 232) and electrically conductive layers (146, 246) on a carrier substrate 109. Each of the memory stack structures 55 comprises a memory film 50 and a vertical semiconductor channel 60 laterally surrounded by the memory film 50. A retro-stepped dielectric material portion (165 and/or 265) overlies stepped surfaces of the alternating stack (132, 142, 232, 242).

Figure 17:
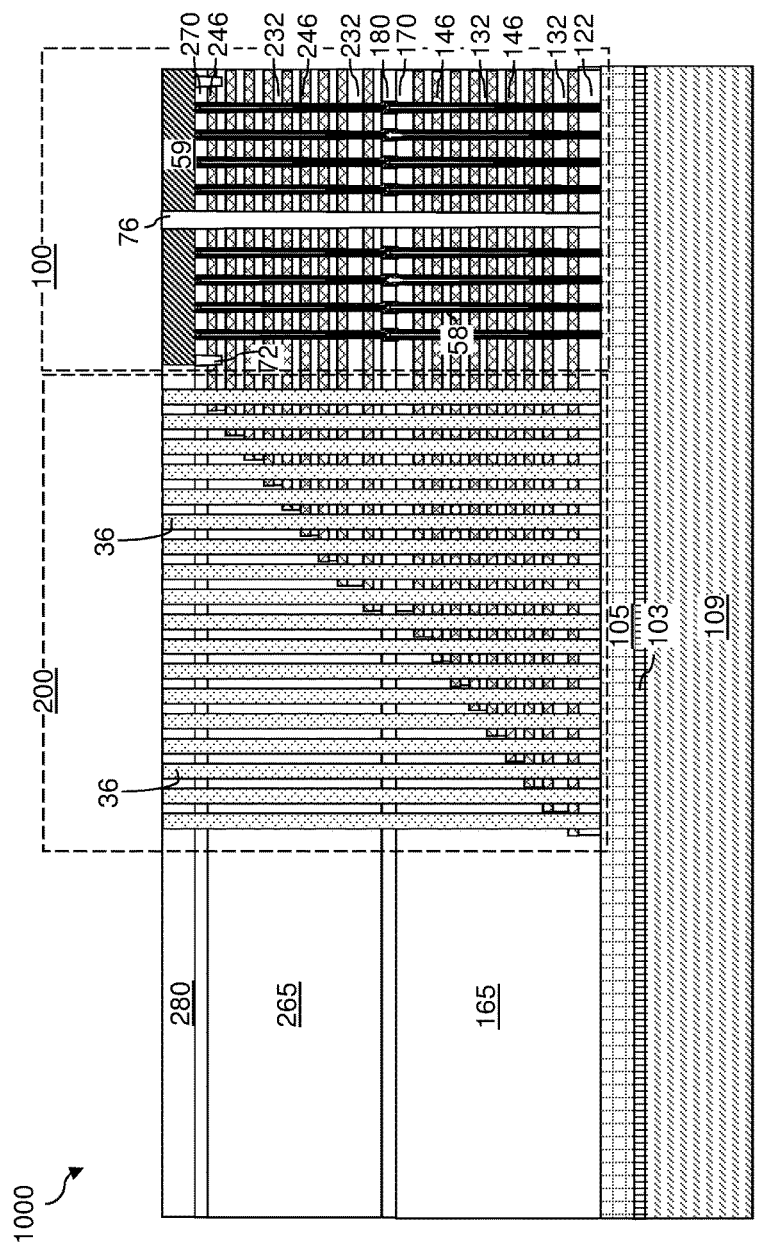
FIG. 17 is a vertical cross-sectional view of the exemplary structure after formation of insulating wall structures in the backside trenches according to an embodiment of the present disclosure.

Referring to FIG. 17, an insulating material can be deposited in the backside trenches 79 by a conformal deposition process. Excess portions of the insulating material deposited over the top surface of the source-level dielectric layer 280 can be removed by a planarization process such as a recess etch or a chemical mechanical planarization (CMP) process. Each remaining portion of the insulating material in the backside trenches 79 constitutes a dielectric wall structure 76. The dielectric wall structures 76 include an insulating material such as silicon oxide, silicon nitride, and/or a dielectric metal oxide. Each dielectric wall structure 76 can vertically extend through first alternating stacks (132, 146) of first insulating layers 132 and first electrically conductive layers 146 and second alternating stacks (232, 246) of second insulating layers 232 and second electrically conductive layers 246, and laterally extends along the first horizontal direction hd1 and are laterally spaced apart among one another along the second horizontal direction hd2 (e.g., bit line direction).

FIGS. 18A-18D illustrate sequential vertical cross-sectional views of via cavities during replacement of temporary fill material portions 16 with sacrificial column-shaped structures 857 according to an embodiment of the present disclosure. As used herein, a "column-shaped" element refers to an element that has a general shape of a Doric column, i.e., an element that has a shaft portion that extends with a straight sidewall or a tapered sidewall, a capital (i.e., cap) portion having a greater lateral dimension than the shaft portion and overlying the shaft portion, and a base portion having a greater lateral dimension than the shaft portion and underlying the shaft portion.

Figure 18A:
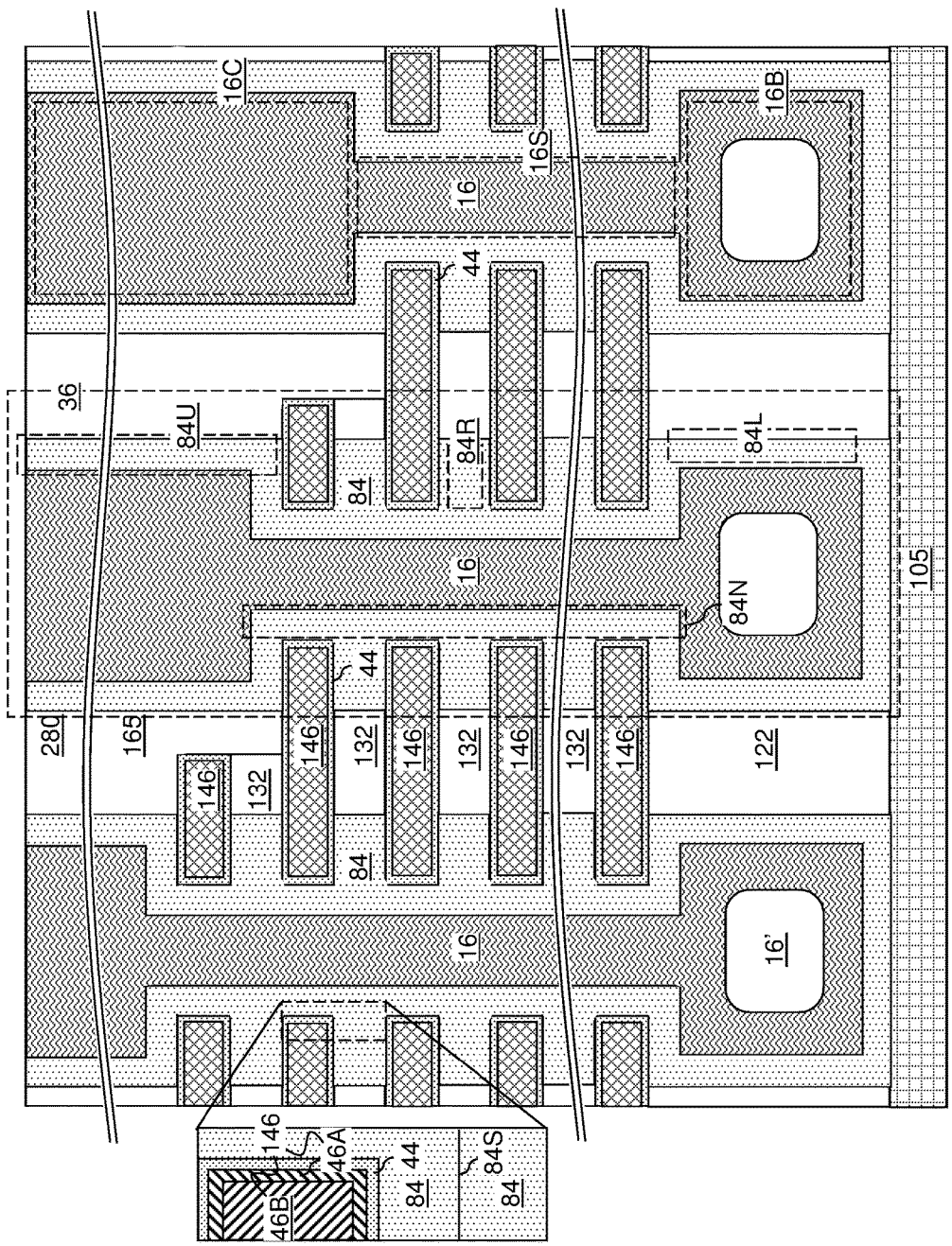

Referring to FIG. 18A, a region of the exemplary structure that includes temporary fill material portion 16 is illustrated. Each temporary fill material portion 16 is column-shaped, and includes a shaft portion 16S having a substantially uniform horizontal cross-sectional shape and extending through a subset of the electrically conductive layers (146, 246), a capital portion 16C that overlies the shaft portion 16S and having a greater horizontal cross-sectional area than the shaft portion 16S, and a base portion 16B that underlies the shaft portion 16S and having a greater horizontal cross-sectional area than the shaft portion 16S. In one embodiment, the material of the temporary fill material portions 16 can include amorphous silicon, polysilicon, a doped silicon-containing alloy material, or a doped silicate glass or an organosilicate glass having a greater etch rate than the silicon oxide materials of the first and second insulating layers (132, 232), the first and second insulating cap layers (170, 270), the material of the in-process ribbed insulating spacers 84.

Referring to FIG. 18B, the temporary fill material portions 16 can be removed selective to the in-process ribbed insulating spacers 84 (which are remaining portions of the conformal dielectric via liner 846L) by an isotropic etch process. For example, if the temporary fill material portions 16 include a semiconductor material such as amorphous silicon, a wet etch process employing hot trimethyl-2 hydroxyethyl ammonium hydroxide ("hot TMY") or tetramethyl ammonium hydroxide (TMAH) can be employed to remove the temporary fill material portions 16. Optionally, a patterned masking layer (such as a patterned photoresist layer) may be employed to cover and protect the source line 59 during the isotropic etch process. Alternatively, if the temporary fill material portions 16 include porous or non-porous organosilicate glass or borosilicate glass, a wet etch process employing dilute hydrofluoric acid may be employed to remove the temporary fill material portions 16.

Figure 18C:
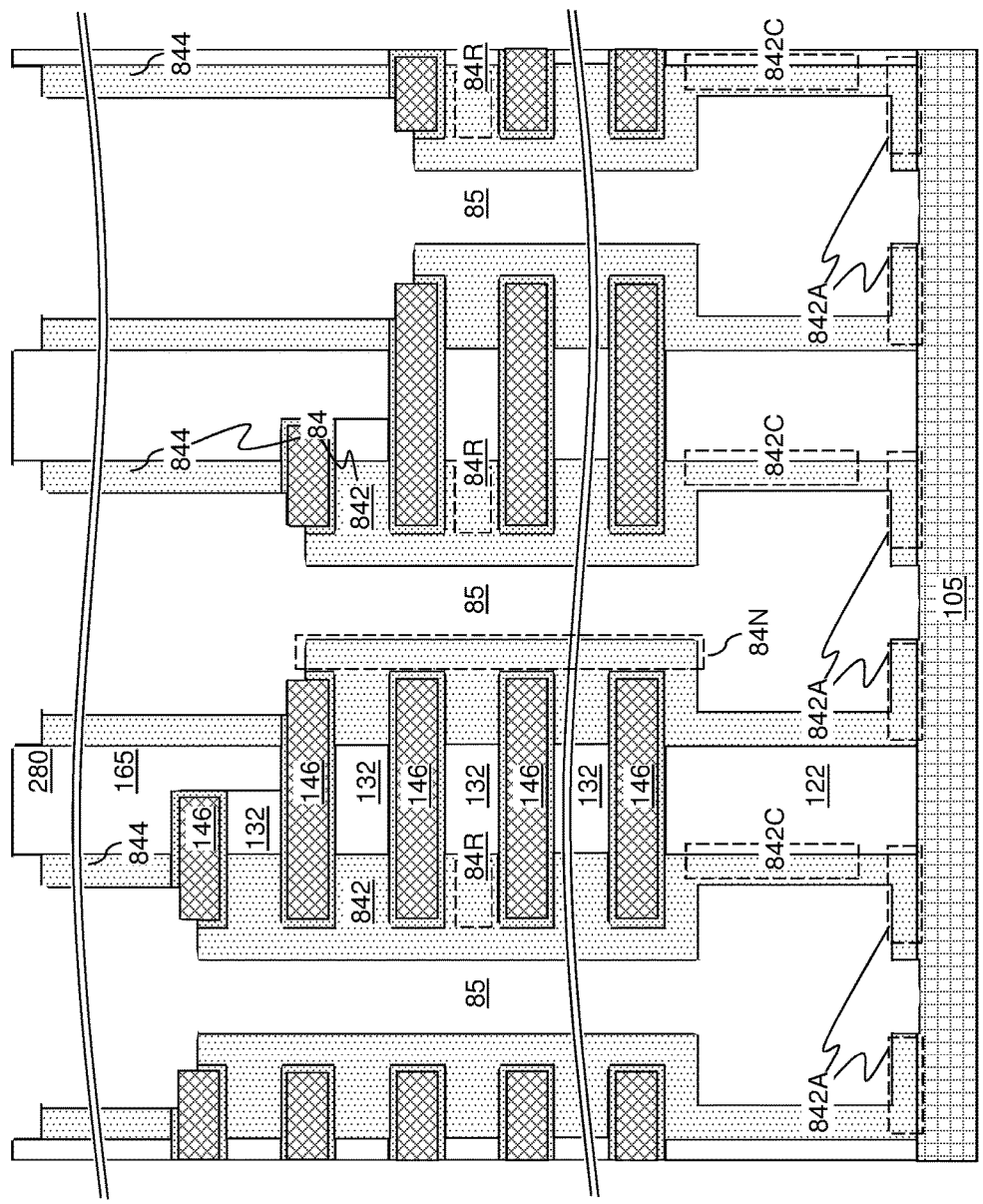

Referring to FIG. 18C, an anisotropic etch process (such as a reactive ion etch process) can be performed to etch unmasked portions of the in-process ribbed insulating spacers 84. An annular top portion of each upper cylindrical portion 84U, an annular top portion of each neck portion 84N, and a center portion of each bottommost portion of the in-process ribbed insulating spacers 84 contacting the etch stop layer 105 can be removed by the anisotropic etch process. Each in-process ribbed insulating spacer 84 is divided into two discrete material portions that do not contact each other. The divided discrete material portions of each in-process ribbed insulating spacer 84 include a cylindrical insulating spacer 844 that includes a remaining portion of an upper cylindrical portion 84U of a respective in-process ribbed insulating spacer 84, and a ribbed insulating spacer 842 that includes remaining portions of a neck portion 84N, one or more dielectric liner rib portions 84R attached to an outer periphery of the neck portion 84N, a lower cylindrical portion 842C that extends through the drain-level insulating layer 122, and an annular portion 842A that is a remaining portion of a bottom portion 84B of the in-process ribbed insulating spacer 84. The ribbed insulating spacers 842 and the cylindrical insulating spacers 844 are collectively referred to as contact via insulating spacers 84.

The top surface of the topmost electrically conductive layer (146 or 246) within the subset of layers (132, 146, 232, 246) through which teach ribbed insulating spacer 842 vertically extends is physically exposed after the anisotropic etch process. Further, top surfaces of the ribbed insulating spacers 842 may be vertically recessed such that an upper portion of a cylindrical sidewall of the topmost electrically conductive layer (146 or 246) within the subset of layers (132, 146, 232, 246) is physically exposed above each ribbed insulating spacer 842. A column-shaped cavity 85 is formed within each volume that is laterally surrounded by a ribbed insulating spacer 842 and a cylindrical insulating spacer 844.

Figure 18D:
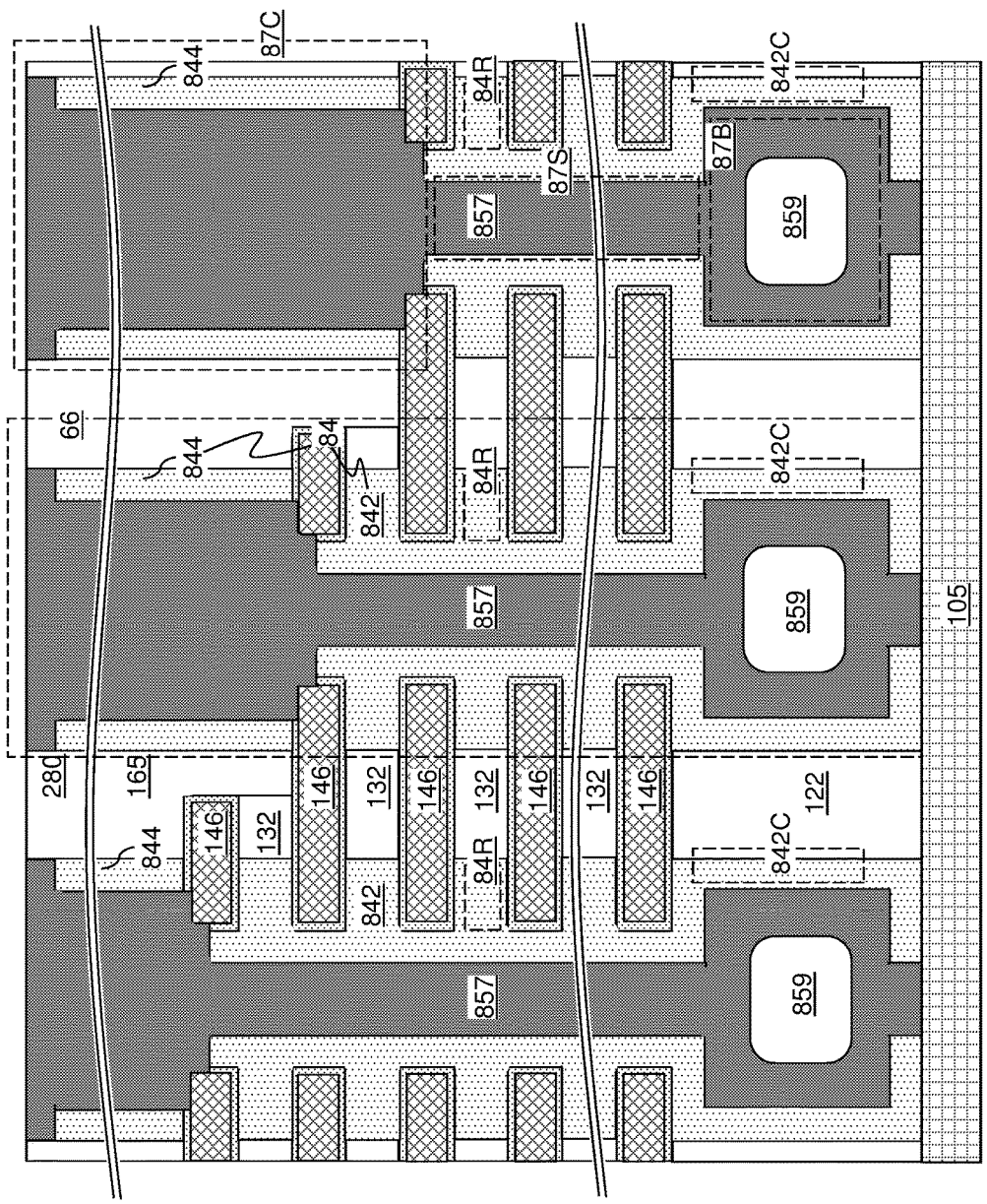

Referring to FIG. 18D, a sacrificial fill material is deposited in the column-shaped cavities 85 by a conformal or non-conformal deposition process. The sacrificial fill material is a material that can be removed selective to the material of the ribbed insulating spacers 842 and the cylindrical insulating spacers 844 and selective to the materials of the electrically conductive layers (146, 246). For example, the sacrificial fill material can include a dielectric material such as silicon nitride, a semiconductor material such as a silicon-germanium alloy, or amorphous carbon or diamond-like carbon (DLC). Excess portions of the sacrificial fill material can be removed from above the horizontal plane including the top surface of the source-level dielectric layer 280 by a planarization process. The planarization process can employ a recess etch and/or chemical mechanical planarization (CMP).

Each remaining portion of the sacrificial fill material constitutes a sacrificial column-shaped structure 857. The sacrificial column-shaped structures 857 are formed in volumes from which the temporary fill material portions 16 are removed. Each sacrificial column-shaped structure 857 includes a shaft portion 87S having a substantially uniform horizontal cross-sectional shape, a capital portion 87C that overlies the shaft portion 87S and has a greater horizontal cross-sectional area than the shaft portion 87S, and a base portion 87B that underlies the shaft portion 87S and has a greater horizontal cross-sectional area than the shaft portion 87S. Each base portion 87B may include an unfilled void 859 therein. Each sacrificial column-shaped structure 857 extends through a subset of layers of the alternating stacks (132, 146, 232, 246) and the retro-stepped dielectric material portions (165, 265). Each sacrificial column-shaped structure 857 contacts a top surface of a topmost electrically conductive layer (146 or 246) within the subset of layers of the alternating stacks (132, 146, 232, 246). In case the subset of layers of the alternating stacks (132, 146, 232, 246) includes multiple electrically conductive layers (146 and/or 246), the sacrificial column-shaped structure 857 vertically extends through each of the multiple electrically conductive layers (146 and/or 246). Each contiguous set of a sacrificial column-shaped structure 857, a ribbed insulating spacer 842, and a cylindrical insulating spacer 844 is herein referred to as a sacrificial via fill structure 66.

Figure 19:
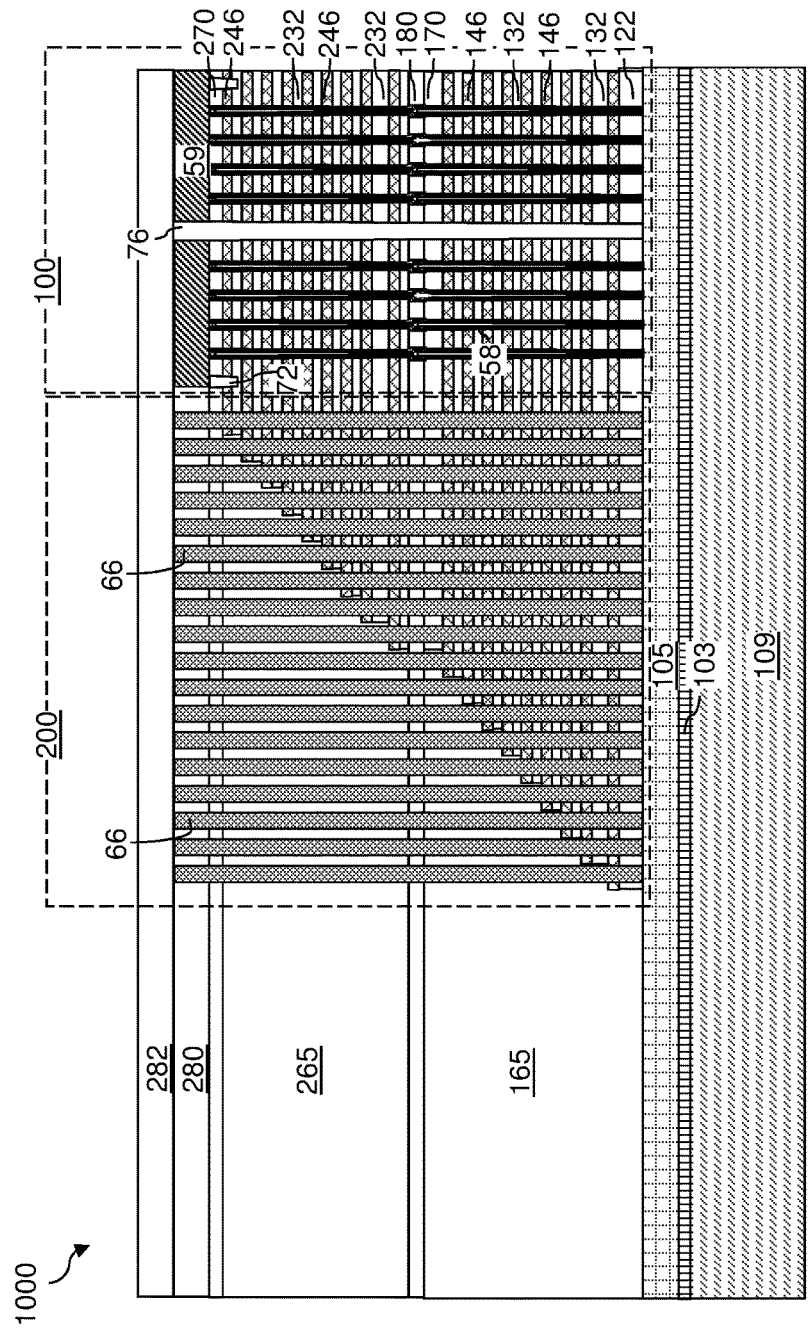
FIG. 19 is a vertical cross-sectional view of the exemplary structure after formation of a bonding dielectric material layer according to an embodiment of the present disclosure.

Referring to FIG. 19, a first-assembly bonding dielectric layer 282 can be deposited on the source-level dielectric layer 280. The first-assembly bonding dielectric layer 282 can include a dielectric material that can bond with another dielectric material under suitable conditions such as an elevated temperature and application of pressure. For example, the first-assembly bonding dielectric layer 282 can include silicon oxide. The first-assembly bonding dielectric layer 282 can be formed by chemical vapor deposition. The thickness of the first-assembly bonding dielectric layer 282 can be in a range from 30 nm to 600 nm, such as from 60 nm to 300 nm, although lesser and greater thicknesses can also be employed. An additional CMP step can optionally be performed.

Figure 20:
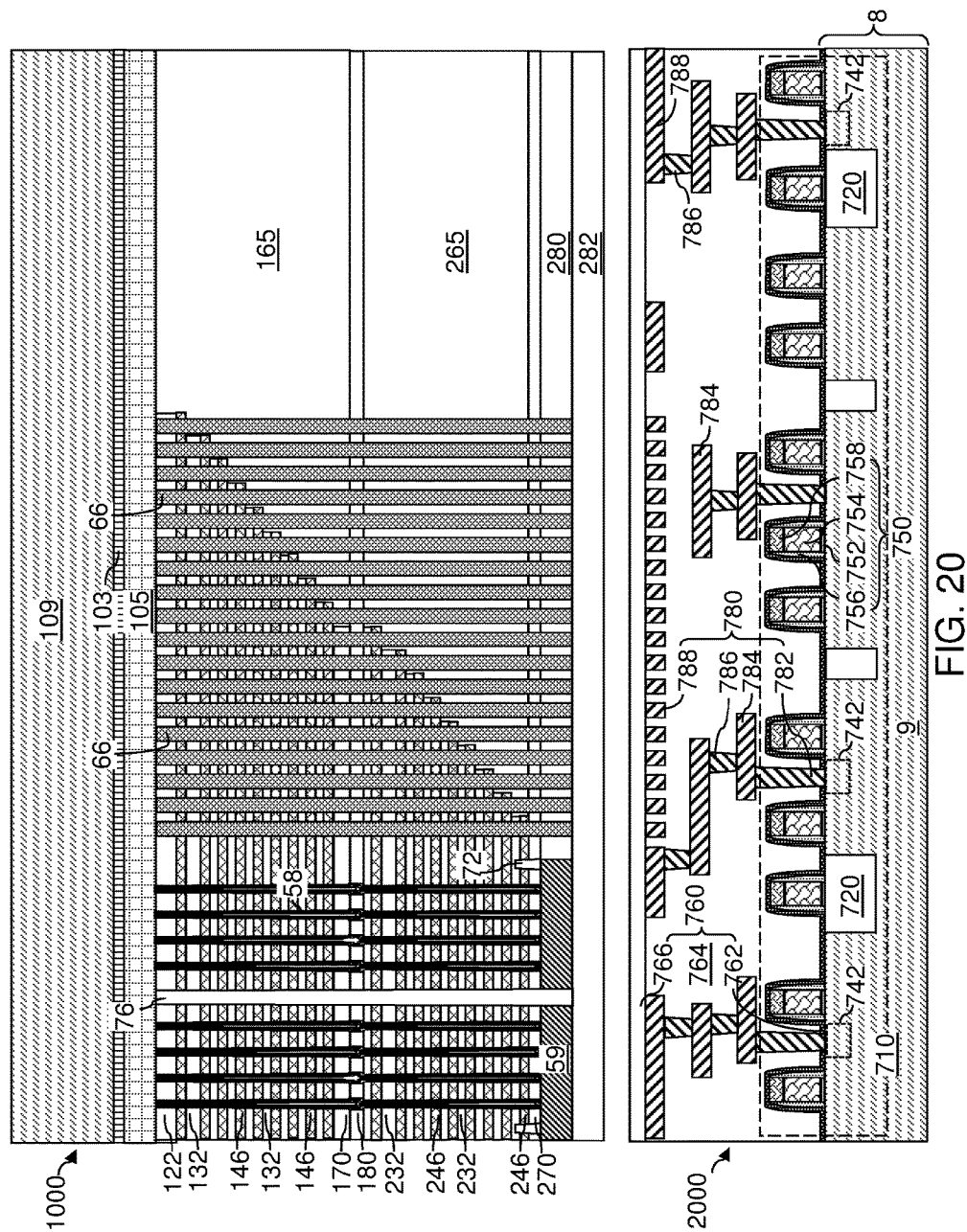
FIG. 20 is a vertical cross-sectional view of the exemplary structure after providing an assembly of a semiconductor substrate, field effect transistors, and first metal interconnect structures according to an embodiment of the present disclosure.

Referring to FIG. 20, a second assembly 2000 of a semiconductor substrate 8, semiconductor devices 710 including field effect transistors, and first metal interconnect structures 780 is provided. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746 and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices 710 can include any semiconductor circuitry to support operation of memory devices to be subsequently connected, and is typically referred to as a driver circuitry or a peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which is herein referred to as first dielectric layers 760. The first dielectric layers 760 constitute a dielectric layer stack in which each lower level dielectric layer 760 overlies or underlies other first dielectric layers 760. The first dielectric layers 760 can include, for example, a dielectric liner 762 such as a silicon nitride liner that blocks diffusion of mobile ions and/or apply appropriate stress to underlying structures, at least one first dielectric material layer 764 that overlies the dielectric liner 762, a silicon nitride layer (e.g., hydrogen diffusion barrier), and a second-assembly bonding dielectric layer 766.

The at least one first dielectric material layer 764 functions as a matrix for first metal interconnect structures 780 that provide electrical wiring among the various nodes of the semiconductor devices and landing pads for through-stack contact via structures to be subsequently formed. The first metal interconnect structures 780 are embedded within the at least one first dielectric material layer 764. The at least one first dielectric material layer 764 may be a plurality of dielectric material layers in which various elements of the first metal interconnect structures 780 are sequentially embedded. Each dielectric material layer among the at least one first dielectric material layer 764 may include any of doped silicate glass, undoped silicate glass, organosilicate glass, silicon nitride, silicon oxynitride, and dielectric metal oxides (such as aluminum oxide). In one embodiment, the at least one first dielectric material layer 764 can comprise, or consist essentially of, dielectric material layers having dielectric constants that do not exceed the dielectric constant of undoped silicate glass (silicon oxide) of 3.9.

The first metal interconnect structures 780 can include various device contact via structures 782 (e.g., source and drain electrodes which contact the respective source and drain nodes of the device or gate electrode contacts), intermediate lower metal line structures 784, lower metal via structures 786, and topmost lower metal line structures 788 that are configured to function as landing pads for through-stack contact via structures to be subsequently formed. In this case, the at least one first dielectric material layer 764 may be a plurality of dielectric material layers that are formed level by level while incorporating components of the first metal interconnect structures 780 within each respective level. For example, single damascene processes may be employed to form the first metal interconnect structures 780, and each level of the lower metal via structures 786 may be embedded within a respective via level dielectric material layer and each level of the lower level metal line structures (784, 788) may be embedded within a respective line level dielectric material layer. Alternatively, a dual damascene process may be employed to form integrated line and via structures, each of which includes a lower metal line structure and at least one lower metal via structure.

The topmost lower metal line structures 788 can be formed within a topmost dielectric material layer of the at least one first dielectric material layer 764 (which can be a plurality of dielectric material layers). Each of the first metal interconnect structures 780 can include a metallic nitride liner and a metal fill portion. Each metallic nitride liner can include a conductive metallic nitride material such as TiN, TaN, and/or WN. Each metal fill portion can include an elemental metal (such as Cu, W, Al, Co, Ru) or an intermetallic alloy of at least two metals. Top surfaces of the topmost lower metal line structures 788 and the topmost surface of the at least one first dielectric material layer 764 may be planarized by a planarization process, such as chemical mechanical planarization. In this case, the top surfaces of the topmost lower metal line structures 788 and the topmost surface of the at least one first dielectric material layer 764 may be within a horizontal plane that is parallel to the top surface of the substrate 8.

The second-assembly bonding dielectric layer 766 can be formed directly on the top surfaces of the topmost lower metal line structures 788 and the topmost surface of the at least one first dielectric material layer 764. The second-assembly bonding dielectric layer 766 can include a dielectric material that can bond with another dielectric material under suitable conditions such as an elevated temperature and application of pressure. For example, the second-assembly bonding dielectric layer 766 can include silicon oxide. The second-assembly bonding dielectric layer 766 can be formed by chemical vapor deposition. The thickness of the second-assembly bonding dielectric layer 766 can be in a range from 30 nm to 600 nm, such as from 60 nm to 300 nm, although lesser and greater thicknesses can also be employed.

The pattern of the topmost lower metal line structures 788 in the second assembly 2000 can include the areas of a mirror-image pattern of the sacrificial via fill structures 66 within the first assembly 1000. In other words, the areas of the pattern of the topmost lower metal line structures 788 in a top-down view of the second assembly 2000 (in a position in which the second-assembly bonding dielectric layer 766 overlies the semiconductor substrate 8) includes the mirror image of the pattern of the areas of the sacrificial via fill structures 66 in a top-down view (in a position in which the first-assembly bonding dielectric layer 282 overlies the carrier substrate 109). The first assembly 1000 and the second assembly 2000 can be brought into proximity of each other such that the first-assembly bonding dielectric layer 282 faces the second-assembly bonding dielectric layer 766. Further, the first assembly 1000 and the second assembly 2000 can be aligned to each other such that the topmost lower metal line structures 788 faces a respective one of the sacrificial via fill structures 66.

Figure 21:
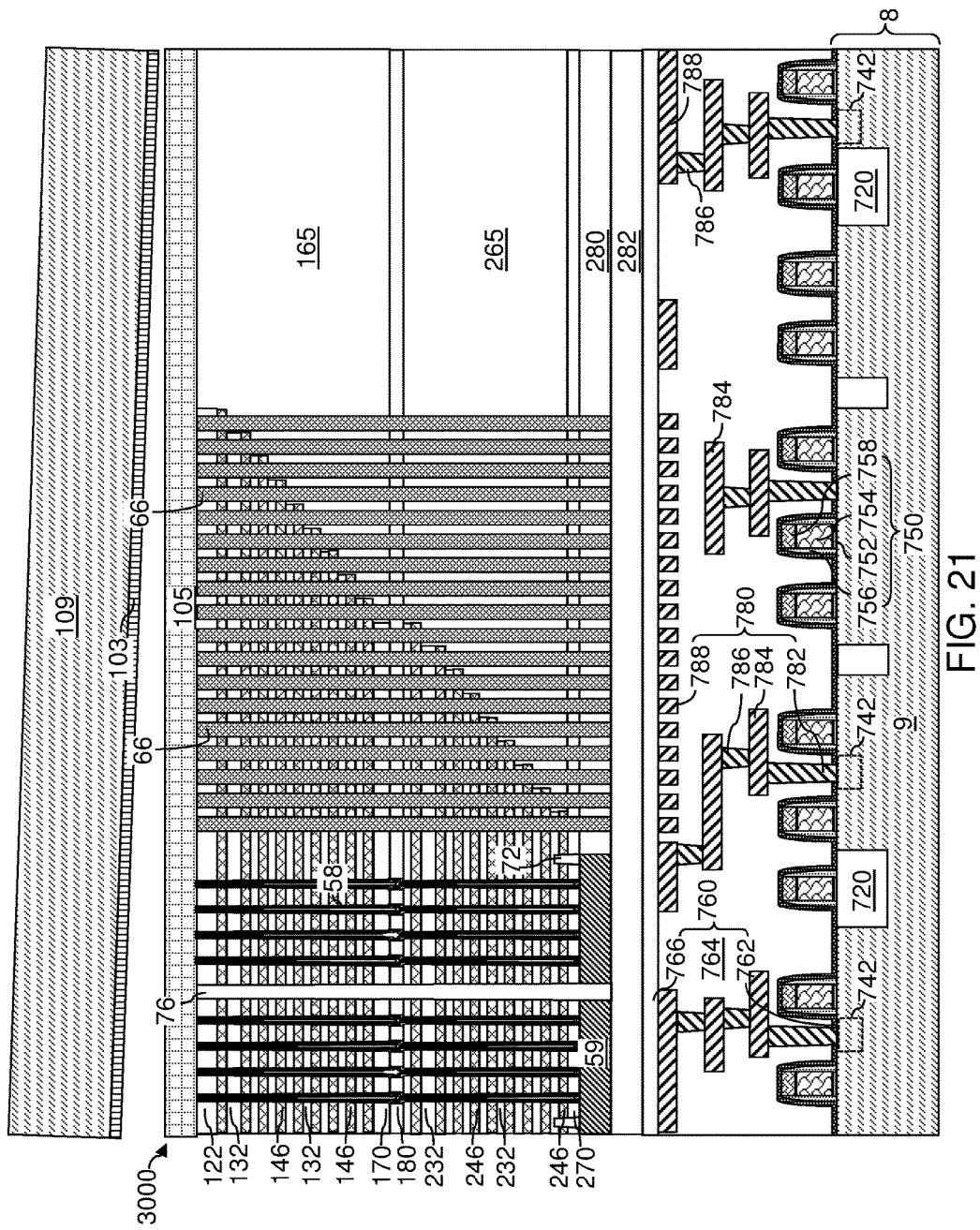
FIG. 21 is a vertical cross-sectional view of the exemplary structure during separation of the carrier substrate.

Referring to FIG. 21, the first-assembly bonding dielectric layer 282 and the second-assembly bonding dielectric layer 766 are brought into physical contact with each other, and are bonded to each other. For example, an anneal process may be performed at an elevated temperature to induce interdiffusion of silicon oxide across the interface between the first-assembly bonding dielectric layer 282 and the second-assembly bonding dielectric layer 766. The temperature and duration of the anneal process can be selected to provide sufficient bonding strength across the first-assembly bonding dielectric layer 282 and the second-assembly bonding dielectric layer 766. The first assembly 1000 may be upside down upon bonding with the second assembly 2000 or vice-versa. In other words, the top side of the first assembly 1000 (i.e., the side facing away from the carrier substrate 109 which forms a bottom surface of the first assembly) is bonded to the top side of the second assembly 2000 (i.e., the side facing away from the semiconductor substrate 8 which forms a bottom surface of the second assembly).

The first retro-stepped dielectric material portion 165 is now in a flipped position, and has a lateral extent that decreases with a vertical distance from the semiconductor substrate 8. In view of the absence of a retro-stepped vertical cross-sectional profile, the first retro-stepped dielectric material portion 165 is herein referred to as a first stepped dielectric material portion 165. Likewise, the second retro-stepped dielectric material portion 265 is herein referred to as a second stepped dielectric material portion 265.

Figure 22:
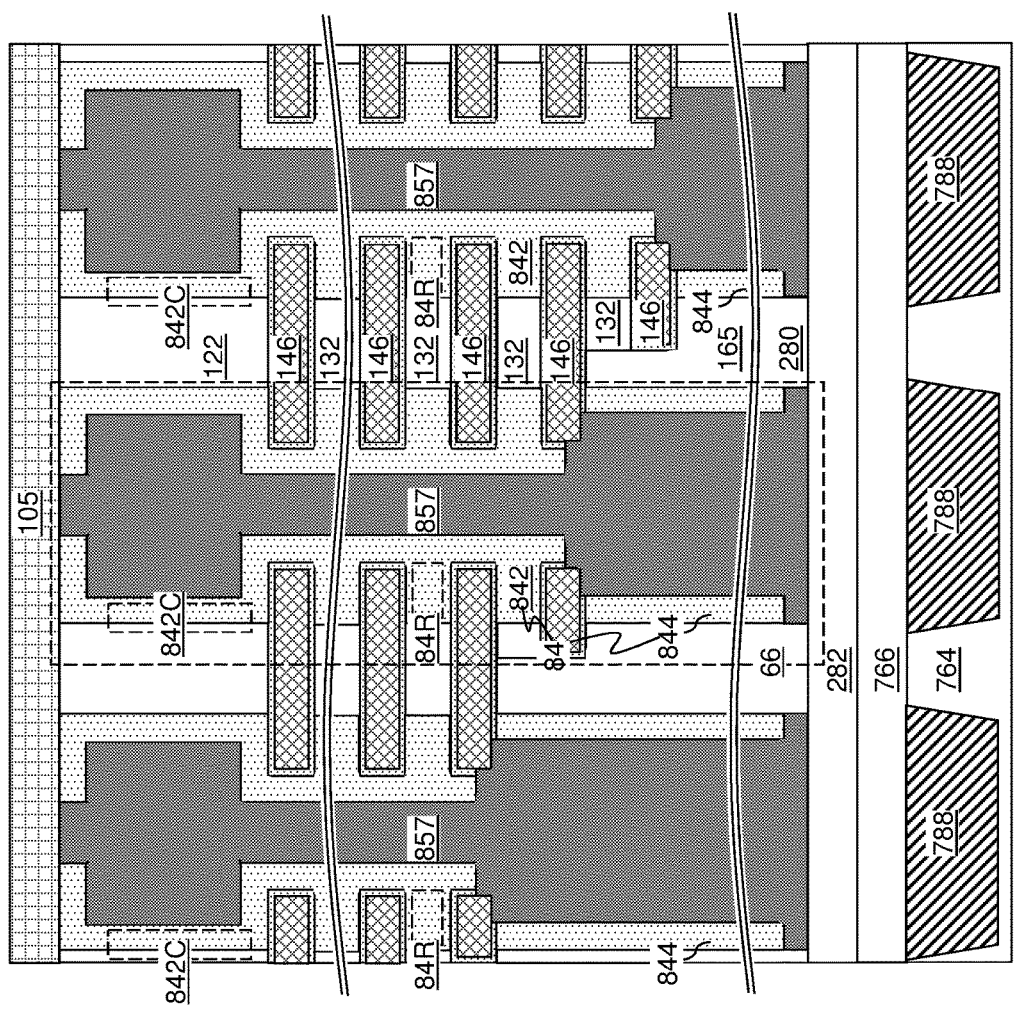
FIG. 22 is a vertical cross-sectional view of a region including sacrificial column-shaped structures after separation of the carrier substrate according to an embodiment of the present disclosure

The carrier substrate 109 can be detached from the etch stop layer 105, for example, by inducing separation at the sacrificial separation layer 103. For example, if the sacrificial separation layer 103 is an adhesion material layer, the carrier substrate 109 may be pulled apart from the etch stop layer 105 and underlying structures. If the sacrificial separation layer 103 includes a material (such as borosilicate glass or organosilicate glass) that can be etched selectively to the carrier substrate 109 and the etch stop layer 105, the sacrificial separation layer 103 can be removed by an isotropic etch process (such as a wet etch process). If the sacrificial separation layer 103 includes a hydrogen implantation layer, the carrier substrate 109 can be cleaved from the etch stop layer 105 by formation of bubbles at an elevated temperature followed by application of force to cleave the carrier substrate 109 from the etch stop layer 105. Alternatively, the carrier substrate 109 can be removed by grinding away the carrier substrate 109 and stopping on the etch stop layer 105. In this embodiment, the sacrificial separation layer 103 can be omitted. If any residual portion of the sacrificial separation layer 103 remains on the top surface of the etch stop layer 105, such a residual portion may be removed by a suitable clean process, an etch process, or chemical mechanical planarization. FIG. 22 illustrates a region of the bonded structure that includes the sacrificial via fill structures 66.

Figure 23A:
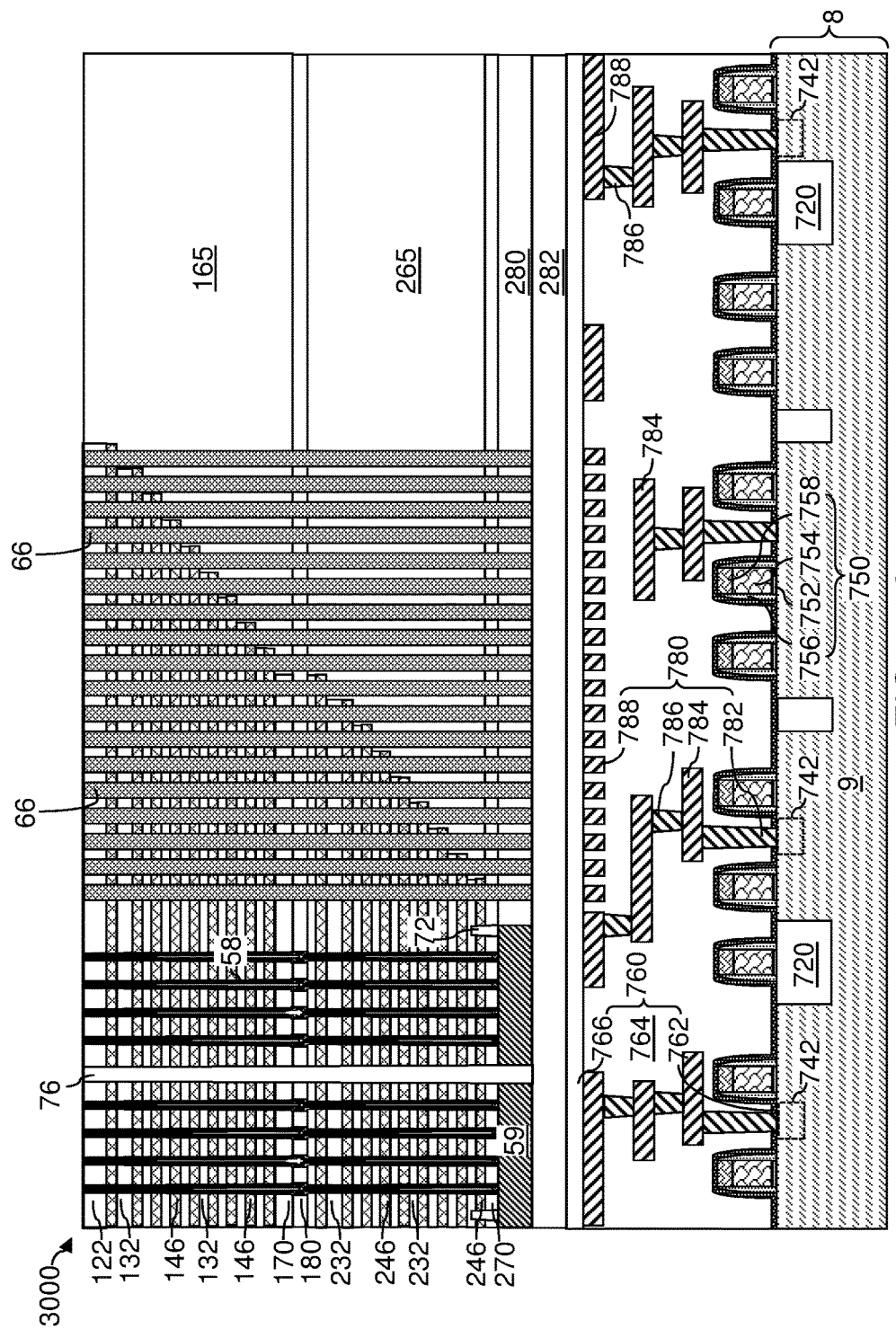
FIG. 23A is a vertical cross-sectional view of the exemplary structure after removal of the etch stop layer according to an embodiment of the present disclosure.
Figure 23B:
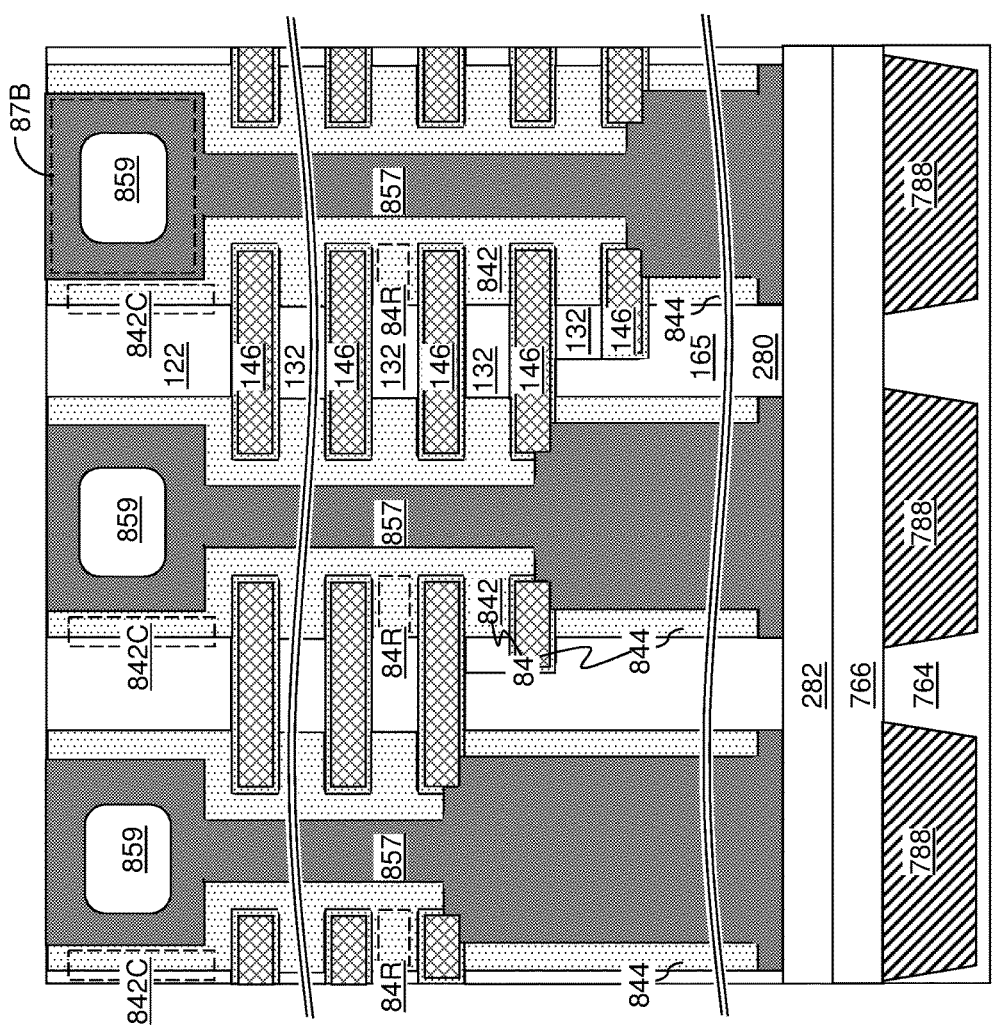
FIG. 23B is a vertical cross-sectional view of a region including sacrificial column-shaped structures at the processing steps of FIG. 23A.

Referring to FIGS. 23A-23C, the etch stop layer 105 and a top portion of the drain-level insulating layer 122 can be subsequently removed by a planarization process. The planarization process can employ chemical mechanical planarization (CMP) and/or a recess etch process. The entirety of the etch stop layer 105 can be removed. Further, topmost portions of the memory stack structures 55 and the topmost portions of the sacrificial via fill structures 66 can be removed during removal of the top portion of the drain-level insulating layer 122. Specifically, horizontal portions of the memory films 50 and the vertical semiconductor channels 60 can be removed during the planarization process such that horizontal surfaces of the dielectric cores 62 are physically exposed after the planarization process. Further, annular portions 842A of the ribbed insulating spacers 842 can be removed so that annular surfaces of the lower cylindrical portion 842C of the ribbed insulating spacers 842 are physically exposed. Horizontal surfaces of the base portions 87B of the sacrificial column-shaped structures 857 are also physically exposed.

Referring to FIG. 24, the dielectric cores 62 can be vertically recessed selective to the drain-level insulating layer 122. In one embodiment, the dielectric cores 62 can include a silicon oxide-based material having a higher etch rate than the drain-level insulating layer 122 in dilute hydrofluoric acid. For example, the dielectric cores 62 can include a dielectric material such as a doped silicate glass, low temperature TEOS oxide, or organosilicate glass, and the drain-level insulating layer 122 can include densified undoped silicate glass. The top surfaces of the dielectric cores 62 can be between a horizontal plane including the top surface of the drain-level insulating layer 122 and a horizontal plane including the bottom surface of the drain-level insulating layer 122. Recessed cavities are formed above the dielectric cores 62.

Figure 25:
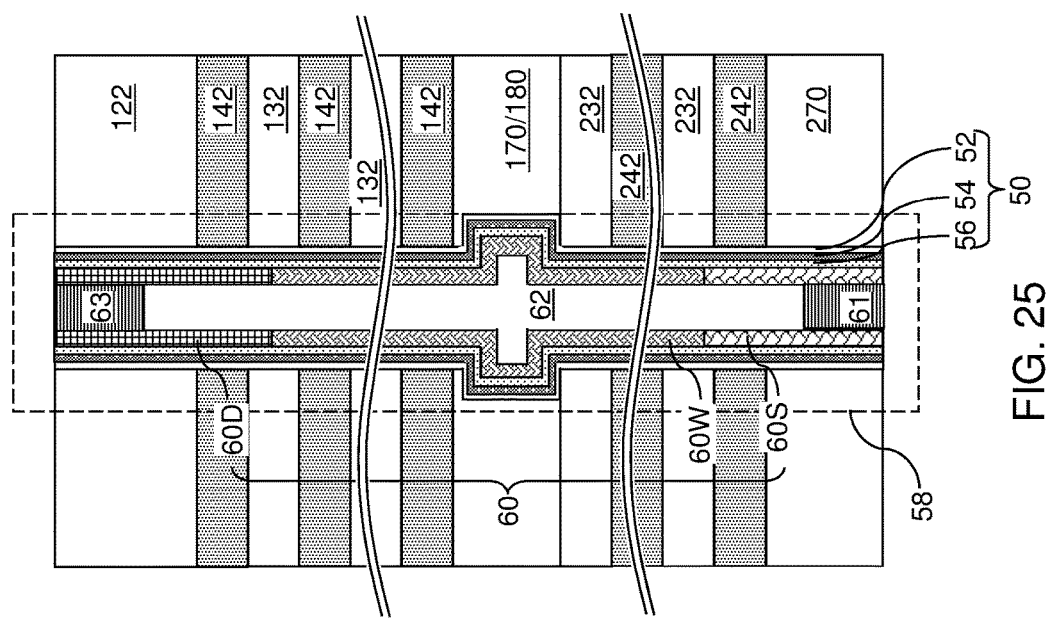
FIG. 25 is a vertical cross-sectional view of a region including a memory opening fill structure after formation of a drain-select-level channel portion and a source region according to an embodiment of the present disclosure.

Referring to FIG. 25, electrical dopants of the first conductivity type or the second conductivity type (which is the opposite of the first conductivity type) can be optionally implanted into portions of the vertical semiconductor channel 60 that are proximal to the recessed cavities by a second ion implantation process. An upper region of each word-line-level channel portion 60W is implanted with the electrical dopants, and is converted into a drain-select-level channel portion 60D. The drain-select-level channel portions 60D have a different net doping than the word-line-level channel portions 60W. The energy of the ion implantation process can be selected such that the implanted electrical dopants are implanted down to the most distal drain select level, which is the level of the most distal second sacrificial material layer 242 from the drain-level insulating layer that is subsequently replaced with a drain select gate electrode.

The doping of the drain-select-level channel portions 60D determine the threshold voltage for turning on vertical field effect transistors at the drain select levels. The drain-select-level channel portions 60D can have a net doping of the first conductivity type at a net dopant concentration in a range from $1.0 \times 10^{14}/cm^3$ to $1.0 \times 10^{18}/cm^3$, such as from $1.0 \times 10^{15}/cm^3$ to $3.0 \times 10^{17}/cm^3$, although lesser and greater atomic concentrations can also be employed. Each vertical semiconductor channel 60 can include a word-line-level channel portion 60W, a drain-select-level channel portion 60D overlying the word-line-level channel portion 60W, and a source-select-level channel portion 60S underlying the word-line-level channel portion 60W. The drain-select-level channel portions 60D are formed at end regions of the vertical semiconductor channels 60 that are distal from the semiconductor substrate 8 by performing a second ion implantation process after bonding the first assembly 1000 with the second assembly 2000.

A doped semiconductor material having a doping of the second conductivity type can be deposited into cavities overlying the dielectric cores 62. Excess portions of the deposited doped semiconductor material of the second conductivity type that overlie the horizontal plane including the top surface of the drain-level insulating layer 122 can be removed by a planarization process such as a chemical mechanical planarization (CMP) process. Each remaining portion of the doped semiconductor material having a doping of the second conductivity type constitutes a drain region 63. The drain regions 63 can have a doping of the second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. The drain regions 63 are formed at end regions of the memory stack structures 55 that are distal from the semiconductor substrate 8 after bonding the first assembly 1000 with the second assembly 2000.

Figure 26A:
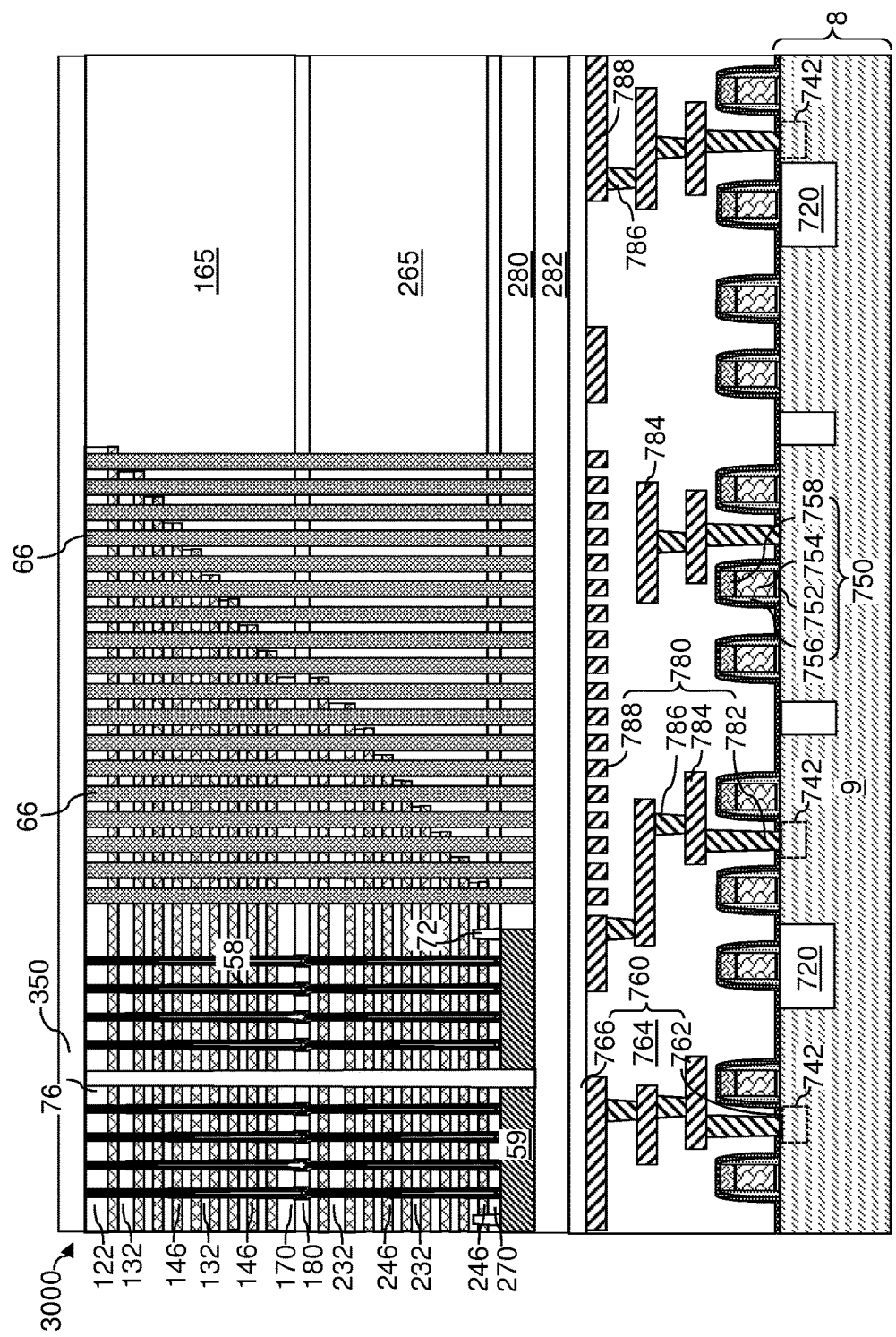
FIG. 26A is a vertical cross-sectional view of the exemplary structure after formation of a cover dielectric layer according to an embodiment of the present disclosure.
Figure 26B:
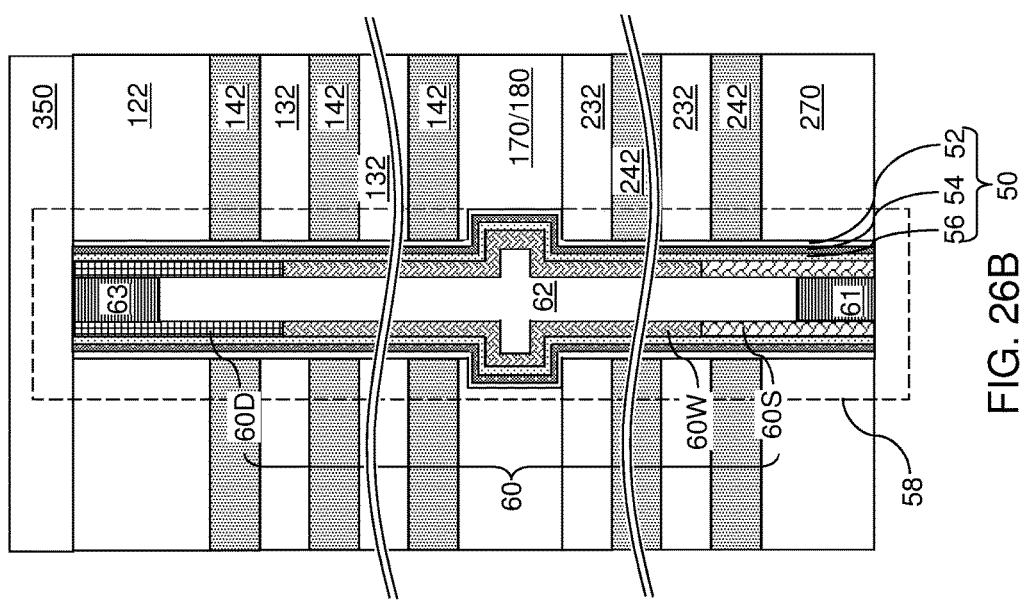
FIG. 26B is a vertical cross-sectional view of a region including a memory opening fill structure at the processing steps of FIG. 26A.

Referring to FIGS. 26A and 26B, a cover dielectric layer 350 can be formed over the drain-level insulating layer 122. The cover dielectric layer 350 includes a dielectric material that is resistant to an etchant to be employed to subsequently remove the sacrificial column-shaped structures 857 in the via cavities. For example, if the sacrificial column-shaped structures 857 include silicon nitride, the cover dielectric layer 350 can include silicon oxide. The cover dielectric layer 350 can be deposited by a conformal deposition process or a non-conformal deposition process. The thickness of the cover dielectric layer 350 can be in a range from 10 nm to 300 nm, such as from 30 nm to 100 nm, although lesser and greater thicknesses can also be employed.

Figure 27A:
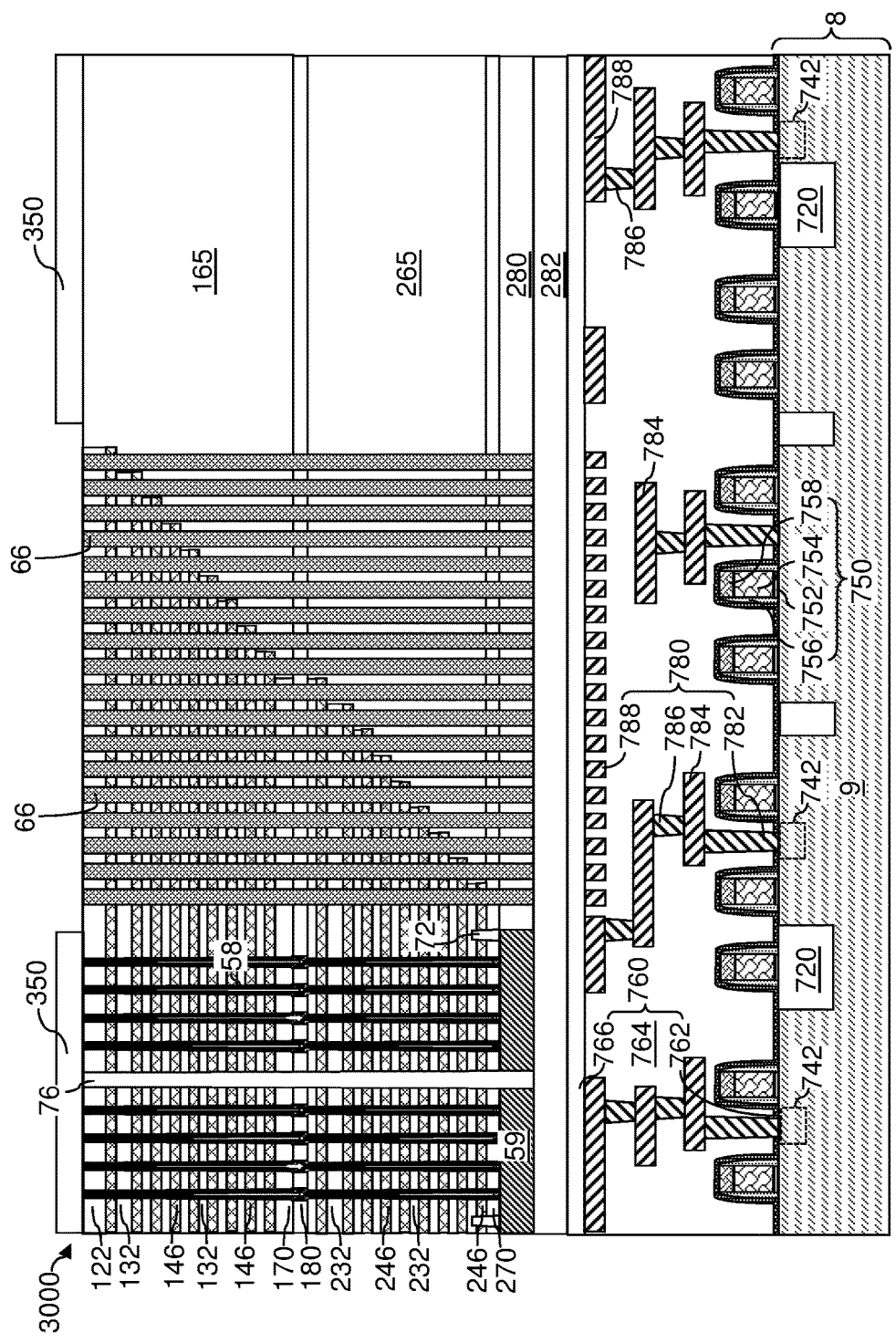
FIG. 27A is a vertical cross-sectional view of the exemplary structure patterning the cover dielectric layer according to an embodiment of the present disclosure.
Figure 27B:
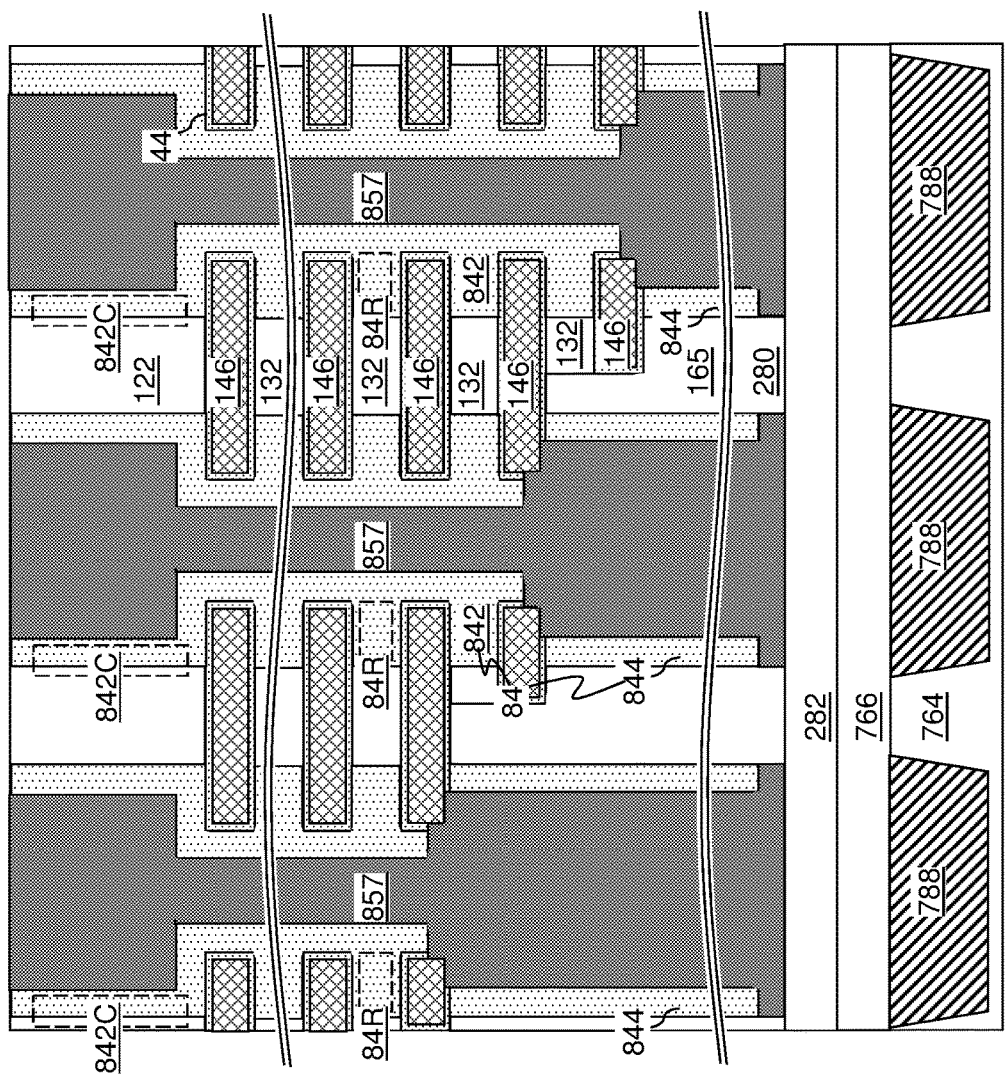
FIG. 27B is a vertical cross-sectional view of a region including sacrificial column-shaped structures at the processing steps of FIG. 27A.
Figure 27C:
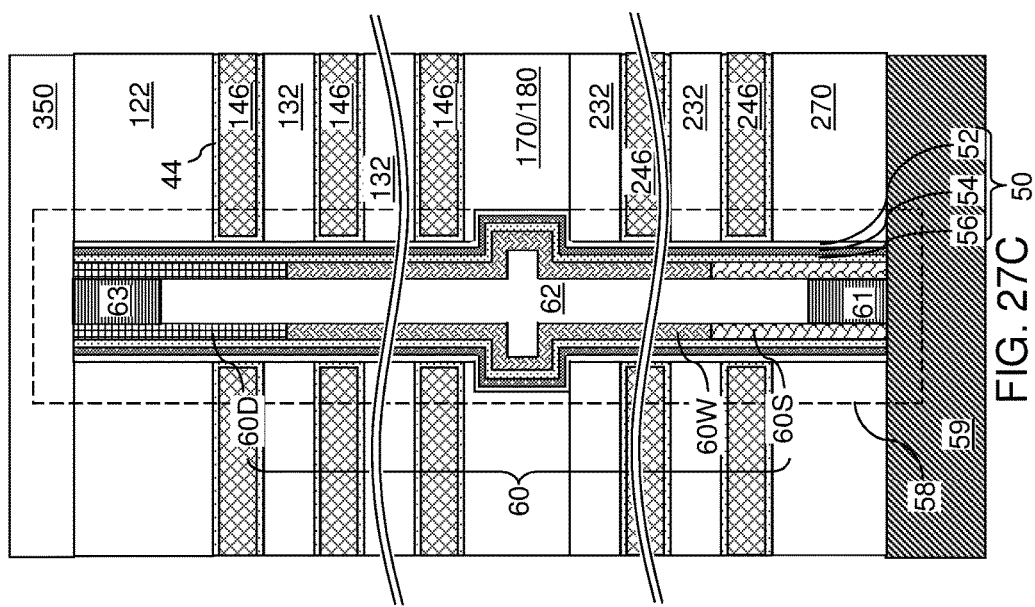
FIG. 27C is a vertical cross-sectional view of a region including a memory opening fill structure at the processing steps of FIGS. 27A and 27B.

Referring to FIGS. 27A-27C, the cover dielectric layer 350 can be patterned to form an opening within a region overlying the sacrificial column-shaped structures 857. For example, a photoresist layer (not shown) can be applied over the cover dielectric layer 350, and can be lithographically patterned to form an opening in an area overlying the sacrificial column-shaped structures 857. An etch process is performed to remove unmasked portions of the cover dielectric layer 350 employing the patterned photoresist layer as an etch mask. For example, an isotropic etch process such as a wet etch process employing hydrofluoric acid can be employed to form an opening through the cover dielectric layer 350. The photoresist layer is subsequently removed, for example, by ashing.

Figure 28:
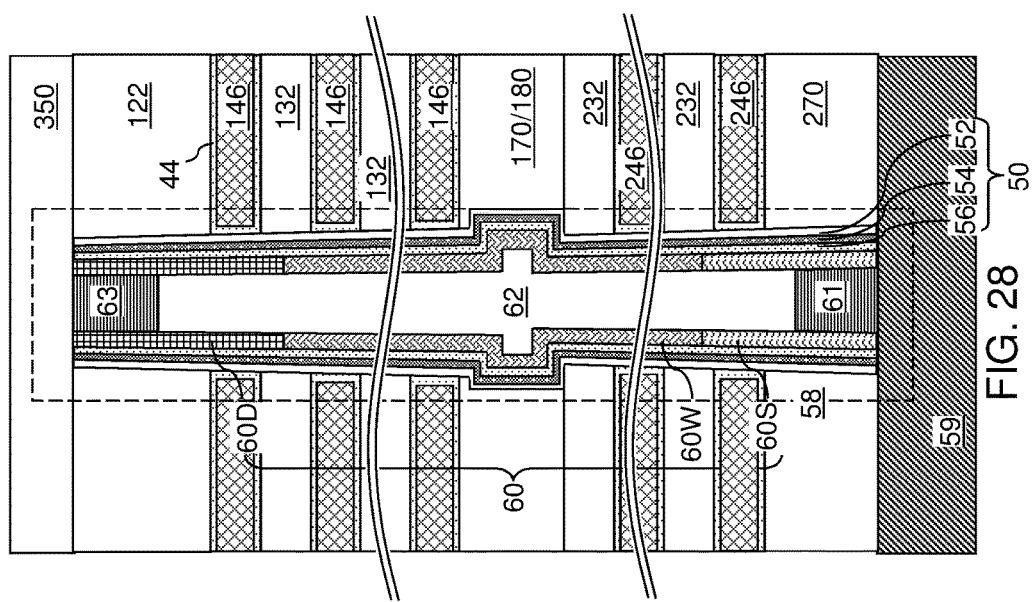
FIG. 28 is a vertical cross-sectional view of a region including a memory opening fill structure of an alternative configuration of the exemplary structure at the processing steps of FIGS. 27A-27C.

FIG. 28 is a vertical cross-sectional view of a region including a memory opening fill structure of an alternative configuration of the exemplary structure at the processing steps of FIGS. 27A-27C. In the alternative configurations, the sidewalls of each memory stack structure 55 can be formed with a non-zero taper angle with respective a vertical direction (that is perpendicular to the interface between the source line 59 and the source-level insulating layer 270). In this configuration, the source regions 61 and the drain regions 63 can have tapered sidewalls. The non-zero taper angle of the sidewalls of the memory stack structures 55 may be in a range from 0.1 degree to 5 degrees, such as from 0.5 degrees to 3 degrees, although lesser and greater taper angles can also be employed.

Figure 29:
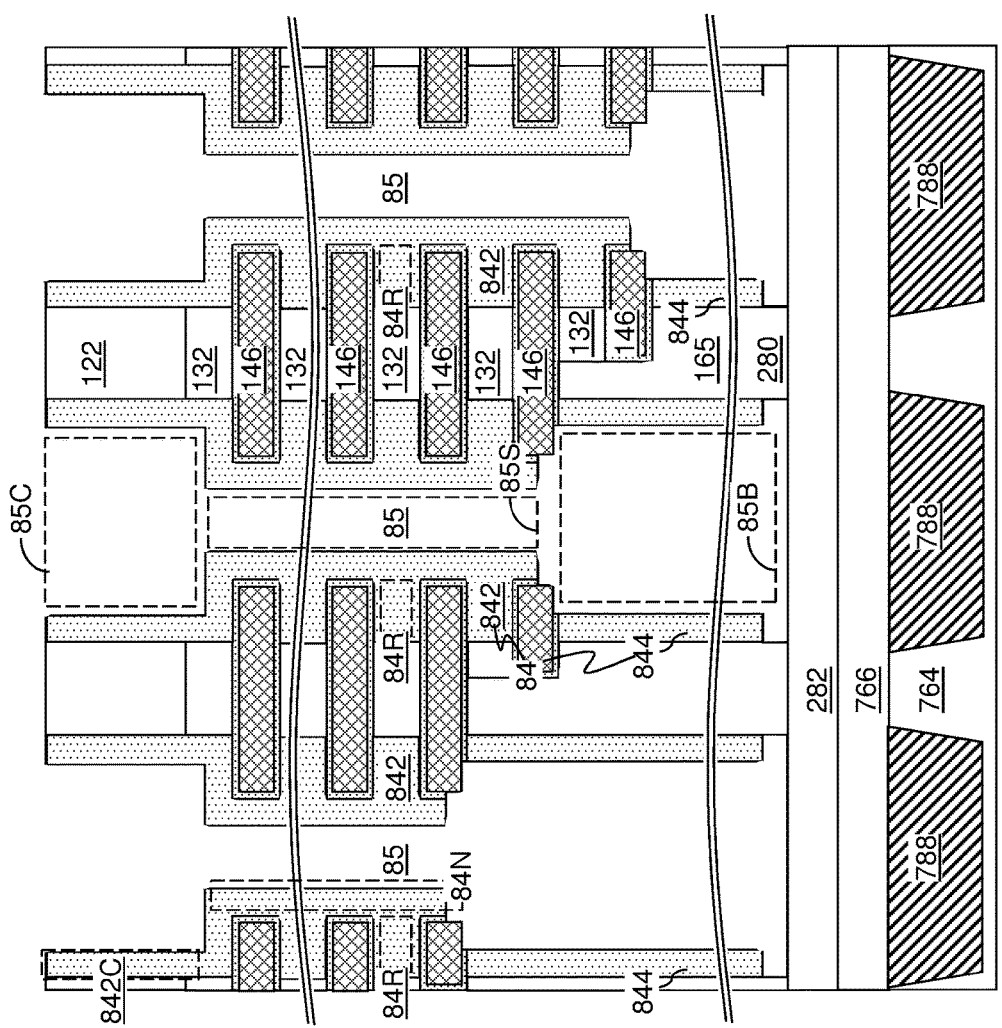
FIG. 29 is a vertical cross-sectional view of a region including via cavities after removal of temporary fill material portions according to an embodiment of the present disclosure.

Referring to FIG. 29, the sacrificial column-shaped structures 857 can be removed selective to the material of the ribbed insulating spacers 842 and the cylindrical insulating spacers 844 and selective to the material of the drain-level insulating layer 122. An isotropic etch process may be employed to remove the sacrificial column-shaped structures 857. In one embodiment, the sacrificial column-shaped structures 857 can include silicon nitride, and the ribbed insulating spacers 842, the cylindrical insulating spacers 844, and the drain-level insulating layer 122 can include silicon oxide. In this case, a wet etch employing hot phosphoric acid can be employed to selectively remove the sacrificial column-shaped structures 857. Column-shaped cavities 85 are formed in volumes from which the sacrificial column-shaped structures 857 are removed. Each column-shaped cavity 85 includes a constricted shaft cavity portion 85S extending through a neck portion 84N of a respective ribbed insulating spacer 842, a capital cavity portion 85C overlying the constricted shaft cavity portion 85S and having a greater horizontal cross-sectional area than the constricted shaft cavity portion 85S, and a base cavity portion 85B underlying the constricted shaft cavity portion 85S and having a greater horizontal cross-sectional area than the constricted shaft cavity portion 85S.

Figure 30:
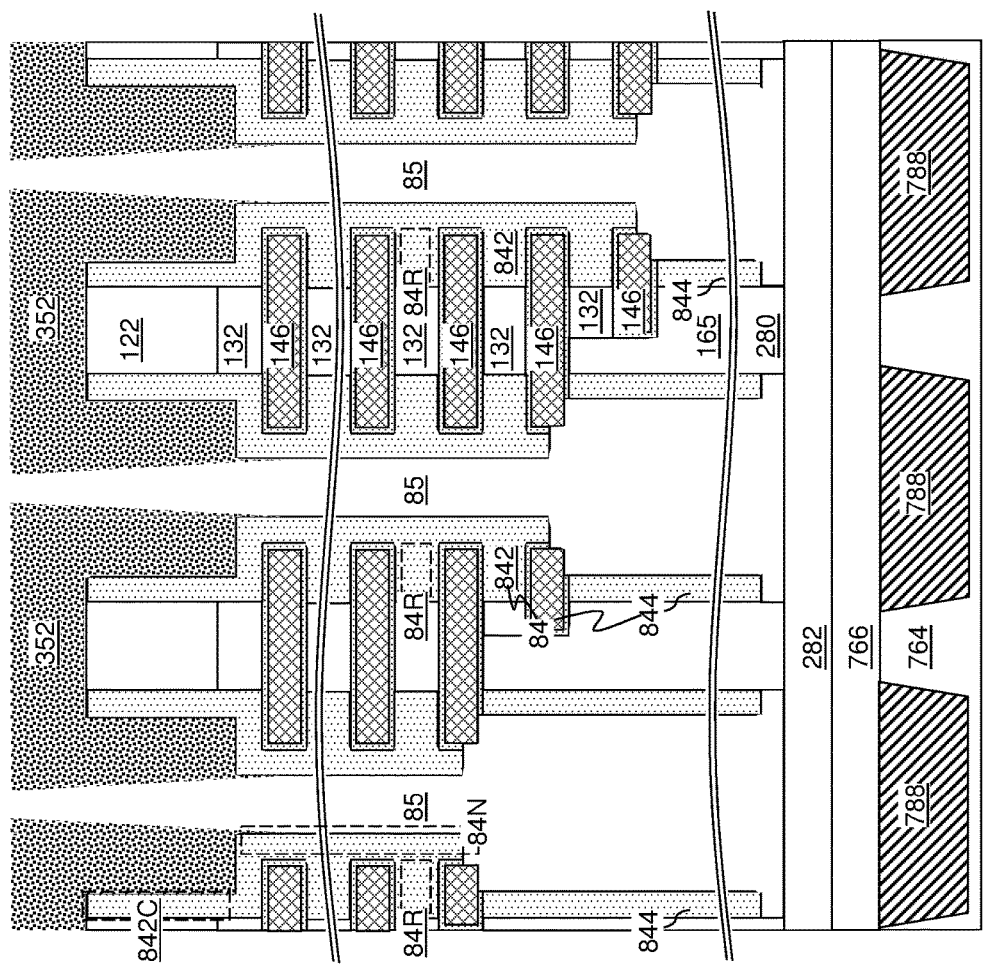
FIG. 30 is a vertical cross-sectional view of a region including via cavities after anisotropic deposition of a patterning film according to an embodiment of the present disclosure.

Referring to FIG. 30, a patterning film 352 can be anisotropically deposited over the column-shaped cavities 85 on the top side of the exemplary structure. The pattern film 352 can be a carbon-based material that subsequently functions as an etch mask. An exemplary material that can be employed as the patterning film 352 include Advanced Patterning Film™ commercially available from Applied Materials, Inc™. Deposition of the patterning film 352 is directional such that the patterning film 352 is deposited with a greater thickness over the top surface of the drain-side insulating layer 122 and over annular horizontal top surfaces of the ribbed insulating spacers 842 than on sidewalls of the neck portions 84N of the ribbed insulating spacers 842 or on physically exposed portions of the top surface of the first-assembly bonding dielectric layer 282. Optionally, a trimming process may be performed to isotropically remove thin material portions of the patterning film 352.

Figure 31:
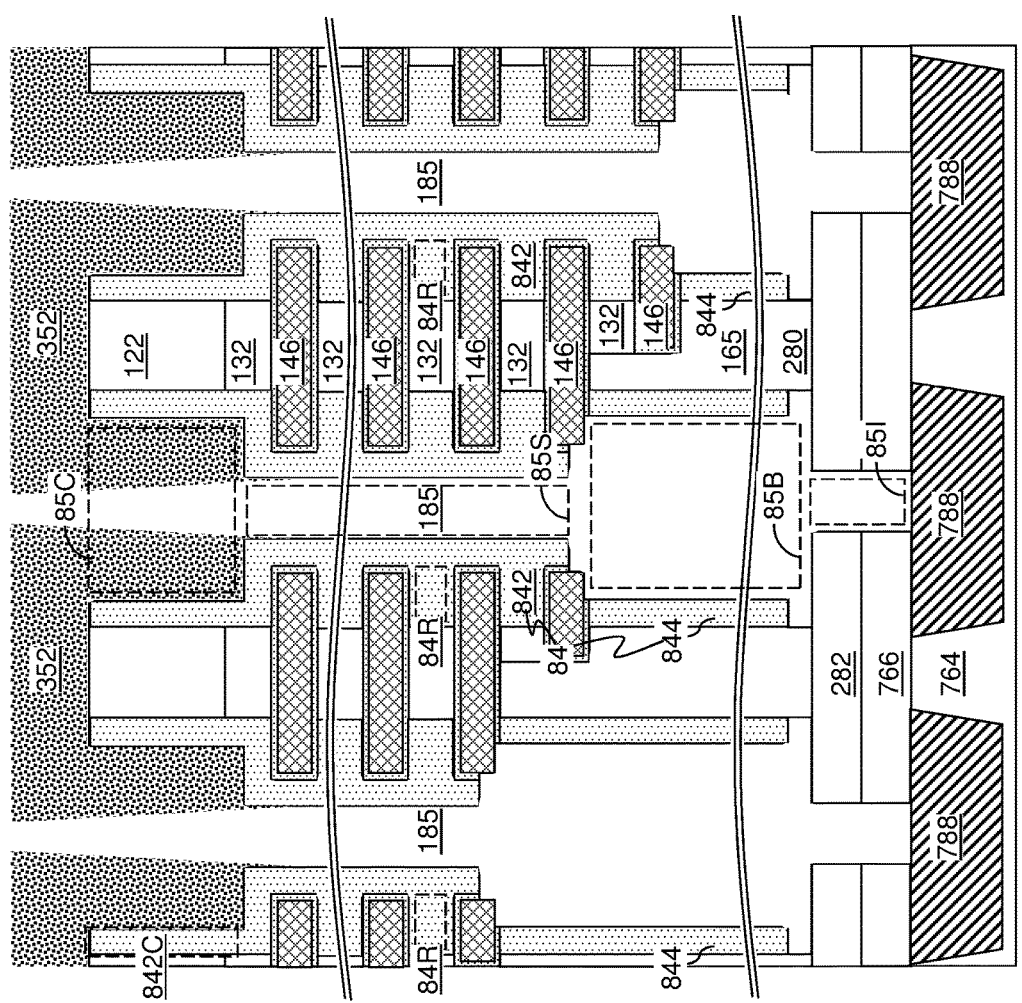
FIG. 31 is a vertical cross-sectional view of a region including via cavities after an anisotropic etch process that forms openings that extend to the first metal interconnect structures according to an embodiment of the present disclosure.

Referring to FIG. 31, an anisotropic etch process is performed while the patterning film 352 covers regions of the capital cavity portions 85C that are located outside the areas of the constricted shaft cavity portions 85S. Ions move downward and pass through the patterning film 352 and the constricted shaft cavity portions 85S, and etch portions of the first-assembly bonding dielectric layer 282 and the second-assembly bonding dielectric layer 766 that directly underlie the constricted shaft cavity portions 85S. An interconnection opening 851 can be formed between each column-shaped cavity 85 and an underlying first metal interconnect structure 780, which can be a topmost lower metal line structure 788. Each region between the column-shaped cavities 85 and an underlying first metal interconnect structure 780 can be etched by the anisotropic etch process to form a respective interconnection opening 851. Each interconnection opening 851 is formed through a center portion of a physically exposed region of a top surface of the first-assembly bonding dielectric layer 282, and is adjoined to an overlying column-shaped cavity 85 and an underlying first metal interconnect structure 780.

The patterning film 352 can be subsequently removed, for example, by ashing. Each adjoining combination of a column-shaped cavity 85 and an interconnection opening 851 constitutes an interconnection via cavity 185. Each interconnection via cavity 185 includes a constricted shaft cavity portion 85S extending through a neck portion 84N of a respective ribbed insulating spacer 842, a capital cavity portion 85C overlying the constricted shaft cavity portion 85S and having a greater horizontal cross-sectional area than the constricted shaft cavity portion 85S, a base cavity portion 85B underlying the constricted shaft cavity portion 85S and having a greater horizontal cross-sectional area than the constricted shaft cavity portion 85S, and an interconnection openings 851 having a lesser horizontal cross-sectional area than the base cavity portion 85B and extending through the first-assembly bonding dielectric layer 282 and the second-assembly bonding dielectric layer 766.

Figure 32A:
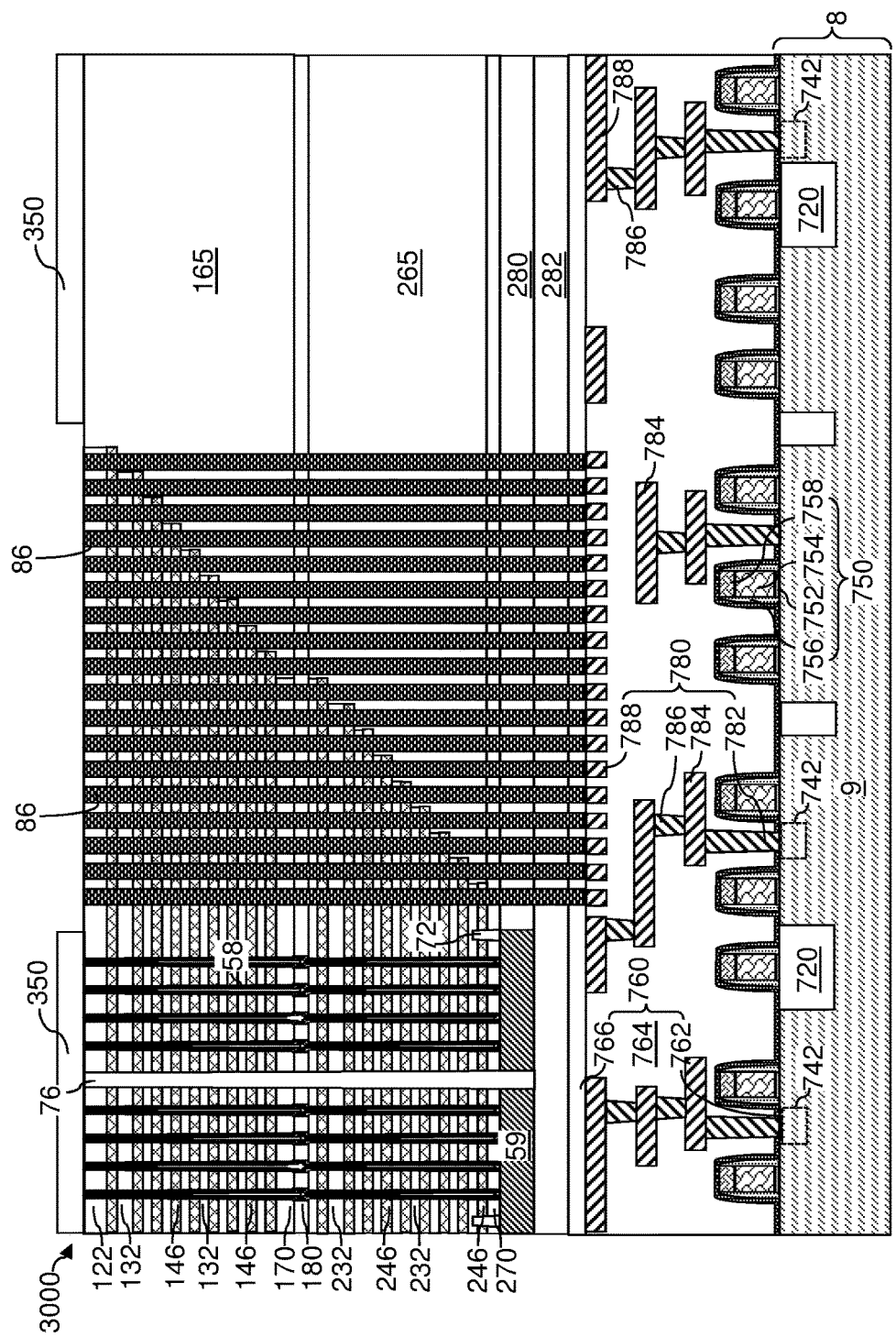
FIG. 32A is a vertical cross-sectional view of the exemplary structure after formation of contact via structures according to the first embodiment of the present disclosure.
Figure 32B:
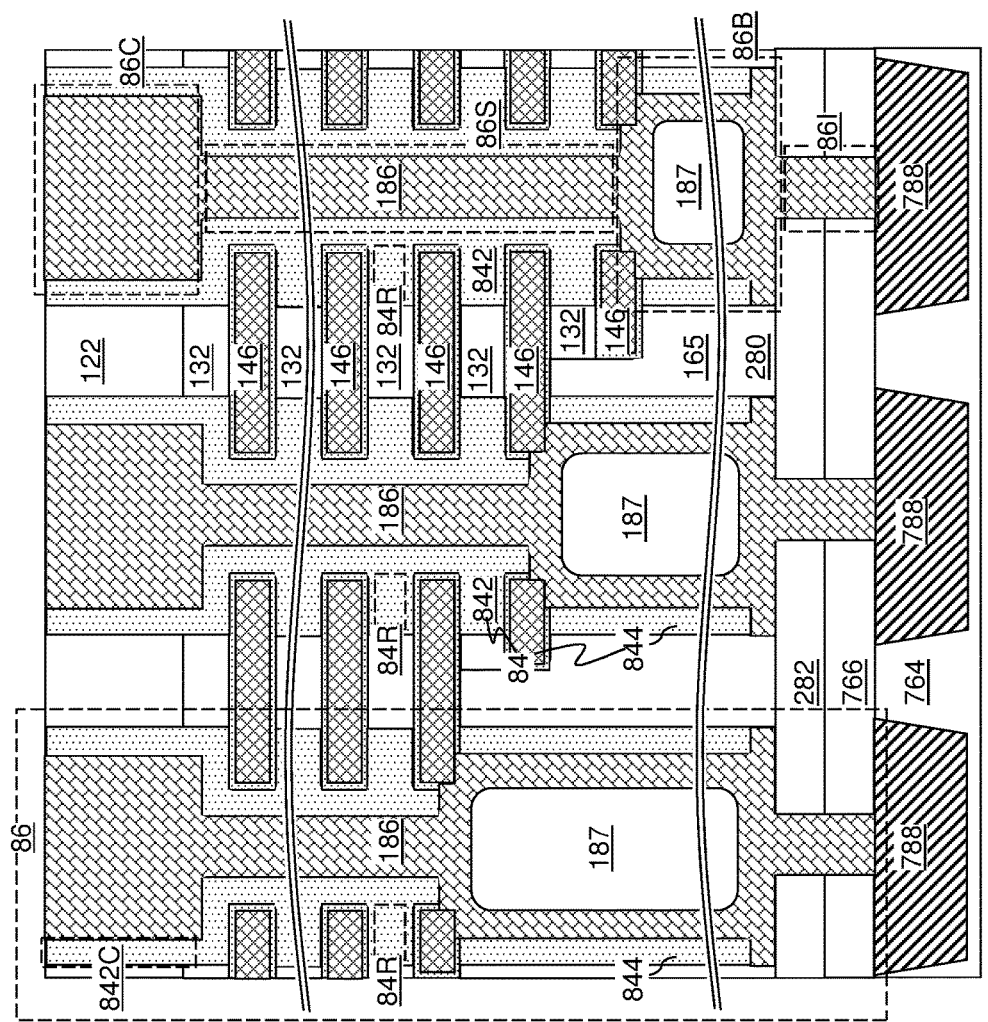
FIG. 32B is a vertical cross-sectional view of a region including contact via structures at the processing steps of FIG. 32A.

Referring to FIGS. 32A and 32B, at least one conductive material can be deposited in the interconnection via cavities 185 to form conductive via structures 186. The at least one conducive material can include a metallic liner material and a conductive fill material. The metallic liner material can include a conductive metallic nitride material such as TiN, TaN, WN, or a combination thereof. The conductive fill material can include a metal or an intermetallic alloy such as W, Co, Ru, Mo, Cu, or combinations thereof. Excess portions of the conductive material can be removed from above the horizontal plane including the top surface of the drain-level insulating layer 122 by a planarization process. In an illustrative example, the at least one conductive material can be removed from above the horizontal plane including the top surface of the cover dielectric layer 350 by chemical mechanical planarization (CMP). The at least one conductive material can be subsequently vertically recessed by the thickness of the cover dielectric layer 350.

Each remaining portion of the at least one conductive material in a respective one of the interconnection via cavities 185 constitutes a conductive via structure 186. In one embodiment, each conducive via structure 186 may include a void 187 at the level of the second stepped dielectric material portion 265 or at the levels of the first and second stepped dielectric material portions (165, 265). Conducive via structure 186 passing through different horizontal surfaces within the stepped surfaces of the first and second stepped dielectric material portions (165, 265) can include voids 187 having different heights. A first subset of the conductive via structures 186 includes a respective void 187 only at the level of the second stepped dielectric material portion 265, i.e., between the horizontal plane including the top surface of the second stepped dielectric material portion 265 and the horizontal plane including the bottom surface of the second stepped dielectric material portion 265. A second subset of the conductive via structures 186 includes a respective void 187 only at levels of the first and second stepped dielectric material portions (165, 265), i.e., between the horizontal plane including the top surface of the first stepped dielectric material portion 165 and the horizontal plane including the bottom surface of the second stepped dielectric material portion 265. In such cases, the voids 187 can vertically extend across the interface between the second retro-stepped dielectric material portion 265 and the inter-tier dielectric layer 180.

Each conductive via structure 186 can include a column-shaped conductive via structure (86S, 86C, 86B). The column-shaped conductive via structure (86S, 86C, 86B) includes a conductive shaft portion 86S extending through a subset of layers of the alternating stack (132, 146, 232, 246), a conductive capital portion 86C overlying the conductive shaft portion 86S and each layer of the alternating stack (132, 146, 232, 246), and a conductive base portion 86B underlying the subset of layers of the alternating stack (132, 146, 232, 246). The conductive capital portion 86C and the conductive base portion 86B have greater lateral extents than the conductive shaft portion 86S. Within each conductive via structure 186, the sidewall of the conductive capital portion 86C can be laterally offset outward from the sidewall of the conductive shaft portion 86S by a uniform lateral offset distance, which is the lateral etch distance of the drain-level insulating layer 122 at the processing steps of FIG. 12B. Within each conductive via structure 186, the sidewalls of the conductive base portion 86B can be laterally offset outward from the sidewall of the conductive shaft portion 86S by another uniform lateral offset distance, which is the lateral etch distance of the second retro-stepped dielectric material portion 265 or the first retro-stepped dielectric material portion 165 at the processing steps of FIG. 12B. Each conductive via structure 186 further includes a conductive interconnection region 861 that extends through the first-assembly bonding dielectric layer 282 and the second-assembly bonding dielectric layer 766 and contacts a respective one of the first metal interconnect structures 780 such as a topmost lower metal line structure 788. Each contiguous set of a conductive via structure 186, a ribbed insulating spacer 842, and a cylindrical insulating spacer 844 is herein referred to a contact via assembly 86.

Figure 33:
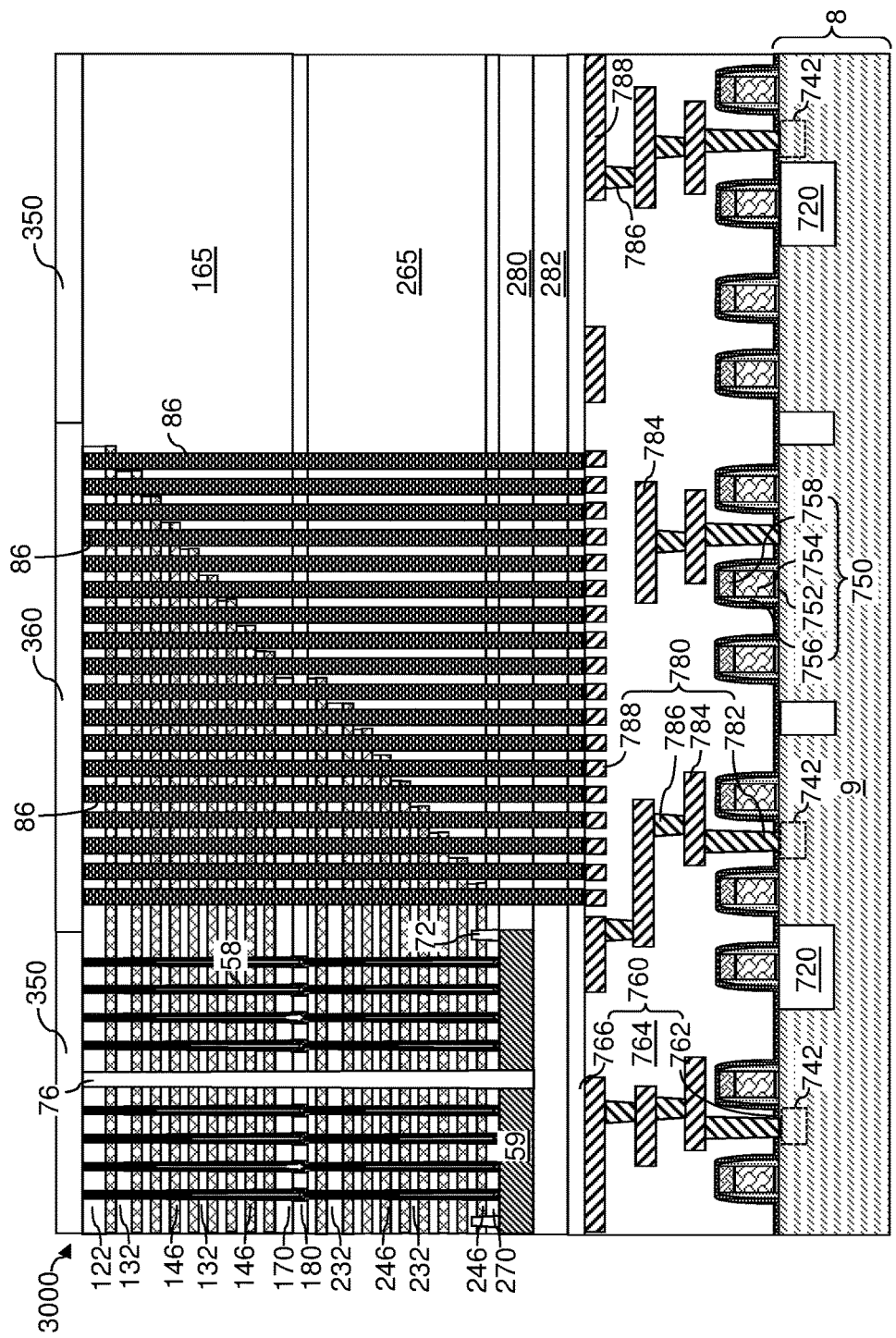
FIG. 33 is a vertical cross-sectional view of the exemplary structure after formation of a planarization dielectric layer according to the first embodiment of the present disclosure.

Referring to FIG. 33, a dielectric material such as silicon oxide can be deposited within the opening in the cover dielectric layer 350. The deposited dielectric material can be planarized to provide a horizontal top surface that is coplanar with the top surface of the cover dielectric layer 350 or overlies and covers the cover dielectric layer 350. The remaining portion of the deposited dielectric material is herein referred to as a planarization dielectric layer 360.

Figure 34A:
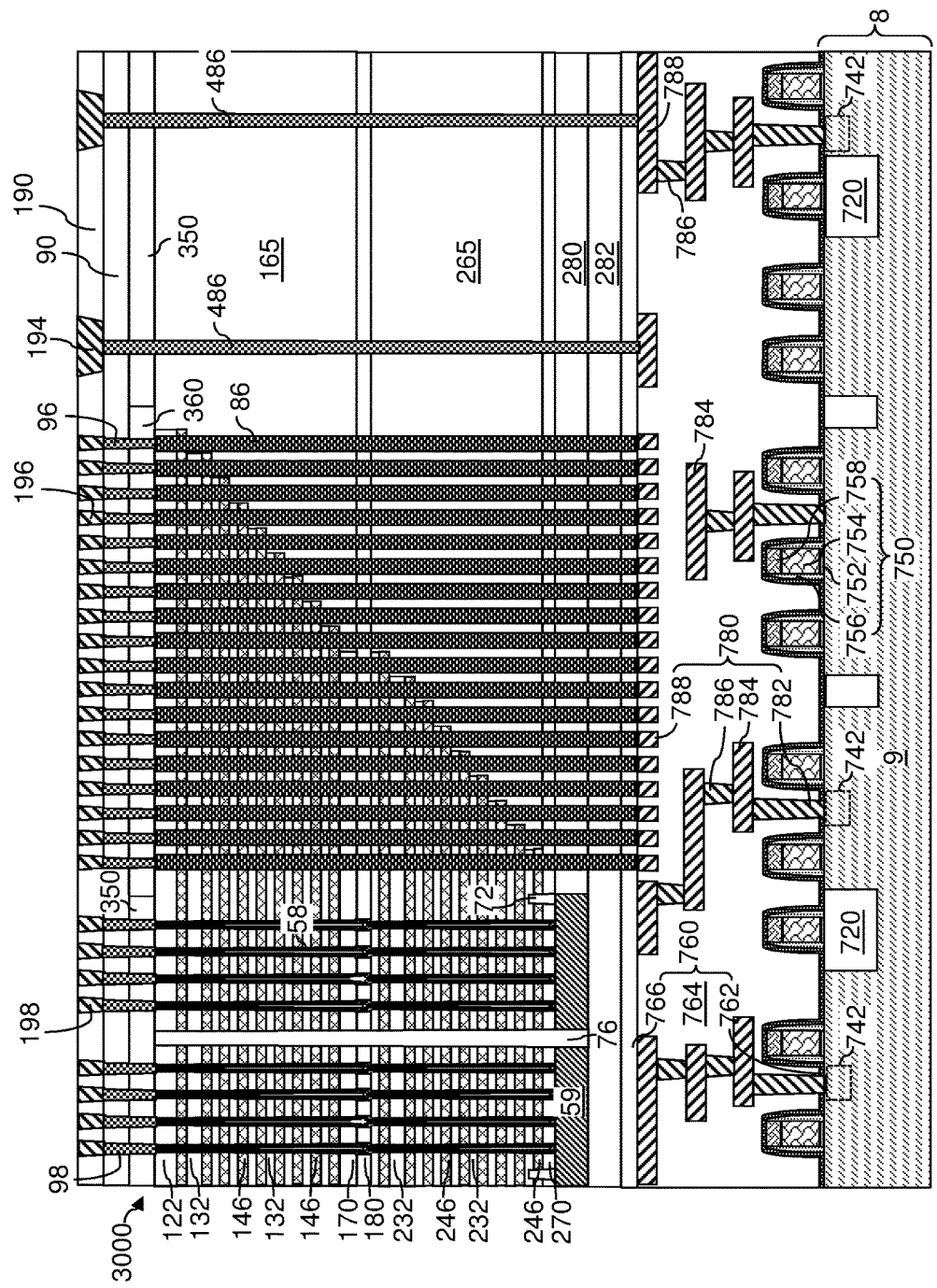
FIG. 34A is a vertical cross-sectional view of the exemplary structure after formation of upper dielectric material layers and second metal interconnect structures according to the first embodiment of the present disclosure.
Figure 34B:
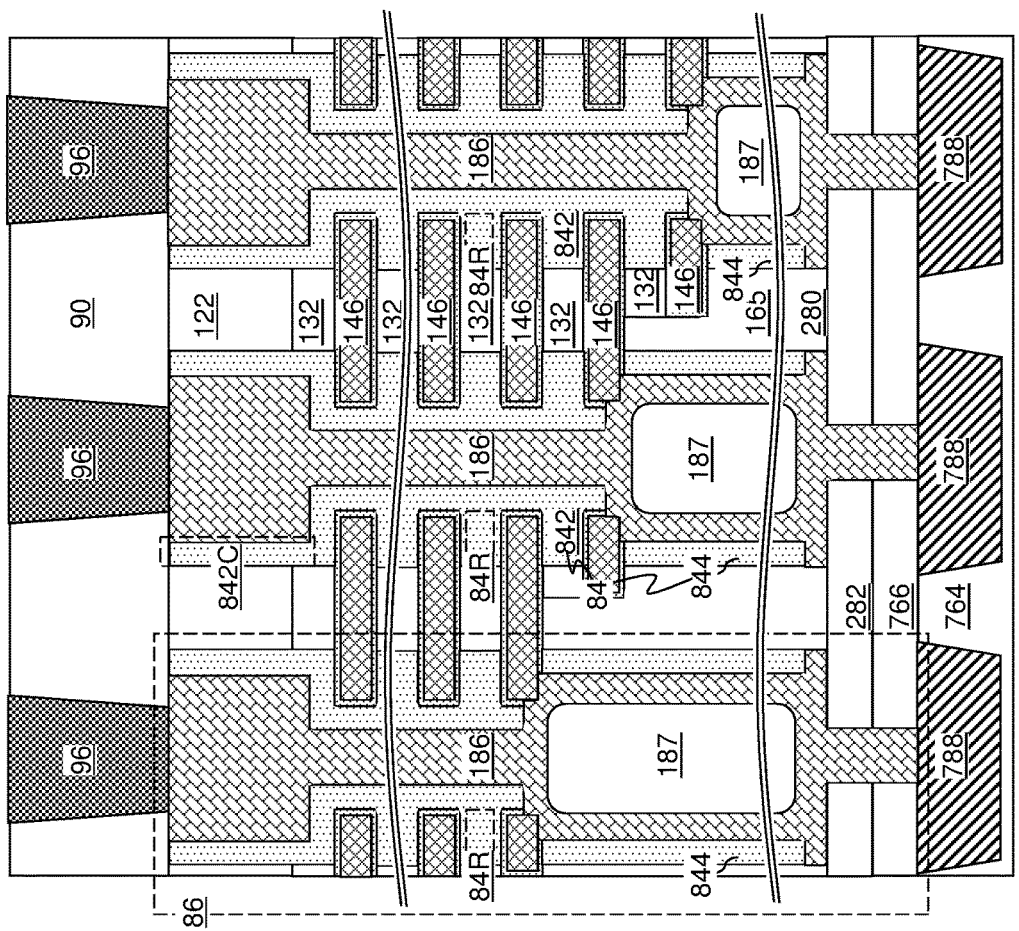
FIG. 34B is a vertical cross-sectional view of a region including contact via structures at the processing steps of FIG. 34A.

Referring to FIGS. 34A and 34B, additional metal interconnect structures and additional dielectric material layers can be formed to provide electrical connection among various electrical nodes above the semiconductor substrate 8. The additional metal interconnect structures are herein referred to as second metal interconnect structures (96, 98, 486, 194, 196, 198) or upper metal interconnect structures, and the additional dielectric material layers are herein referred to as second dielectric layers (90, 190) or upper dielectric layers.

In one embodiment, the second dielectric layers (90, 190) can include a via level dielectric layer 90 that can be deposited over the planarization dielectric layer 360, and a line level dielectric layer 190 that can be deposited over the via level dielectric layer 90. The second metal interconnect structures (96, 98, 486, 194, 196, 198) can include layer-interconnection via structures 96 contacting a respective one of the conducive via structure 186 and electrically shorted to a respective one of the electrically conductive layers (146, 246) within the alternating stacks (132, 146, 232, 246). The second metal interconnect structures (96, 98, 486, 194, 196, 198) can include drain contact via structures 98 contacting a respective one of the drain regions 63. The second metal interconnect structures (96, 98, 486, 194, 196, 198) can include through-memory-level contact via structures 486 that vertically extend through the first and second stepped dielectric material portions (165, 265) and contacting a respective one of the lower metal interconnect structures 780. The second metal interconnect structures (96, 98, 486, 194, 196, 198) can include metal lines 194 providing electrical contact to the through-memory-level contact via structures 486, layer-interconnection line structures 196 contacting layer-interconnection via structures 96, and bit lines 198 contacting a respective set of drain contact via structures 98.

Referring to all drawings and according to various embodiments of the present disclosure, a three-dimensional memory device is provided, which comprises: field effect transistors 710 located on a substrate 8; lower metal interconnect structures 780 embedded in first dielectric layers 760 and located over the substrate 8; a source line 59 located over the first dielectric layers 760; a stepped dielectric material portion (265 and/or 165) located over the first dielectric layers 760 and including stepped surfaces, wherein a lateral extent of the stepped dielectric material portion decreases stepwise with a vertical distance from the substrate 8; an alternating stack (132, 146, 232, 246) of insulating layers (132, 232) and electrically conductive layers (146, 246) located over the source line 59 and contacting the stepped surfaces of the stepped dielectric material portion (265 and/or 165), wherein lateral extents of the electrically conductive layers (146, 246) increase with a vertical distance from the source line 59; and memory stack structures 55 extending through the alternating stack (132, 146, 232, 246) and including a memory film 50 and a vertical semiconductor channel 60 laterally surrounded by the memory film 50.

In one embodiment, the electrically conductive layers (246, 146) include a subset including a topmost electrically conductive layer 146 of the alternating stack (132, 246, 232, 246) in addition to additional electrically conductive layers (246, 146). The three-dimensional memory device further comprises a contact via structure 186 that contacts a bottommost electrically conductive layer (146 or 246) of the subset and one of the lower metal interconnect structures 780 and vertically extends through the stepped dielectric material portion (265 and/or 165).

In one embodiment, the contact via structure 186 vertically extends through openings in each electrically conductive layer (146, 246) in the subset and contacts a bottom surface of the bottommost electrically conductive layer. In one embodiment, the field effect transistors 710 comprise peripheral circuitry of the three-dimensional memory device and the electrically conductive layers comprise word lines of the memory device.

In one embodiment, the contact via structure 186 contacts a bottom surface of an upper metal interconnect structure (such as a layer-interconnection via structure 96) located above a horizontal plane including a top surface of the topmost electrically conductive layer 146 of the alternating stack (132, 146, 232, 246).

In one embodiment, the three-dimensional memory device further comprises a ribbed insulating spacer 842. The ribbed insulating spacer 842 includes a neck portion 84N that continuously extends from the topmost electrically conductive layer 246 of the alternating stack (132, 146, 232, 246) to the bottommost electrically conductive layer (146 or 246) of the subset, and laterally-protruding annular rib regions 84R located at each level of insulating layers (132, 232) located between the topmost electrically conductive layer 146 of the alternating stack (132, 146, 232, 246) and the bottommost electrically conductive layer (146 or 246) of the subset.

In one embodiment, the contact via structure 186 comprises a column-shaped conductive via structure (86S, 86C, 86B) that comprises: a conductive shaft portion 86S extending through the neck portion 84N of the ribbed insulating spacer 842; a conductive capital portion 86C overlying the conductive shaft portion 86S and overlying the topmost electrically conductive layer 146 of the alternating stack (132, 146, 232, 246); and a conductive base portion 86B underlying the bottommost electrically conductive layer (146 or 246) of the subset and contacting a bottom surface of the bottommost electrically conductive layer (146 or 246) of the subset.

In one embodiment, a contact area between the contact via structure 186 and the bottommost electrically conductive layer (146 or 246) of the subset includes an annular area located between an inner periphery defined by an opening in the bottommost electrically conductive layer (146 or 246) of the subset and an outer periphery that is laterally offset outward from the inner periphery by a uniform lateral offset distance.

In one embodiment, the vertical semiconductor channels 60 have a doping of a first conductivity type; the source line 59 comprises a source semiconductor layer having a doping of a second conductivity type that is an opposite of the first conductivity type; and the three-dimensional memory device further comprises source regions 61 having a doping of the second conductivity type and contacting a bottom end of a respective one of the vertical semiconductor channels 60 and a top surface of the source semiconductor layer.

In one embodiment, each of the vertical semiconductor channels 60 comprises: a word-line-level channel portion 60W located below a horizontal plane including a bottom surface of a topmost electrically conductive layer 146 of the alternating stack (132, 146, 232, 246) and above a horizontal plane including a top surface of the bottommost electrically conductive layer of the alternating stack (132, 146, 232, 246) and including dopants of the first conductivity type at a first atomic concentration; and a source-select-level channel portion 60S adjoining a bottom end of the word-line-level channel portion 60W and laterally surrounded by the bottommost electrically conductive layer of the alternating stack (132, 146, 232, 246) and including dopants of the first conductivity type at a second atomic concentration that is different from the first atomic concentration.

The three-dimensional memory device can comprise drain regions 63 having a doping of the second conductivity type and contacting a top end of a respective one of the vertical semiconductor channels 60, wherein each of the vertical semiconductor channels 60 comprises a drain-select-level channel portion 60D adjoining a top end of a respective word-line-level channel portion 60W and contacting a surface of a respective drain region 63 and including dopants of the first conductivity type at a third atomic concentration that is different from the first atomic concentration.

In one embodiment, outer sidewalls of the memory stack structures 55 have a straight tapered profile through multiple consecutive electrically conductive layers (146 or 246) within the alternating stack (132, 146, 232, 246); and a horizontal cross-sectional area enclosed by an outer periphery of each memory stack structure 55 decreases with the vertical distance from the source line 59 through the multiple consecutive electrically conductive layers (146 or 246) within the alternating stack (132, 146, 232, 246).

In one embodiment, the three-dimensional memory device comprises a three-dimensional NAND memory device; the electrically conductive layers (146, 246) comprise, or are electrically connected to, a respective word line of the three-dimensional NAND memory device; the substrate 8 comprises a silicon substrate; the three-dimensional NAND memory device comprises an array of three-dimensional NAND strings over the silicon substrate; and an integrated circuit comprising a driver circuit for the three-dimensional NAND memory device includes the field effect transistors 710. The electrically conductive layers (146, 246) comprise a plurality of control gate electrodes having a strip shape extending substantially parallel to the top surface of the substrate 8; and the array of monolithic three-dimensional NAND strings comprises a plurality of charge storage elements, each charge storage element located adjacent to a respective one of the vertical semiconductor channels 60 and within a respective one of the memory films 50.

The three-dimensional memory device of the embodiment of the present disclosure provides flipped memory stack structures and filled staircase regions. Adjustment of threshold voltages for source select gate electrodes and drain select gate electrodes can be set by ion implantation prior to, and after, flipping the first assembly upside down. Thus, source select and drain select transistors can be formed with appropriate threshold voltages by such channel doping. Memory devices in the first assembly 1000 and CMOS devices 710 in the second assembly 2000 can be manufactured with independent thermal budgets. Thus, the memory devices and the CMOS devices can be manufactured with larger process margins and higher performance. The issue of hydrogen diffusion from a three-dimensional memory array 1000 into CMOS devices 710 can be eliminated by separate manufacture of the first assembly 1000 and the second assembly 2000 and subsequent bonding. Chip sizes can be reduced by elimination of support pillar structures during manufacture of the three-dimensional memory array. Further, by fabricating two separate assemblies (1000, 2000) instead of manufacturing all devices on a single chip, the turnaround time (TAT) for manufacture of the three-dimensional memory device of the present disclosure can be shortened compared to prior art manufacturing methods.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    field effect transistors located on a substrate;
    lower metal interconnect structures embedded in first dielectric layers and located over the substrate;
    a source line located over the first dielectric layers;
    a stepped dielectric material portion located over the first dielectric layers and including stepped surfaces, wherein a lateral extent of the stepped dielectric material portion decreases stepwise with a vertical distance from the substrate;
    an alternating stack of insulating layers and electrically conductive layers located over the source line and contacting the stepped surfaces of the stepped dielectric material portion, wherein lateral extents of the electrically conductive layers increase with a vertical distance from the source line; and memory stack structures extending through the alternating stack and including a memory film and a vertical semiconductor channel;

wherein:

the vertical semiconductor channels have a doping of a first conductivity type:

the source line comprises a source semiconductor layer having a doping of a second conductivity type that is an opposite of the first conductivity type; and the three-dimensional memory device further comprises source regions having a doping of the second conductivity type and contacting a bottom end of a respective one of the vertical semiconductor channels and a top surface of the source semiconductor layer.

2. The three-dimensional memory device of claim 1, wherein:

the electrically conductive layers include a subset that includes a topmost electrically conductive layer of the alternating stack; and the three-dimensional memory device further comprises a contact via structure that contacts a bottommost electrically conductive layer of the subset and one of the lower metal interconnect structures and vertically extends through the stepped dielectric material portion.

3. The three-dimensional memory device of claim 2, wherein the contact via structure vertically extends through openings in each electrically conductive layer in the subset and contacts a bottom surface of the bottommost electrically conductive layer.

4. The three-dimensional memory device of claim 3, wherein:

the field effect transistors comprise peripheral circuitry of the three-dimensional memory device;

the electrically conductive layers comprise word lines; and the contact via structure contacts a bottom surface of an upper metal interconnect structure located above a horizontal plane including a top surface of the topmost electrically conductive layer of the alternating stack.

5. The three-dimensional memory device of claim 3, further comprising a ribbed insulating spacer located in the contact via structure that includes:

a neck portion that continuously extends from the topmost electrically conductive layer of the alternating stack to the bottommost electrically conductive layer of the subset; and laterally-protruding annular rib regions located at each level of insulating layers located between the topmost electrically conductive layer of the alternating stack and the bottommost electrically conductive layer of the subset.

6. The three-dimensional memory device of claim 5, wherein the contact via structure comprises a column-shaped conductive via structure that comprises:

a conductive shaft portion extending through the neck portion of the ribbed insulating spacer;

a conductive capital portion overlying the conductive shaft portion and overlying the topmost electrically conductive layer of the alternating stack; and a conductive base portion underlying the bottommost electrically conductive layer of the subset and contacting a bottom surface of the bottommost electrically conductive layer of the subset.

7. The three-dimensional memory device of claim 5, wherein a contact area between the contact via structure and the bottommost electrically conductive layer of the subset includes an annular area located between an inner periphery defined by an opening in the bottommost electrically conductive layer of the subset and an outer periphery that is laterally offset outward from the inner periphery by a uniform lateral offset distance.

8. The three-dimensional memory device of claim 1, wherein each of the vertical semiconductor channels comprises:

a word-line-level channel portion located below a horizontal plane including a bottom surface of a topmost electrically conductive layer of the alternating stack and above a horizontal plane including a top surface of the bottommost electrically conductive layer of the alternating stack and including dopants of the first conductivity type at a first atomic concentration; and a source-select-level channel portion adjoining a bottom end of the word-line-level channel portion and laterally surrounded by the bottommost electrically conductive layer of the alternating stack and including dopants of the first conductivity type at a second atomic concentration that is different from the first atomic concentration.

9. The three-dimensional memory device of claim 8, further comprising drain regions having a doping of the second conductivity type and contacting a top end of a respective one of the vertical semiconductor channels, wherein each of the vertical semiconductor channels comprises a drain-select-level channel portion adjoining a top end of a respective word-line-level channel portion and contacting a surface of a respective drain region and including dopants of the first conductivity type at a third atomic concentration that is different from the first atomic concentration.

10. The three-dimensional memory device of claim 1, wherein:

outer sidewalls of the memory stack structures have a straight tapered profile through multiple consecutive electrically conductive layers within the alternating stack; and a horizontal cross-sectional area enclosed by an outer periphery of each memory stack structure decreases with the vertical distance from the source line through the multiple consecutive electrically conductive layers within the alternating stack.

11. The three-dimensional memory device of claim 1, wherein:

the three-dimensional memory device is a three-dimensional NAND memory device;

the electrically conductive layers comprise, or are electrically connected to, a respective word line of the three-dimensional NAND memory device;

the substrate comprises a silicon substrate;

the three-dimensional NAND memory device comprises an array of three-dimensional NAND strings over the silicon substrate;

an integrated circuit comprising a driver circuit for the three-dimensional NAND memory device includes the field effect transistors;

the electrically conductive layers comprise a plurality of control gate electrodes having a strip shape extending substantially parallel to the top surface of the substrate; and the array of monolithic three-dimensional NAND strings comprises a plurality of charge storage elements, each charge storage element located adjacent to a respective one of the vertical semiconductor channels and within a respective one of the memory films.

12. A method of forming a three-dimensional memory device, comprising:
providing a first assembly comprising memory stack structures vertically extending through an alternating stack of insulating layers and electrically conductive layers over a carrier substrate, wherein each of the memory stack structures comprises a memory film and a vertical semiconductor channel;
bonding the first assembly to a second assembly comprising a semiconductor substrate, field effect transistors located on the semiconductor substrate, and first metal interconnect structures embedded in first dielectric material layers;
separating the carrier substrate from the alternating stack;
forming an interconnection via cavity through the alternating stack; and
forming a contact via structure in the interconnection via cavity;
forming source-select-level channel portions at upper end regions of vertical semiconductor channels by performing a first ion implantation process prior to bonding the first assembly with the second assembly;
forming drain-select-level channel portions at end regions of the vertical semiconductor channels that are distal from the semiconductor substrate by performing a second ion implantation process after bonding the first assembly with the second assembly;
forming source regions at top ends of the memory stack structures prior to bonding the first assembly with the second assembly;
forming drain regions at end regions of the memory stack structures that are distal from the semiconductor substrate after bonding the first assembly with the second assembly; and
forming second metal interconnect structures on the drain regions.

13. The method of claim 12, further comprising:
forming a retro-stepped dielectric material portion over stepped surfaces of the alternating stack; and
forming a sacrificial column-shaped structure located in the interconnection via cavity and extending through a subset of layers of the alternating stack and the retro-stepped dielectric material portion.

14. The method of claim 13, wherein:
the sacrificial column-shaped structure contacts a top surface of a topmost electrically conductive layer within the subset of layers;
the subset of layers of the alternating stack includes multiple electrically conductive layers; and
the sacrificial column-shaped structure vertically extends through each of the multiple electrically conductive layers.

15. The method of claim 14, further comprising:
forming an in-process alternating stack of the insulating layers and sacrificial material layers, wherein the memory stack structures are formed through the in-process alternating stack;
forming a cylindrical via cavity through the retro-stepped dielectric material portion and the in-process alternating stack;
forming a ribbed via cavity by isotropically etching materials of the retro-stepped dielectric material portion and the insulating layers around the cylindrical via cavity;
forming a temporary fill material portion in the ribbed via cavity; and
forming the alternating stack by replacing the sacrificial material layers with the electrically conductive layers after formation of the temporary fill material portion.

16. The method of claim 15, further comprising:
depositing a conformal dielectric via liner in the ribbed via cavity, wherein volumes formed by isotropic etching of the insulating layers are filled with rib portions of the conformal dielectric via liner;
depositing a temporary fill material inside the conformal dielectric via liner to form the temporary fill material portion;
removing the temporary fill material portion selective to the conformal dielectric via liner; and
etching a material of the conformal dielectric via liner employing an anisotropic etch process, wherein the top surface of the topmost electrically conductive layer within the subset of layers is physically exposed after the anisotropic etch process, wherein the sacrificial column-shaped structure is formed in volumes from which the temporary fill material portion is removed.

17. The method of claim 13, wherein the conductive via structure comprises a column-shaped conductive via structure that comprises:
a conductive shaft portion extending through the subset of layers of the alternating stack;
a conductive capital portion overlying the conductive shaft portion and each layer of the alternating stack; and
a conductive base portion underlying the subset of layers of the alternating stack, wherein the conductive capital portion and the conductive base portion have greater lateral extents than the conductive shaft portion.

18. The method of claim 13, further comprising:
anisotropically depositing a patterning film over a cavity formed by removal of the sacrificial column-shaped structure, wherein the cavity includes a constricted shaft cavity portion extending through the subset of layers, a capital cavity portion overlying the constricted shaft cavity portion, and a base cavity portion underlying the constricted shaft portion; and
performing an anisotropic etch process while the patterning film covers regions of the capital cavity portion located outside an area of the constricted shaft cavity portion, wherein the region between the sacrificial column-shaped structure and the first metal interconnect structures is etched by the anisotropic etch process.

* * * * *